(12) United States Patent
Ogawa et al.

(10) Patent No.: US 12,532,475 B2
(45) Date of Patent: Jan. 20, 2026

(54) MEMORY DEVICE WITH THROUGH-STACK CONTACT VIA STRUCTURES WHICH CONTACT PLURAL STACKS AND METHOD OF MAKING THE SAME

(71) Applicant: SANDISK TECHNOLOGIES LLC, Addison, TX (US)

(72) Inventors: Hiroyuki Ogawa, Nagoya (JP); Masanori Tsutsumi, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 407 days.

(21) Appl. No.: 18/455,079

(22) Filed: Aug. 24, 2023

(65) Prior Publication Data

US 2025/0071988 A1 Feb. 27, 2025

(51) Int. Cl.
*H10B 43/27* (2023.01)
*H10B 41/27* (2023.01)
(Continued)

(52) U.S. Cl.
CPC ............ *H10B 43/27* (2023.02); *H10B 41/27* (2023.02); *H10B 41/41* (2023.02); *H10B 43/40* (2023.02)

(58) Field of Classification Search
CPC ........ H10B 43/27; H10B 41/27; H10B 41/41; H10B 43/40; H10B 43/10; H10B 43/50; H10B 43/35
See application file for complete search history.

(56) References Cited

U.S. PATENT DOCUMENTS 9,601,502 B2 3/2017 Sano et al.
9,853,038 B1 12/2017 Cui et al.
(Continued)

OTHER PUBLICATIONS

ISR-WO—Notification of Transmittal of The International Search Report and Written Opinion of the International Searching Authority for International Patent Application No. PCT/US2024/030893, mailed Sep. 12, 2024, 9 pages.
(Continued)

*Primary Examiner* — Allison Bernstein
(74) *Attorney, Agent, or Firm* — THE MARBURY LAW GROUP PLLC

(57) ABSTRACT

A memory device includes a first-tier structure including a first first-tier alternating stack and a second first-tier alternating stack, a second-tier structure overlying or underlying the first-tier structure and including a first second-tier alternating stack and a second second-tier alternating stack that are laterally spaced apart from each other by a jumper alternating stack, and memory stack structures vertically extending through a respective set of at least two alternating stacks. Each of alternating stack includes a respective vertically alternating sequence of insulating layers and electrically conductive layers. An electrically conductive path electrically connects a first first-tier electrically conductive layer within the first first-tier alternating stack, a second first-tier electrically conductive layer within the second first-tier alternating stack, a first second-tier electrically conductive layer within the jumper alternating stack, a first layer contact via structure, and a second layer contact via structure.

20 Claims, 47 Drawing Sheets

(51) Int. Cl.
  *H10B 41/41*    (2023.01)
  *H10B 43/40*    (2023.01)

(56) References Cited

U.S. PATENT DOCUMENTS

| | | |
|---|---|---|
| 10,304,852 B1 | 5/2019 | Cui et al. |
| 10,355,009 B1 | 7/2019 | Kai et al. |
| 10,388,666 B1 | 8/2019 | Kai et al. |
| 10,490,569 B2 | 11/2019 | Mushiga et al. |
| 10,727,248 B2 | 7/2020 | Kaminaga |
| 10,892,267 B2 | 1/2021 | Mushiga et al. |
| 10,903,230 B2 | 1/2021 | Kaminaga et al. |
| 11,051,821 B2 | 7/2021 | Regadas |
| 11,282,783 B2 | 3/2022 | Otsu et al. |
| 11,322,483 B1 | 5/2022 | Ogawa et al. |
| 11,450,685 B2 | 9/2022 | Yoshida |
| 11,532,570 B2 | 12/2022 | Mizuno et al. |
| 11,587,920 B2 | 2/2023 | Alsmeier et al. |
| 11,963,361 B2 * | 4/2024 | Hwang .................. H10B 43/50 |
| 2021/0050357 A1 | 2/2021 | Yip |
| 2021/0210424 A1 | 7/2021 | Otsu et al. |
| 2021/0210428 A1 | 7/2021 | Ohsawa et al. |
| 2021/0210503 A1 | 7/2021 | Matsuno et al. |
| 2021/0210504 A1 | 7/2021 | Otsu et al. |
| 2021/0217730 A1 | 7/2021 | Parekh et al. |
| 2021/0366920 A1 * | 11/2021 | Tokita .................. H10D 84/038 |
| 2022/0028846 A1 | 1/2022 | Alsmeier et al. |
| 2022/0139441 A1 | 5/2022 | Ogawa et al. |
| 2022/0254728 A1 | 8/2022 | Matsuno et al. |
| 2022/0254733 A1 | 8/2022 | Mizuno et al. |
| 2022/0302146 A1 | 9/2022 | Shimomura et al. |
| 2022/0328512 A1 | 10/2022 | Tanaka et al. |
| 2022/0352091 A1 | 11/2022 | Yu et al. |
| 2022/0352093 A1 | 11/2022 | Yamada et al. |
| 2022/0352196 A1 | 11/2022 | Shimomura et al. |
| 2022/0352197 A1 | 11/2022 | Matsuno et al. |
| 2022/0375958 A1 | 11/2022 | Shimabukuro et al. |
| 2023/0038557 A1 | 2/2023 | Ogawa et al. |
| 2023/0041950 A1 | 2/2023 | Chibvongodze et al. |
| 2023/0044232 A1 | 2/2023 | Kai et al. |
| 2023/0045001 A1 | 2/2023 | Ogawa et al. |

OTHER PUBLICATIONS

Endoh et al., "Novel Ultra High-Density Memory with a Stacked-Surrounding Gate Transistor (S-SGT) Structured Cell," IEDM Proc. (2001) 33-36.
U.S. Appl. No. 17/684,922, filed Mar. 2, 2022, SanDisk Technologies LLC.
U.S. Appl. No. 17/807,804, filed Jun. 20, 2022, SanDisk Technologies LLC.
U.S. Appl. No. 17/822,182, filed Aug. 25, 2022, SanDisk Technologies LLC.
U.S. Appl. No. 17/936,479, filed Sep. 29, 2022, SanDisk Technologies LLC.
U.S. Appl. No. 18/062,807, filed Dec. 7, 2022, SanDisk Technologies LLC.
U.S. Appl. No. 18/221,689, filed Jul. 13, 2023, SanDisk Technologies LLC.
U.S. Appl. No. 18/221,711, filed Jul. 13, 2023, SanDisk Technologies LLC.
U.S. Appl. No. 18/350,595, filed Jul. 11, 2023, SanDisk Technologies LLC.
U.S. Appl. No. 18/353,577, filed Jul. 17, 2023, SanDisk Technologies LLC.
U.S. Appl. No. 18/355,067, filed Jul. 19, 2023, SanDisk Technologies LLC.
U.S. Appl. No. 18/356,825, filed Jul. 23, 2023, SanDisk Technologies LLC.
U.S. Appl. No. 18/358,702, filed Jul. 25, 2023, SanDisk Technologies LLC.
U.S. Appl. No. 18/358,727, filed Jul. 25, 2023, SanDisk Technologies LLC.
U.S. Appl. No. 18/360,541, filed Jul. 27, 2023, SanDisk Technologies LLC.
U.S. Appl. No. 18/360,641, filed Jul. 27, 2023, SanDisk Technologies LLC.
U.S. Appl. No. 18/361,629, filed Jul. 28, 2023, SanDisk Technologies LLC.
Miyamoto, M. et al., "Three-Dimensional Memory Device Containing Integrated Contact-And-Support Assemblies And Methods Of Making The Same," U.S. Appl. No. 18/351,828, filed Jul. 13, 2023.

* cited by examiner

MEMORY DEVICE WITH THROUGH-STACK CONTACT VIA STRUCTURES WHICH CONTACT PLURAL STACKS AND METHOD OF MAKING THE SAME

FIELD

The present disclosure relates generally to the field of semiconductor devices, and particularly to a three-dimensional memory device including through-stack contact via structures which contact plural stacks and methods for manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a memory device is provided, which comprises: a first-tier structure comprising a first first-tier alternating stack and a second first-tier alternating stack, wherein each of the first first-tier alternating stack and the second first-tier alternating stack comprises a respective vertically alternating sequence of first-tier insulating layers and first-tier electrically conductive layers; a second-tier structure overlying or underlying the first-tier structure and comprising a first second-tier alternating stack and a second second-tier alternating stack that are laterally spaced apart from each other by a passive alternating stack, wherein each of the first second-tier alternating stack, the second second-tier alternating stack, and the passive alternating stack comprises a respective vertically alternating sequence of second-tier insulating layers and second-tier electrically conductive layers; first memory stack structures vertically extending through the first first-tier alternating stack and the first second-tier alternating stack; second memory stack structures vertically extending through the second first-tier alternating stack and the second second-tier alternating stack, wherein each of the first memory stack structures and the second memory stack structures comprises a respective vertical semiconductor channel and a respective set of memory elements located at levels of the first-tier electrically conductive layers and the second-tier electrically conductive layers; and an electrically conductive path comprising a first first-tier electrically conductive layer within the first first-tier alternating stack, a first second-tier electrically conductive layer within the passive alternating stack, a second first-tier electrically conductive layer within the second first-tier alternating stack, a first layer contact via structure contacting the first first-tier electrically conductive layer and a first portion of the first second-tier electrically conductive layer within the passive alternating stack, and a second layer contact via structure contacting the second first-tier electrically conductive layer and a second portion of the first second-tier electrically conductive layer within the passive alternating stack.

According to another aspect of the present disclosure, a method of forming a memory device is provided. The method comprises: forming a first-tier structure comprising a first first-tier alternating stack and a second first-tier alternating stack over a substrate, wherein each of the first first-tier alternating stack and the second first-tier alternating stack comprises a respective vertically alternating sequence of first-tier insulating layers and first-tier electrically conductive layers; forming a second-tier structure comprising a first second-tier alternating stack and a second second-tier alternating stack that are laterally spaced apart from each other by a passive alternating stack over the substrate, wherein each of the first second-tier alternating stack, the second second-tier alternating stack, and the passive alternating stack comprises a respective vertically alternating sequence of second-tier insulating layers and second-tier electrically conductive layers, wherein the second-tier structure is formed above, or below, the first-tier structure; forming first memory stack structures vertically extending through the first first-tier alternating stack and the first second-tier alternating stack; forming second memory stack structures vertically extending through the second first-tier alternating stack and the second second-tier alternating stack, wherein each of the first memory stack structures and the second memory stack structures comprises a respective vertical semiconductor channel and a respective set of memory elements located at levels of the first-tier electrically conductive layers and the second-tier electrically conductive layers; and forming a first layer contact via structure and a second layer contact via structure, whereby an electrically conductive path is provided which comprises a first first-tier electrically conductive layer within the first first-tier alternating stack, a first second-tier electrically conductive layer within the passive alternating stack, a second first-tier electrically conductive layer within the second first-tier alternating stack, the first layer contact via structure, and the second layer contact via structure, wherein: the first layer contact via structure contacts the first first-tier electrically conductive layer and a first portion of the first second-tier electrically conductive layer within the passive alternating stack; and the second layer contact via structure contacts the second first-tier electrically conductive layer and a second portion of the first second-tier electrically conductive layer within the passive alternating stack.

DETAILED DESCRIPTION

Figure 1:
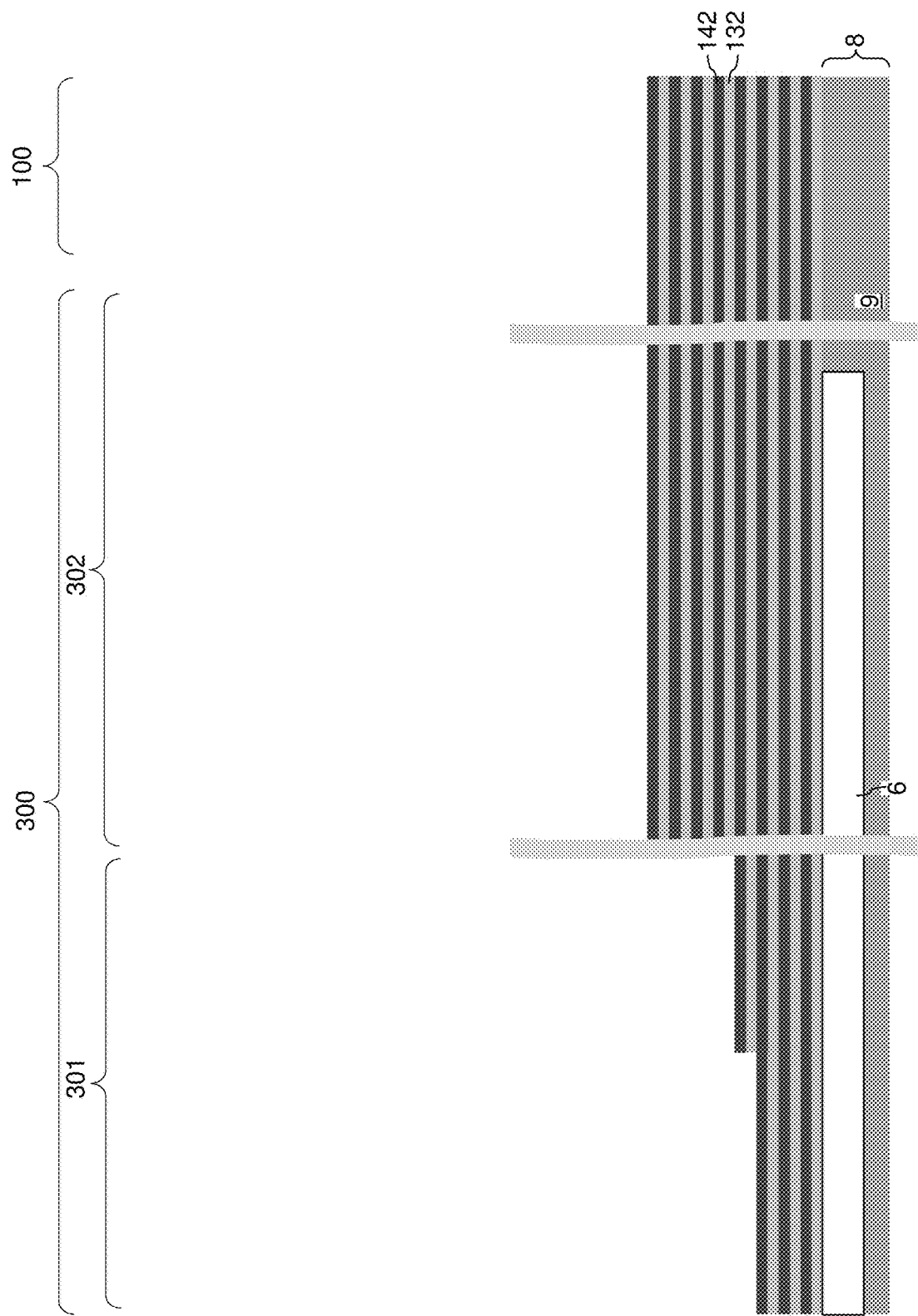
FIG. 1 is a vertical cross-sectional view of a first exemplary structure after formation of a dielectric isolation layer, a first alternating stack of first insulating layers and first sacrificial material layers, and first stepped surfaces according to an embodiment of the present disclosure.

As discussed above, the present disclosure is directed to a three-dimensional memory device including through-stack contact via structures which contact plural stacks and methods for manufacturing the same, the various aspects of which are described below.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, an element located "on" a second element can be located on the exterior side of a surface of the second element or on the interior side of the second element. As used herein, an element is located "directly on" a second element if there exist a physical contact between a surface of the element and a surface of the second element. As used herein, an element is "electrically connected to" a second element if there exists a conductive path consisting of at least one conductive material between the element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to an embodiment of the present disclosure is illustrated, which includes a substrate 8 containing a semiconductor material layer 9 at least at an upper portion thereof. The semiconductor material layer 9 may comprise a single crystalline semiconductor material layer or a polycrystalline semiconductor material layer. The substrate 8 may or may not comprise additional layers (such as dielectric material layers embedding metal interconnect structures) and/or semiconductor devices (such as a peripheral circuit for controlling operation of a three-dimensional memory array to be subsequently formed) underneath the semiconductor material layer. In one embodiment, the substrate 8 may comprise a commercially available semiconductor wafer, such as a single crystalline silicon wafer. The semiconductor material layer 9 may comprise an upper portion of the silicon wafer, a doped well in the silicon wafer, an epitaxial silicon layer on the silicon wafer, etc.

The first exemplary structure comprises a memory array region 100 and a contact region 300. The memory array region 100 is a region in which a three-dimensional memory array is to be subsequently formed. The contact region 300 is a region in which layer contact via structures contacting electrically conductive lines that function as word lines of the three-dimensional memory array are to be subsequently formed. The contact region 300 may comprise a first contact region 301 in which first contact via structures providing electrical connections to first electrically conductive layers are subsequently formed, and a second contact region 302 in which second contact via structures providing electrical connections to second electrically conductive layers are subsequently formed. The memory array region 100 can be provided adjacent to the contact region 300.

An optional dielectric isolation layer 6 can be formed in an upper portion of the substrate 8. The dielectric isolation layer 6 may comprise a silicon oxide layer which is located in the contact region 300 and may optionally extend into the memory array region 100.

A first alternating stack of first insulating layers 132 and first sacrificial material layers 142 can be formed over the substrate 8. The first insulating layers 132 comprise an insulating material such as undoped silicate glass or a doped silicate glass, and the first sacrificial material layers 142 comprise a sacrificial material such as silicon nitride or a silicon-germanium alloy. The first alternating stack (132, 142) may comprise multiple repetitions of a unit layer stack including a first insulating layer 132 and a first sacrificial material layer 142. The total number of repetitions of the unit layer stack within the first alternating stack (132, 142) may be, for example, in a range from 8 to 1,024, such as from 32 to 256, although lesser and greater number of repetitions may also be employed. Each of the first insulating layers 132 may have a thickness in a range from 20 nm to 100 nm, such as from 30 nm to 60 nm, although lesser and greater thicknesses may also be employed. Each of the first sacrificial material layers 142 may have a thickness in a range from 20 nm to 100 nm, such as from 30 nm to 60 nm, although lesser and greater thicknesses may also be employed.

First stepped surfaces are formed in the first contact region 301. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A first stepped cavity is formed within the volume from which portions of the first alternating stack (132, 142) are removed through formation of the first stepped surfaces. A "stepped cavity" refers to a cavity having stepped surfaces.

The first stepped cavity can have various first stepped surfaces such that the horizontal cross-sectional shape of the first stepped cavity changes in steps as a function of the vertical distance from the top surface of the substrate 8. In one embodiment, the first stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each first sacrificial material layer 142 other than a topmost first sacrificial material layer 142 within the first alternating stack (132, 142) laterally extends farther than any overlying first sacrificial material layer 142 within the first alternating stack (132, 142) in the terrace region. The first stepped surfaces of the first alternating stack (132, 142) continuously extend from the bottommost layer within the first alternating stack (132, 142) to the topmost layer within the first alternating stack (132, 142). Generally, the first stepped surfaces continuously extends from a bottommost layer within the first alternating stack (132, 142) at least to a topmost layer within the first alternating stack (132, 142).

Figure 2:
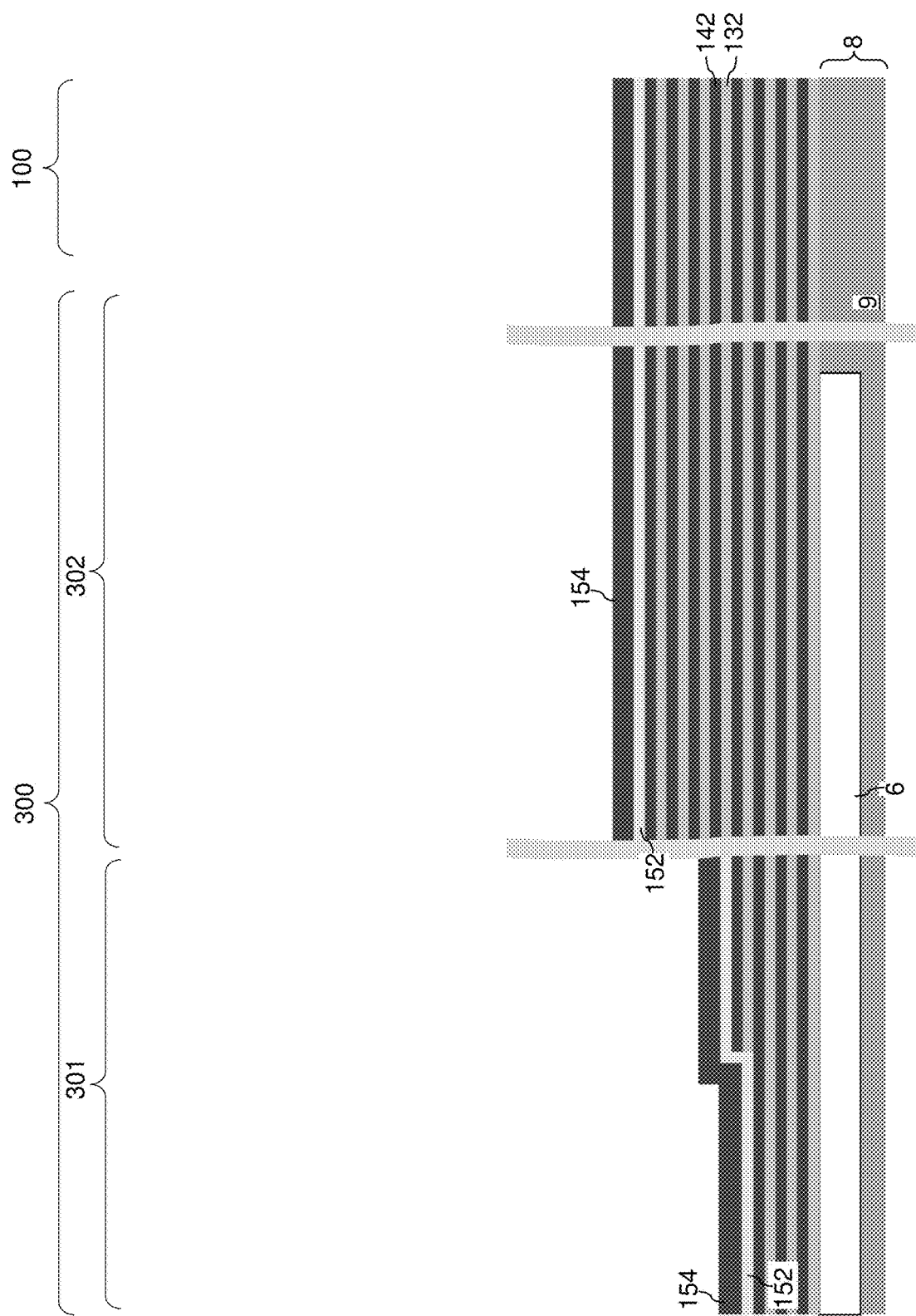
FIG. 2 is a vertical cross-sectional view of the first exemplary structure after formation of a first insulating liner and a first sacrificial liner over the first stepped surfaces according to an embodiment of the present disclosure.

Referring to FIG. 2, a first insulating liner 152 and a first sacrificial liner 154 can be sequentially deposited over the first stepped surfaces. The first insulating liner 152 may be formed by a first conformal deposition process, and may comprise an insulating material such as undoped silicate glass (i.e., silicon oxide) or a doped silicate glass. The thickness of the first insulating liner 152 may be in a range from 10 nm to 50 nm, such as from 15 nm to 30 nm, although lesser and greater thicknesses may also be employed. The first sacrificial liner 154 may be formed by a second conformal deposition process, and may comprise a sacrificial material that can be subsequently removed selective to the material of the first insulating liner 152. In one embodiment, the first sacrificial liner 154 may comprise silicon nitride. The thickness of the first sacrificial liner 154 is greater than the thickness of the first sacrificial material layers 142, and may be in a range from 40 nm to 150 nm, such as from 60 nm to 100 nm, although lesser and greater thicknesses may also be employed.

Figure 3:
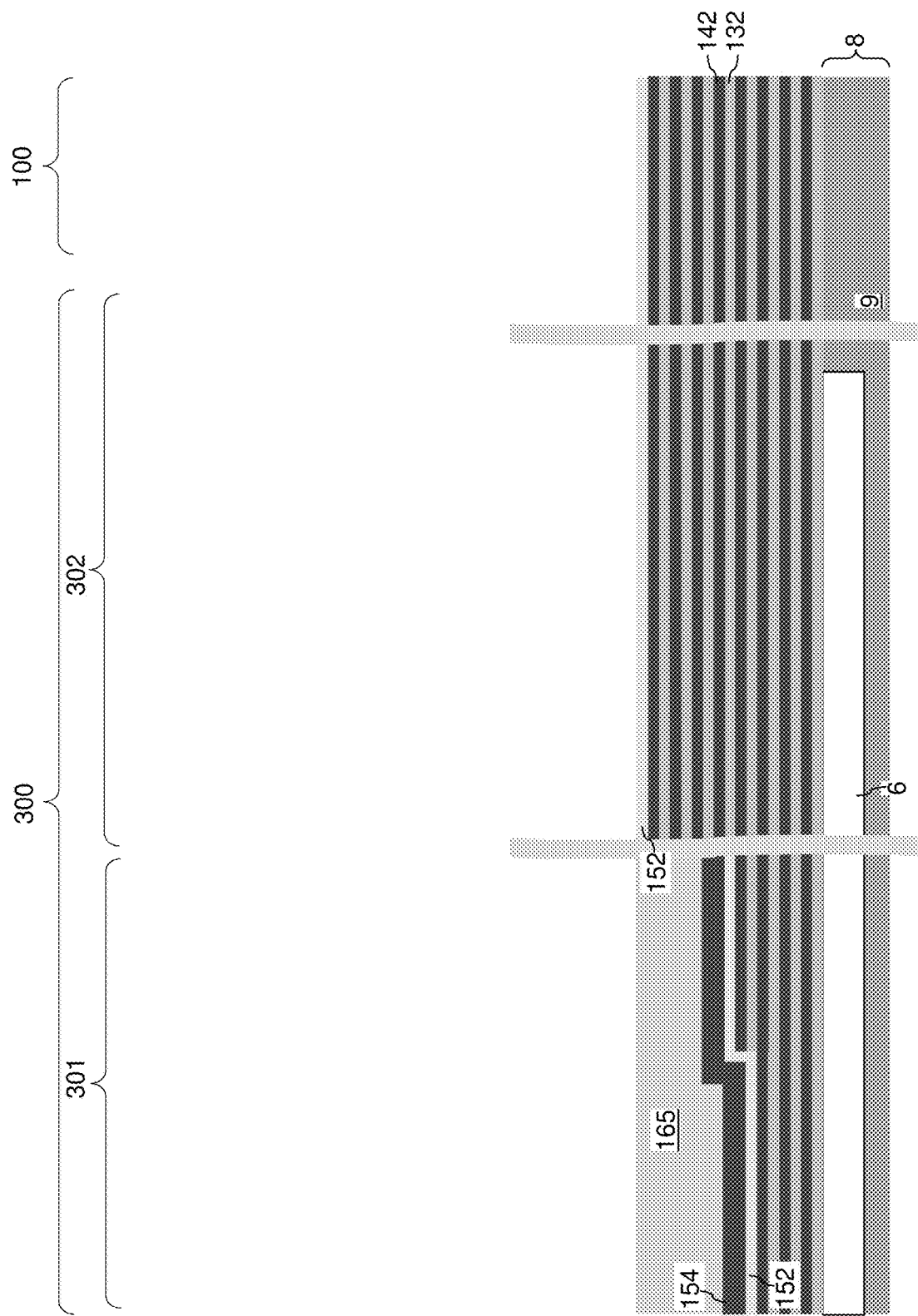
FIG. 3 is a vertical cross-sectional view of the first exemplary structure after formation of a first stepped dielectric material portion according to an embodiment of the present disclosure.

Referring to FIG. 3, a dielectric fill material such as silicon oxide can be deposited in the first stepped cavity. Excess portions of the deposited dielectric fill material can be removed from above the horizontal plane including the top surface of the first sacrificial liner 154, for example, by chemical mechanical planarization (CMP). A recess etch process can be performed to vertically recess a remaining portion of the dielectric fill material by a vertical recess distance that is the same as the thickness of the first sacrificial liner 154. Subsequently, an isotropic etch process can be performed to remove a horizontally-extending portion of the first sacrificial liner 154 selective to the material of the first insulating liner 152. A remaining portion of the dielectric fill material that fills the first stepped cavity constitutes a first stepped dielectric material portion 165. The first stepped dielectric material portion 165 can be retro-stepped.

As used herein, a "retro-stepped" element refers to an element that has first stepped surfaces and a horizontal cross-sectional area that increases monotonically as a function of a vertical distance from a top surface of a substrate on which the element is present. If silicon oxide is employed for the first stepped dielectric material portion 165, the silicon oxide of the first stepped dielectric material portion 165 may, or may not, be doped with dopants such as B, P, and/or F. In one embodiment, the first stepped dielectric material portion 165 overlies and contacts the first stepped surfaces, and has a top surface that is coplanar with the top surface of the horizontally-extending portion of the first insulating liner 152 that overlies the first alternating stack (132, 142) in the memory array region 100.

Figure 4:
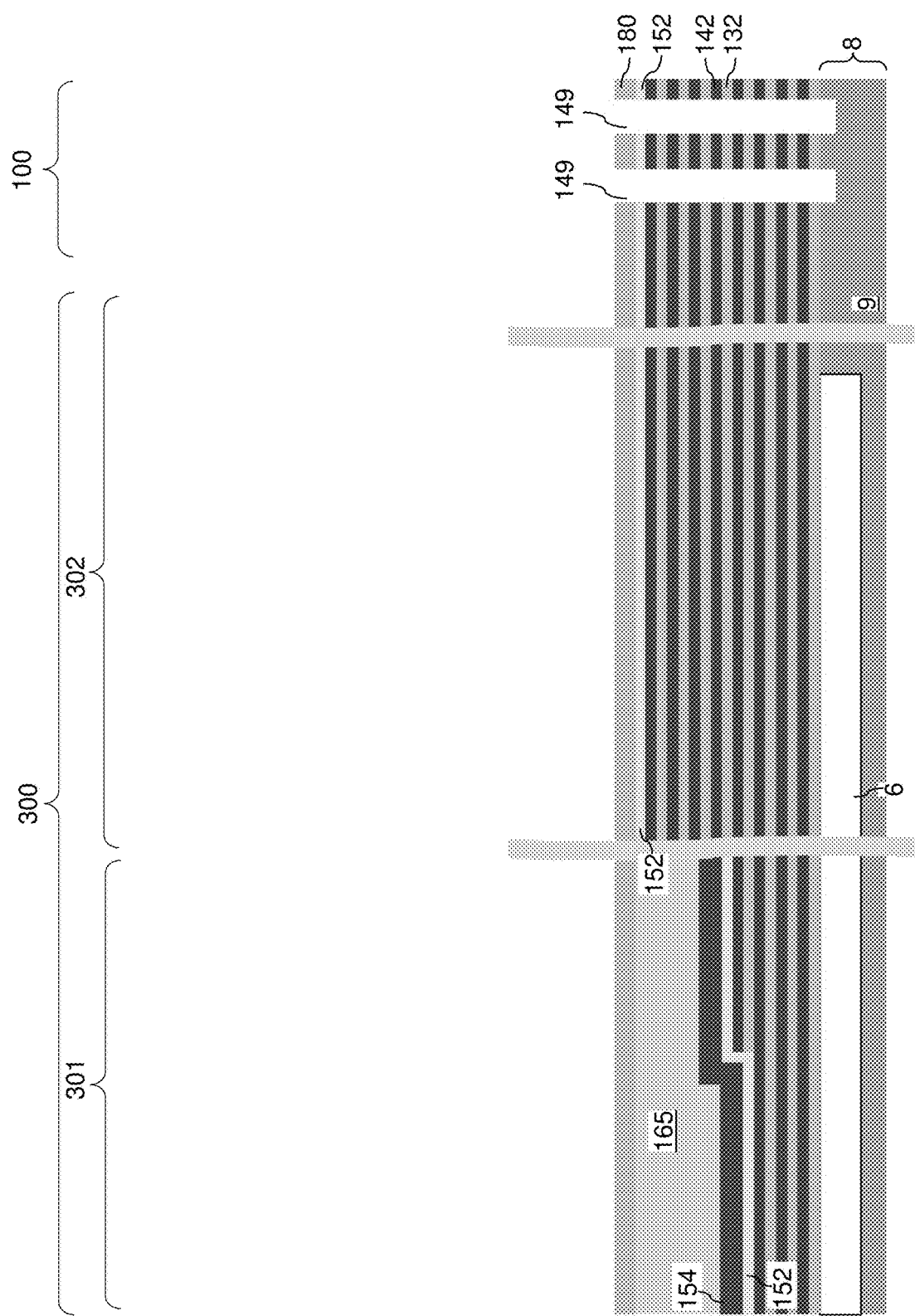
FIG. 4 is a vertical cross-sectional view of the first exemplary structure after formation of an inter-tier dielectric layer and first-tier memory openings according to an embodiment of the present disclosure.

Referring to FIG. 4, a dielectric material layer can be formed over the first insulating liner 152 and the first stepped dielectric material portion 165. The dielectric material layer is herein referred to as an inter-tier dielectric layer 180. The inter-tier dielectric layer 180 comprises a dielectric material such as silicon oxide, and may have a thickness in a range from 50 nm to 200 nm, such as 80 nm to 160 nm, although lesser and greater thicknesses may also be employed.

A first photoresist layer (not shown) can be applied over the inter-tier dielectric layer 180, and can be lithographically patterned to form an array of openings in the memory array region 100. An anisotropic etch process can be performed to transfer the pattern of the openings in the first photoresist layer through the inter-tier dielectric layer 180, the first insulating liner 152, and the first alternating stack (132, 142) and optionally into an upper portion of the semiconductor material layer 9. First-tier memory openings 149 can be formed through the inter-tier dielectric layer 180, the first insulating liner 152, and the first alternating stack (132, 142). The depth of overetch of the first-tier memory openings 149 into the semiconductor material layer 9 may be in a range from 0 nm to 50 nm, such as from 5 nm to 30 nm, although greater overetch depths may also be employed. The first photoresist layer can be subsequently removed, for example, by ashing.

Figure 5A:
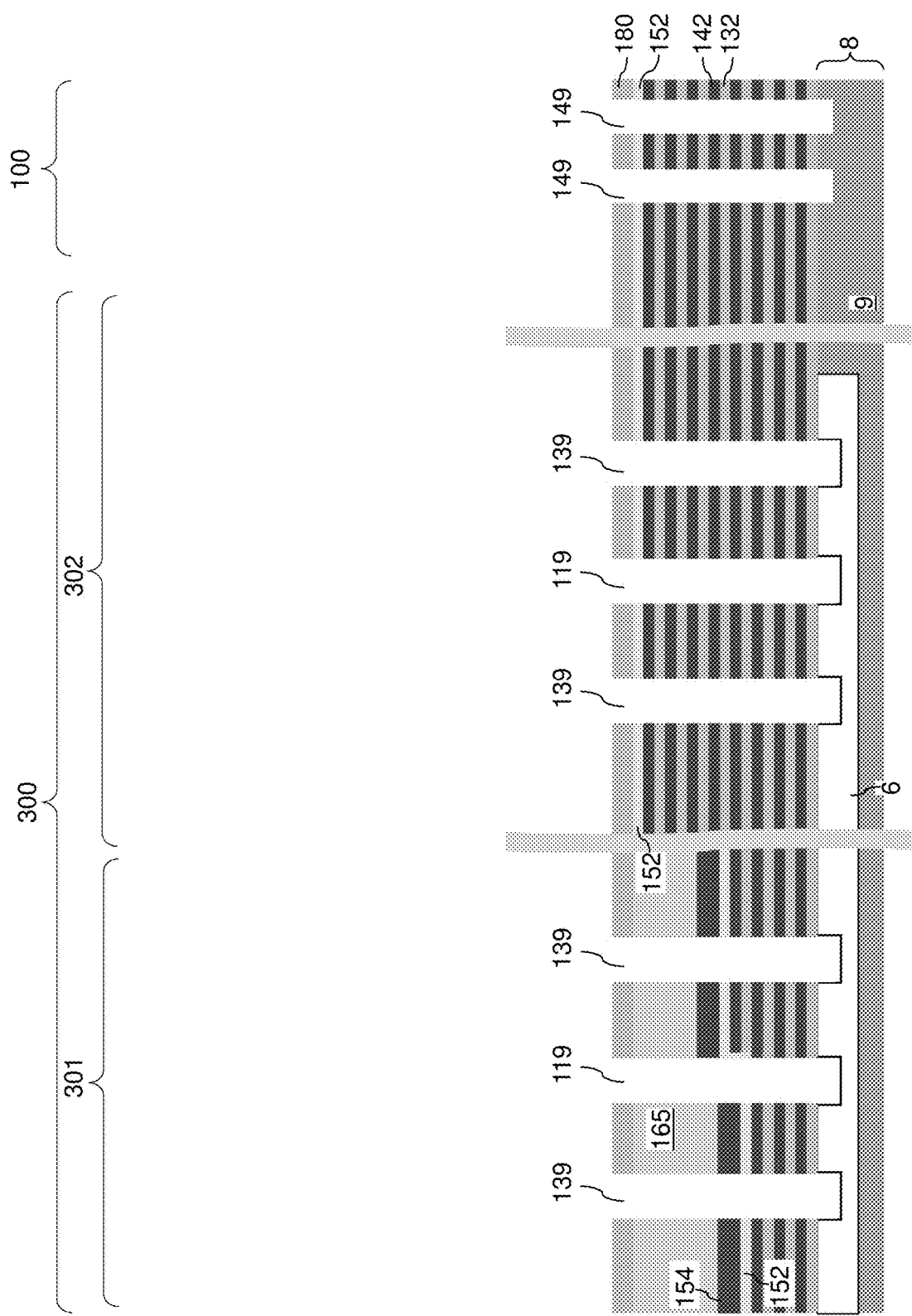
FIG. 5A is a vertical cross-sectional view of the first exemplary structure after formation of first-tier support openings and first-tier contact openings according to an embodiment of the present disclosure.
Figure 5B:
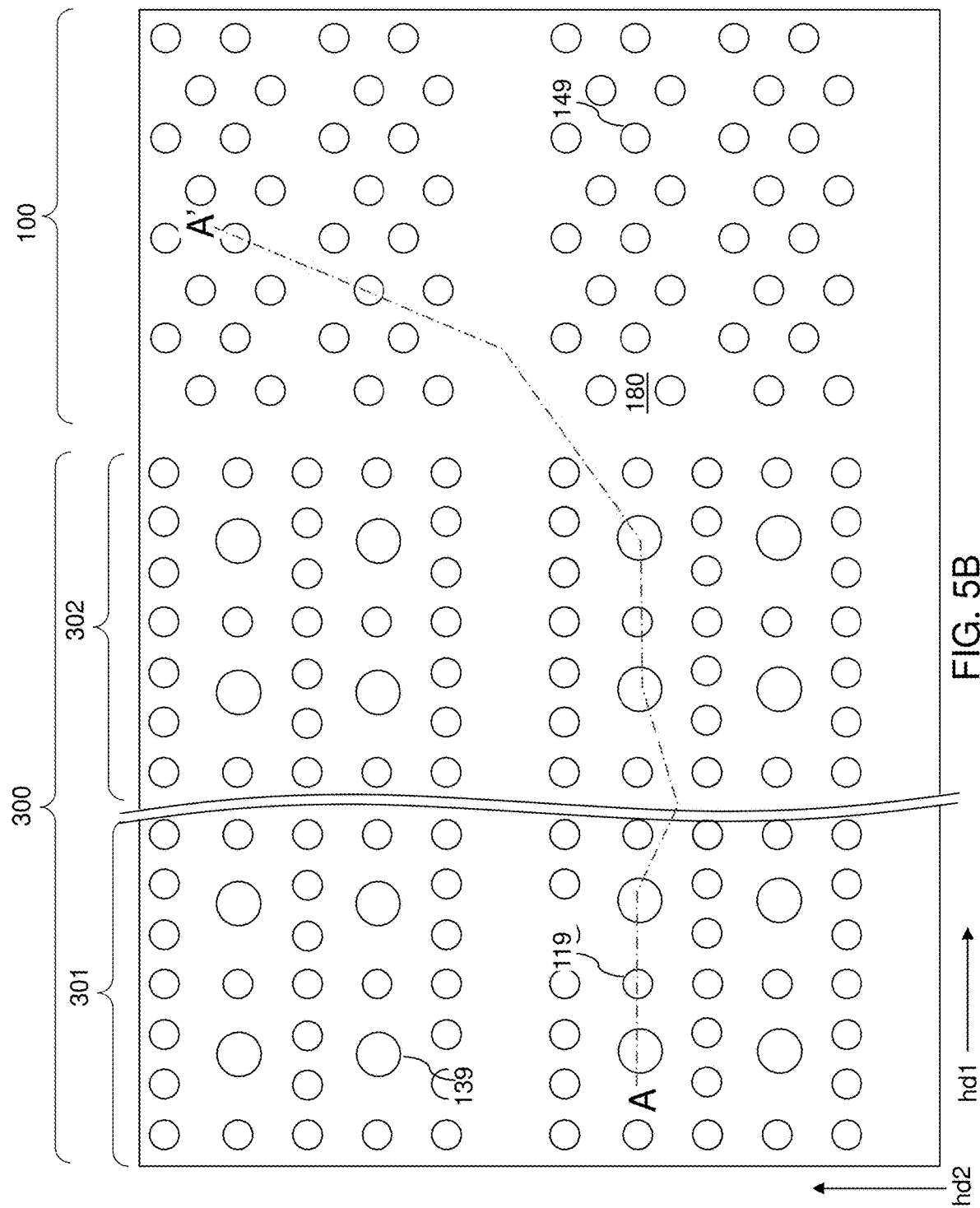
FIG. 5B is a top-down view of the first exemplary structure of FIG. 5A. The hinged vertical plane A-A' is the plane of the vertical cross-sectional view of FIG. 5A.

Referring to FIGS. 5A and 5B, a second photoresist layer (not shown) can be applied over the inter-tier dielectric layer 180, and can be lithographically patterned to form openings in the contact region 300. An anisotropic etch process can be performed to transfer the pattern of the openings in the second photoresist layer through the inter-tier dielectric layer 180, the first sacrificial liner 154, the first insulating liner 152, the first stepped dielectric material portion 165, and portions of the first alternating stack (132, 142) that underlie the first stepped dielectric material portion 165, and optionally into an upper portion of the dielectric isolation layer 6 (if present) or the semiconductor material layer 9 (if layer 6 is omitted). First-tier contact openings 139 can be formed in areas in which layer contact via structures are to be subsequently formed. The layer contact via structures are contact via structures that will contact subsequently formed electrically conductive layers. First-tier support openings 119 can be formed in areas that laterally surround the first-tier contact openings 139. Support pillar structures are subsequently formed in the volumes of the first-tier support openings 119, and are employed as structural support structures during replacement of the first sacrificial material layers 142 with first electrically conductive layers. The second photoresist layer can be subsequently removed, for example, by ashing. The first-tier memory openings 149 may be arranged in rows that extend along a first horizontal direction hd1, which may be a word line direction. Rows of the first-tier memory openings 149 may be laterally spaced apart from each other along a second horizontal direction hd2, which may be perpendicular to the first horizontal direction hd1 and may be a bit line direction. The first-tier contact openings 139 may be arranged in rows that laterally extend along the first horizontal direction hd1.

Figure 6:
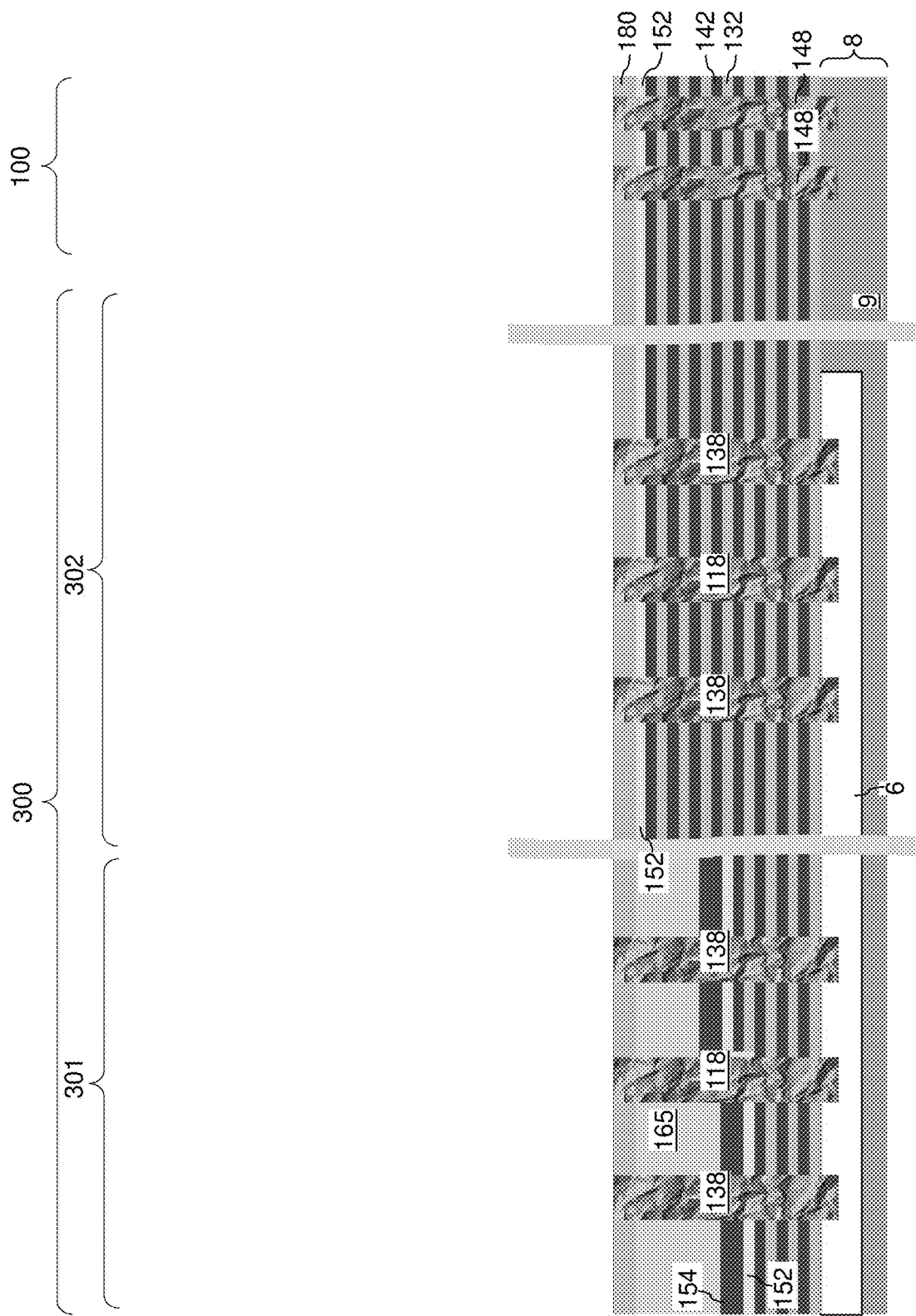
FIG. 6 is a vertical cross-sectional view of the first exemplary structure after formation of first-tier sacrificial memory opening fill structures, first-tier sacrificial support opening fill structures, and first-tier sacrificial contact opening fill structures according to an embodiment of the present disclosure.

Referring to FIG. 6, an optional etch stop liner (not shown) and a first sacrificial fill material can be deposited in the first-tier memory openings 149, the first-tier support openings 119, and the first-tier contact openings 139. The optional etch stop liner (if present) comprises a thin silicon oxide layer having a thickness in a range from 1 nm to 6 nm. The first sacrificial fill material may comprise a carbon-based material (such as amorphous carbon or diamond-like carbon), a semiconductor material (such as amorphous silicon or polysilicon), a dielectric fill material (such as borosilicate glass or organosilicate glass), or a polymer material.

A recess etch process can be performed to remove portions of the first sacrificial fill material from above the horizontal plane including the top surface of the inter-tier dielectric layer 180. In one embodiment, each remaining portion of the first sacrificial fill material has a top surface within a horizontal plane including a top surface of the inter-tier dielectric layer 180. Remaining portions of the first sacrificial fill material that fill the first-tier memory openings 149 constitute first-tier sacrificial memory opening fill structures 148. Remaining portions of the first sacrificial fill material that fill the first-tier support openings 119 constitute first-tier sacrificial support opening fill structures 118. Remaining portions of the first sacrificial fill material that fill the first-tier contact openings 139 constitute first-tier sacrificial contact opening fill structures 138.

Figure 7:
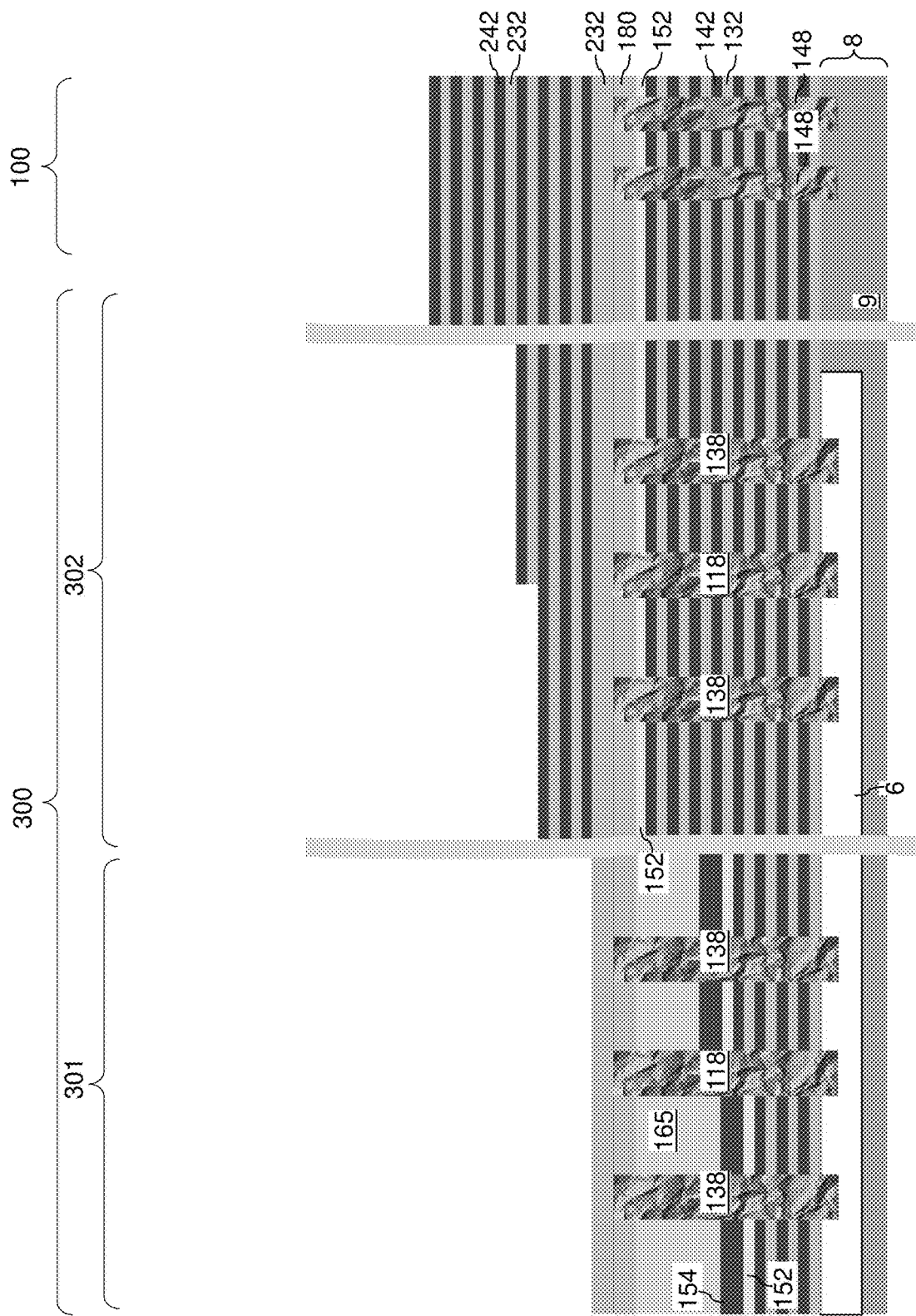
FIG. 7 is a vertical cross-sectional view of the first exemplary structure after formation of a second alternating stack of second insulating layers and second sacrificial material layers and second stepped surfaces according to an embodiment of the present disclosure.

Referring to FIG. 7, a second alternating stack of second insulating layers 232 and second sacrificial material layers 242 can be formed over the first alternating stack (132, 142). The second insulating layers 232 comprise an insulating material, such as undoped silicate glass (i.e., silicon oxide) or a doped silicate glass, and the second sacrificial material layers 242 comprise a sacrificial material, such as silicon nitride. The second alternating stack (232, 242) may comprise multiple repetitions of a unit layer stack including a second insulating layer 232 and a second sacrificial material layer 242. The total number of repetitions of the unit layer stack within the second alternating stack (232, 242) may be, for example, in a range from 8 to 1,024, such as from 32 to 256, although lesser and greater number of repetitions may also be employed. Each of the second insulating layers 232 may have a thickness in a range from 20 nm to 100 nm, such as from 30 nm to 60 nm, although lesser and greater thicknesses may also be employed. Each of the second sacrificial material layers 242 may have a thickness in a range from 20 nm to 100 nm, such as from 30 nm to 60 nm, although lesser and greater thicknesses may also be employed. While two alternating stacks are provided in this embodiment, in other embodiment only one alternating stack or more than two alternating stacks (e.g., three or more alternating stacks) may be used.

Second stepped surfaces are formed in the second contact region 302. A second stepped cavity is formed within the volume from which portions of the second alternating stack (232, 242) are removed through formation of the second stepped surfaces. The second stepped cavity can have various second stepped surfaces such that the horizontal cross-sectional shape of the second stepped cavity changes in steps as a function of the vertical distance from the top surface of the substrate 8. In one embodiment, the second stepped cavity can be formed by repetitively performing a set of processing steps. The set of processing steps can include, for example, an etch process of a second type that vertically increases the depth of a cavity by one or more levels, and an etch process of a second type that laterally expands the area to be vertically etched in a subsequent etch process of the second type.

Each second sacrificial material layer 242 other than a topmost second sacrificial material layer 242 within the second alternating stack (232, 242) laterally extends farther than any overlying second sacrificial material layer 242 within the second alternating stack (232, 242) in the terrace region. The second stepped surfaces of the second alternating stack (232, 242) continuously extend from the bottommost layer within the second alternating stack (232, 242) to the topmost layer within the second alternating stack (232, 242). Generally, the second stepped surfaces continuously extends from a bottommost layer within the second alternating stack (232, 242) at least to a topmost layer within the second alternating stack (232, 242).

Figure 8:
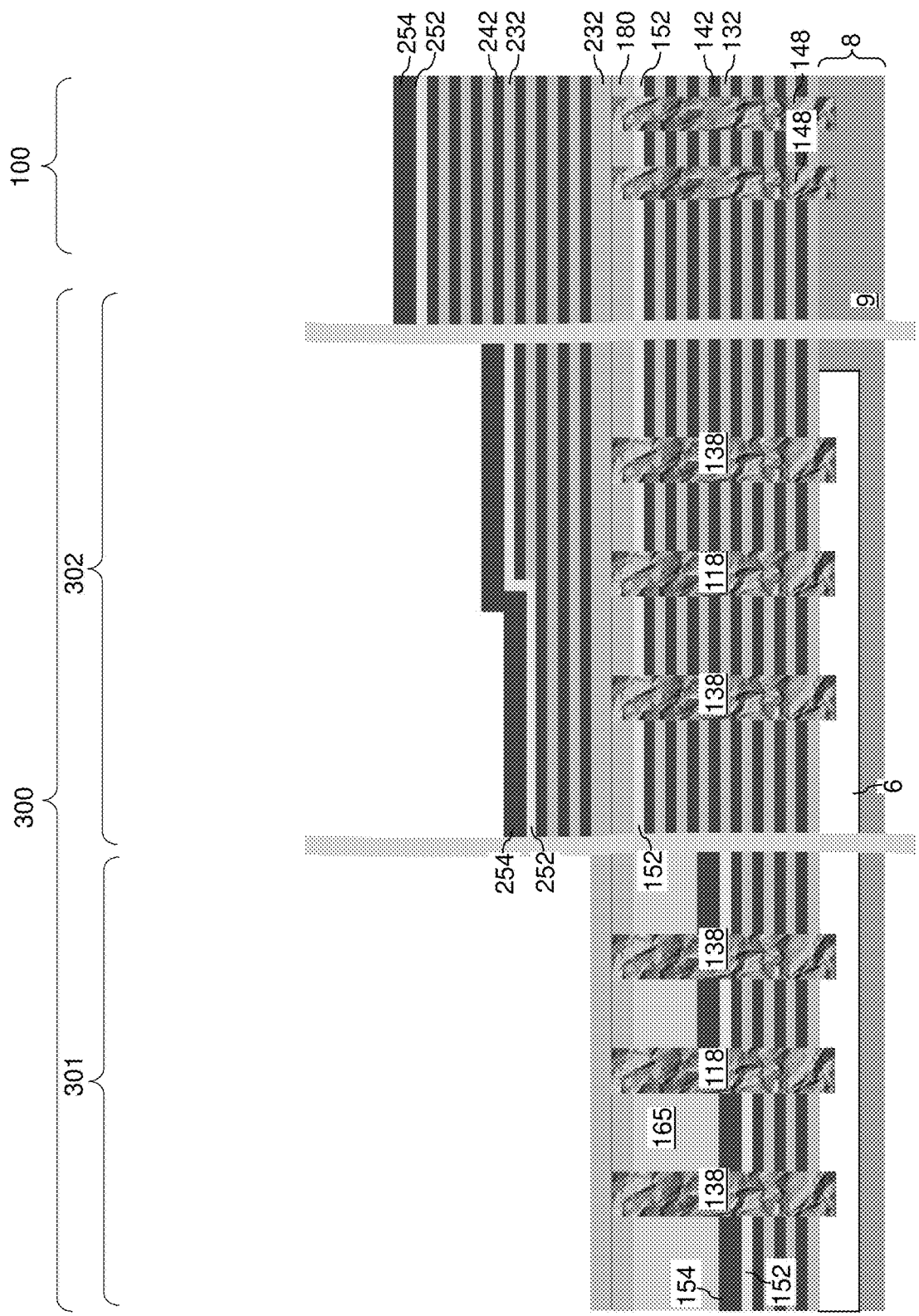
FIG. 8 is a vertical cross-sectional view of the first exemplary structure after formation of a second insulating liner and a second sacrificial liner over the second stepped surfaces according to an embodiment of the present disclosure.

Referring to FIG. 8, a second insulating liner 252 and a second sacrificial liner 254 can be sequentially deposited over the second stepped surfaces. The second insulating liner 252 may be formed by a conformal deposition process, and may comprise an insulating material such as undoped silicate glass or a doped silicate glass. The thickness of the second insulating liner 252 may be the same as that of the first insulating liner 152. The second sacrificial liner 254 may be formed by a conformal deposition process, and may comprise a sacrificial material that can be subsequently removed selective to the material of the second insulating liner 252. In one embodiment, the second sacrificial liner 254 may comprise silicon nitride. The thickness of the second sacrificial liner 254 is greater than the thickness of the second sacrificial material layers 242, and may be the same as that of the first sacrificial liner 154.

A photoresist layer (not shown) can be applied over the second sacrificial liner 254, and can be lithographically patterned such that the photoresist layer covers the memory array region 100 and the second contact region 302, and does not cover the first contact region 301. A first etch process can be performed to remove unmasked portions of the second sacrificial liner 254 in the first contact region 301. A second etch process can be performed to remove unmasked portions of the second insulating liner 252 in the first contact region 301. The photoresist layer can be subsequently removed, for example, by ashing.

Figure 9:
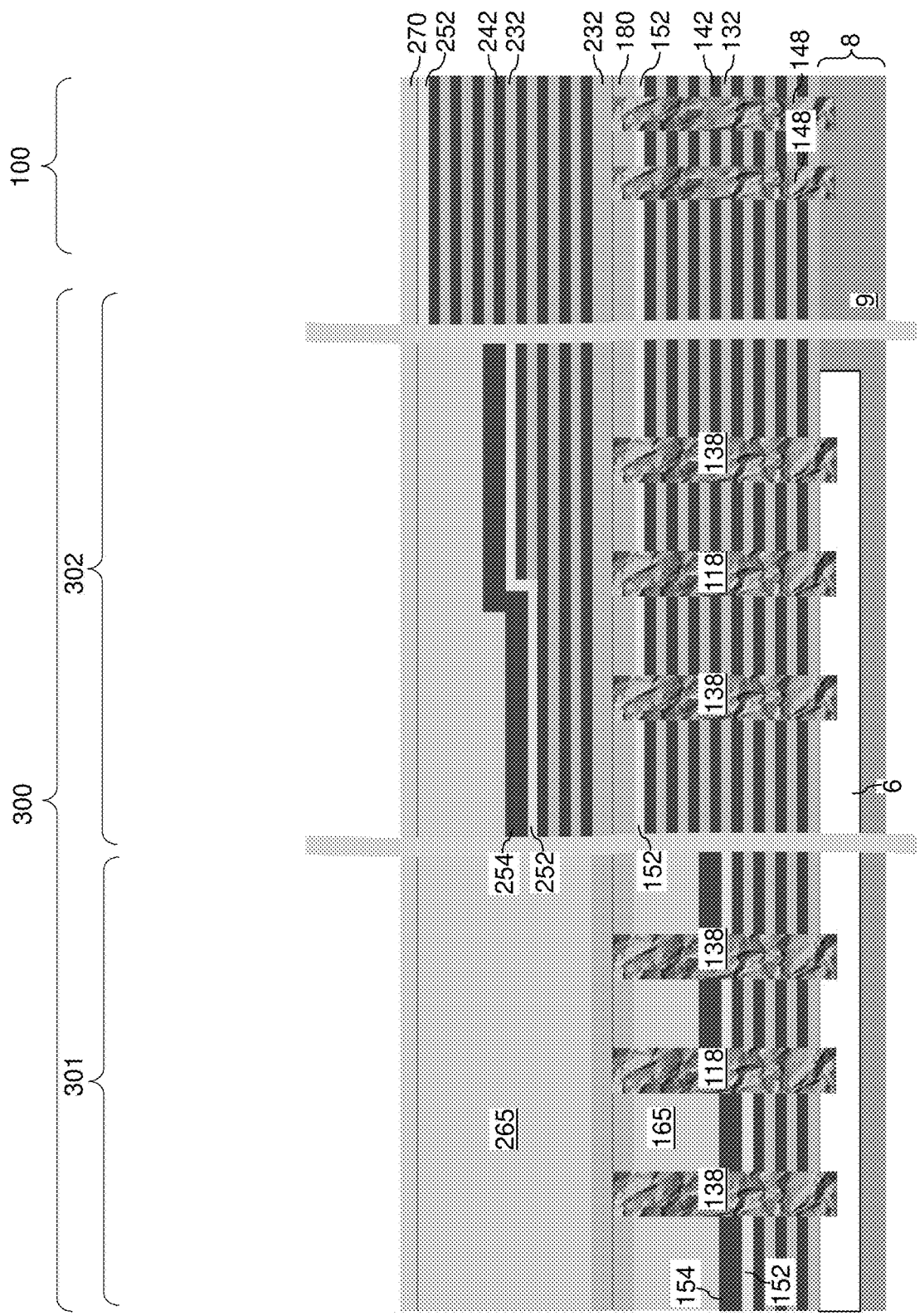
FIG. 9 is a vertical cross-sectional view of the first exemplary structure after formation of a second stepped dielectric material portion and an insulating cap layer according to an embodiment of the present disclosure.

Referring to FIG. 9, a dielectric fill material, such as silicon oxide, can be deposited in the second stepped cavity. Excess portions of the deposited dielectric fill material can be removed from above the horizontal plane including the top surface of the second sacrificial liner 254, for example, by chemical mechanical planarization (CMP). A recess etch process can be performed to vertically recess a remaining portion of the dielectric fill material by a vertical recess distance that is the same as the thickness of the second sacrificial liner 254. Subsequently, an isotropic etch process can be performed to remove a horizontally-extending portion of the second sacrificial liner 254 selective to the material of the second insulating liner 252. A remaining portion of the dielectric fill material that fills the second stepped cavity constitutes a second stepped dielectric material portion 265.

If silicon oxide is employed for the second stepped dielectric material portion 265, the silicon oxide of the second stepped dielectric material portion 265 may, or may not, be doped with dopants such as B, P, and/or F. In one embodiment, the second stepped dielectric material portion 265 overlies and contacts the second stepped surfaces, and has a top surface that is coplanar with the top surface of the horizontally-extending portion of the second insulating liner 252 that overlies the second alternating stack (232, 242) in the memory array region 100.

An insulating cap layer 270 can be formed over the second insulating liner 252 and the second stepped dielectric material portion 265. The insulating cap layer 270 comprises a dielectric material, such as silicon oxide, and may have a thickness in a range from 50 nm to 200 nm, such as 80 nm to 260 nm, although lesser and greater thicknesses may also be employed.

Figure 10:
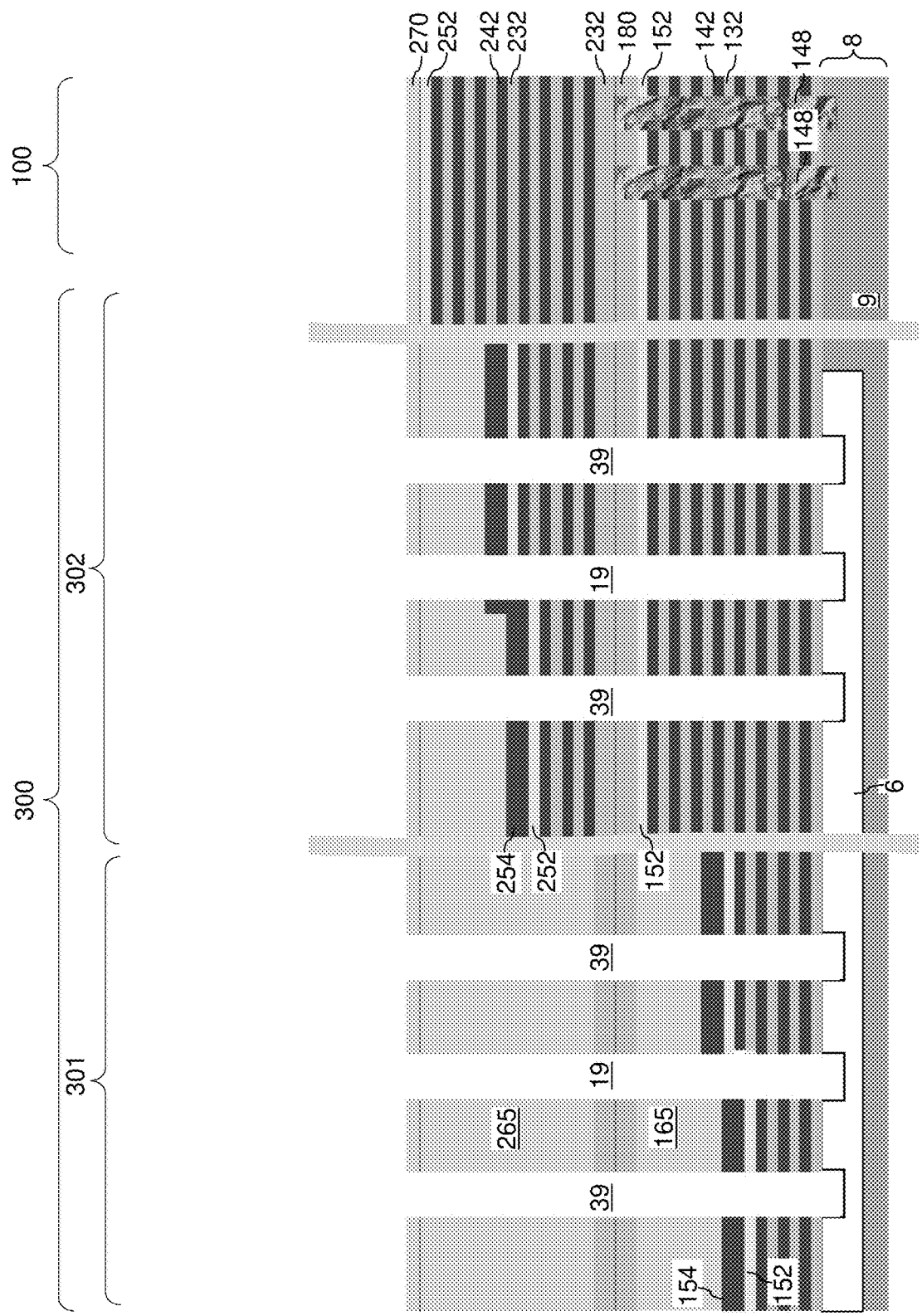
FIG. 10 is a vertical cross-sectional view of the first exemplary structure after formation of multi-tier support openings and multi-tier contact openings according to an embodiment of the present disclosure.

Referring to FIG. 10, a photoresist layer (not shown) can be applied over the insulating cap layer 270, and can be lithographically patterned to form openings over areas of the first-tier sacrificial contact opening fill structures 138 and the first-tier sacrificial support opening fill structures 118. An anisotropic etch process can be performed to transfer the pattern of the openings in the photoresist layer through the insulating cap layer 270, the second stepped dielectric material portion 265, the second sacrificial liner 254, the second insulating liner 252, and portions of the second alternating stack (232, 242) that underlie the second stepped dielectric material portion 265. Subsequently, the sacrificial fill material of the first-tier sacrificial contact opening fill structures 138 and the first-tier sacrificial support opening fill structures 118 can be removed selective to the materials of the insulating cap layer, the first alternating stack (132, 232), the second alternating stack (232, 242), the inter-tier dielectric layer 180 and the dielectric isolation layer 6. For example, a selective etch process or an ashing process (for carbon sacrificial material) may be performed to remove the sacrificial fill material of the first-tier sacrificial contact opening fill structures 138 and the first-tier sacrificial support opening fill structures 118.

Multi-tier contact openings 39, which are also referred to as contact openings 39, can be formed in volumes from which the first-tier sacrificial contact opening fill structures 138 are removed and in volumes that overlie the volumes of the first-tier sacrificial contact opening fill structures 138 and vertically extend through the second alternating stack (232, 242) and/or the second stepped dielectric material portion 265 and through the insulating cap layer 270. Multi-tier support openings 19, which are also referred to as support openings 39, can be formed in volumes from which the first-tier sacrificial support opening fill structures 118 are removed and in volumes that overlie the volumes of the first-tier sacrificial support opening fill structures and vertically extend through the second alternating stack (232, 242) and/or the second stepped dielectric material portion 265 and through the insulating cap layer 270. The photoresist layer can be subsequently removed, for example, by ashing.

Figure 11:
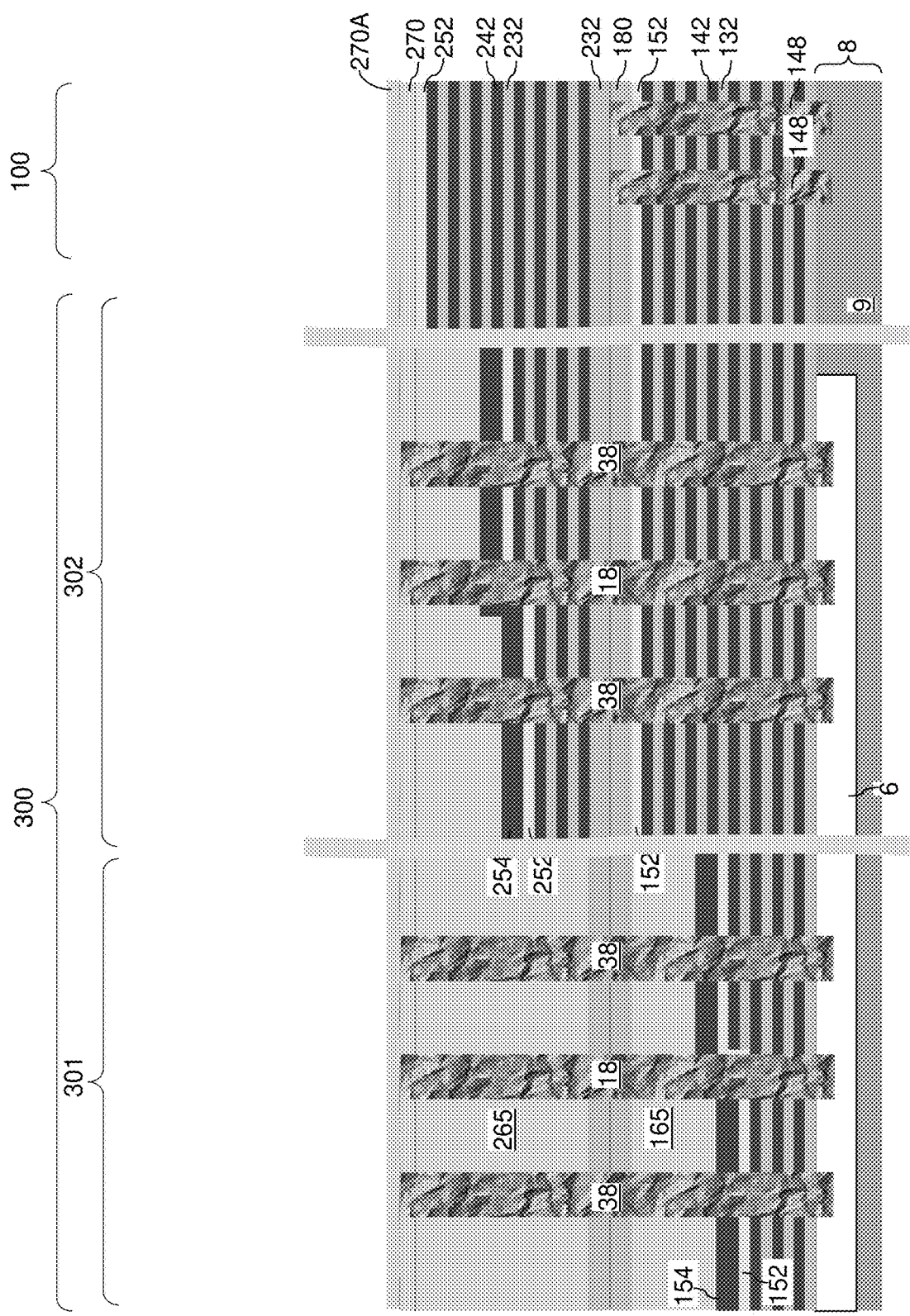
FIG. 11 is a vertical cross-sectional view of the first exemplary structure after formation of sacrificial support opening fill structures and sacrificial contact opening fill structures according to an embodiment of the present disclosure.

Referring to FIG. 11, an optional etch stop liner (not shown) and a second sacrificial fill material can be deposited in the multi-tier support openings 19 and the multi-tier contact openings 39. The optional etch stop liner (if present) comprises a thin silicon oxide layer having a thickness in a range from 2 nm to 6 nm. The second sacrificial fill material may comprise a carbon-based material (such as amorphous carbon or diamond-like carbon), a semiconductor material (such as amorphous silicon or polysilicon), a dielectric fill material (such as borosilicate glass or organosilicate glass), or a polymer material.

A recess etch process can be performed to remove portions of the second sacrificial fill material from above the horizontal plane including the top surface of the insulating cap layer 270. In one embodiment, each remaining portion of the second sacrificial fill material has a top surface within a horizontal plane including a top surface of the insulating cap layer 270. Remaining portions of the second sacrificial fill material that fill the multi-tier support openings 19 constitute sacrificial support opening fill structures 18. Remaining portions of the second sacrificial fill material that fill the multi-tier contact openings 39 constitute sacrificial contact opening fill structures 38. A cover insulating layer 270A is formed over the insulating cap layer 270, the sacrificial support opening fill structures 18 and the sacrificial contact opening fill structures 38. The cover insulating layer 270A may comprise silicon oxide and is merged into the insulating cap layer 270.

Figure 12:
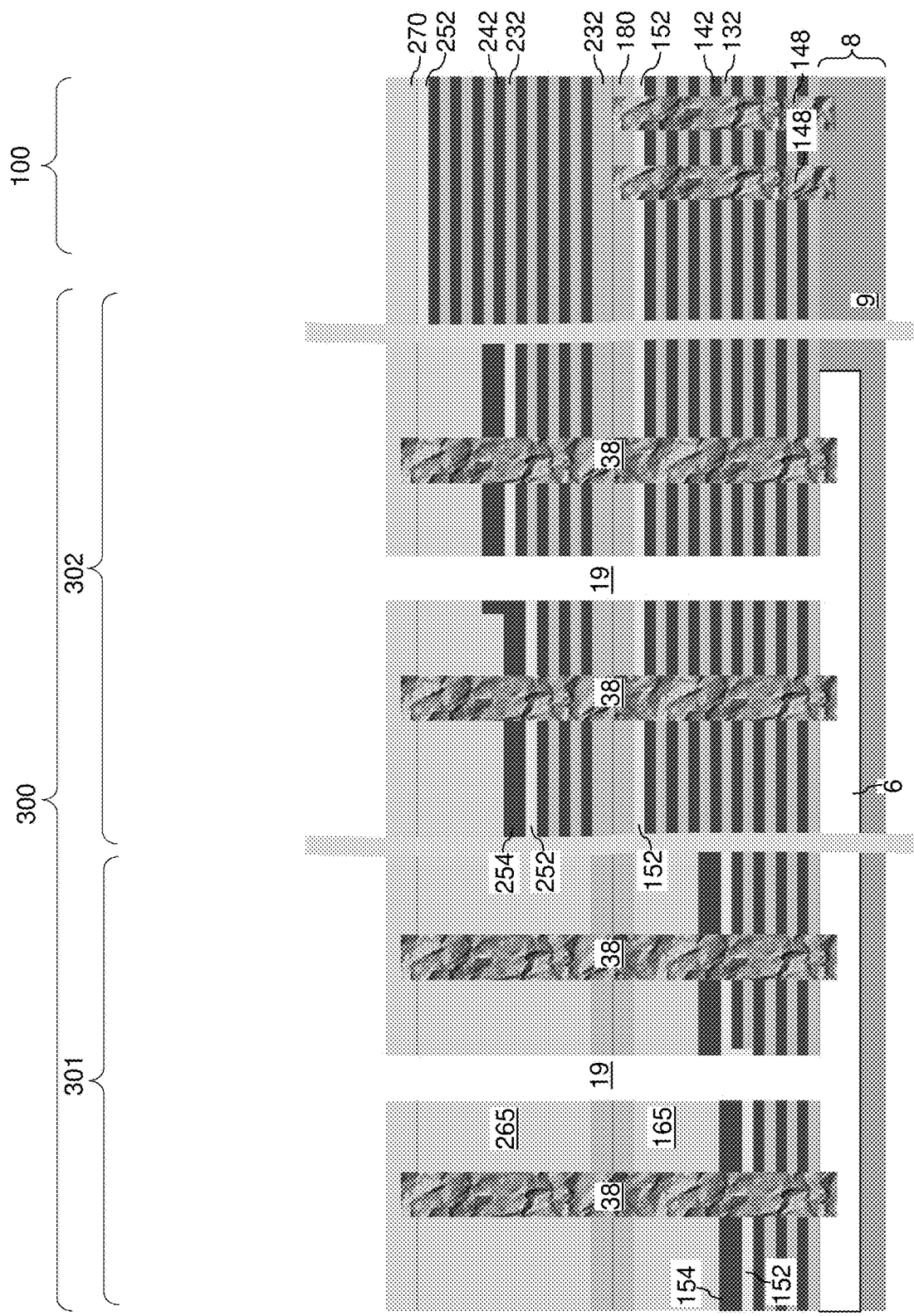
FIG. 12 is a vertical cross-sectional view of the first exemplary structure after formation of support pillar structures according to an embodiment of the present disclosure.

Referring to FIG. 12, a photoresist layer (not shown) can be applied over the insulating cap layer 270, and can be lithographically patterned to form openings in areas that overlie the sacrificial support opening fill structures 18. The sacrificial support opening fill structures 18 can be removed selective to the materials of the insulating cap layer 270, the alternating stacks {(132, 142), (232, 242)}, the inter-tier dielectric layer 180, and the dielectric isolation layer 6. An anisotropic etch process, an isotropic etch process, or an ashing process may be employed. The photoresist layer can be subsequently removed, for example, by ashing. The cavities formed by removal of the sacrificial support opening fill structures 18 comprise the multi-tier support openings 19, which are referred to as support openings going forward.

Figure 13:
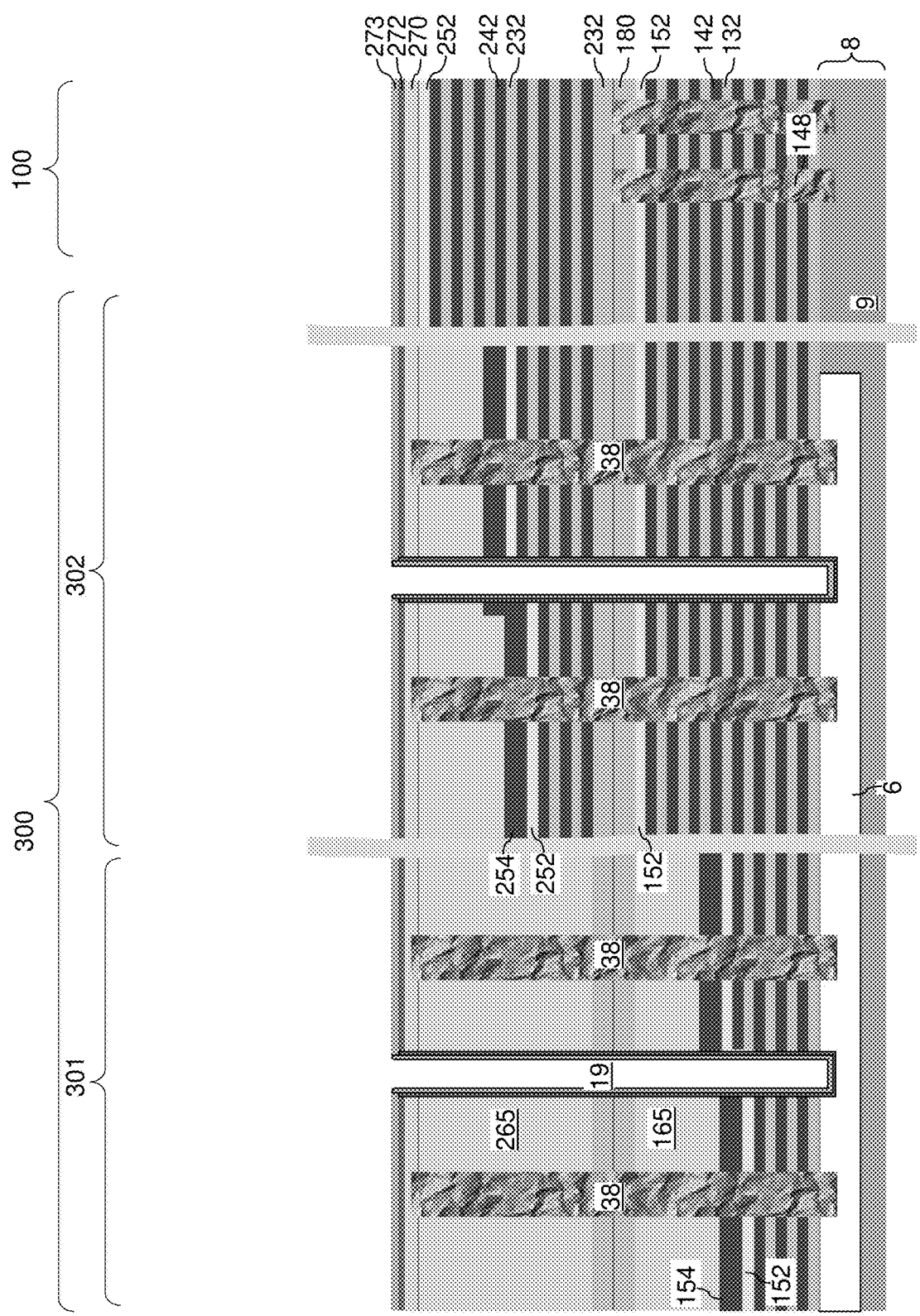
FIG. 13 is a vertical cross-sectional view of the first exemplary structure after formation of dielectric capping layers according to an embodiment of the present disclosure.

Referring to FIG. 13, at least one dielectric spacer layer (272, 273) may be optionally formed in the support openings 19 and over the insulating cap layer 270. The at least one dielectric spacer layer (272, 273) may comprise an outer dielectric spacer layer 272 and an optional inner dielectric spacer layer 273. In an illustrative example, the outer dielectric spacer layer 272 may comprise a silicon nitride layer which is converted to a silicon oxide or silicon oxynitride layer by plasma oxidation. The inner dielectric spacer layer 273 may comprise an as-deposited silicon oxide layer. Alternatively, the inner dielectric spacer layer 273 may be omitted. The at least one dielectric spacer layer (272, 273) prevents a subsequently formed silicon nitride layer in the multi-tier support openings 19 from being exposed to subsequently formed lateral isolation trenches and thus from being removed with other silicon nitride sacrificial material layers (142, 242) during replacement of the sacrificial material layers with electrically conductive layers.

Figure 14:
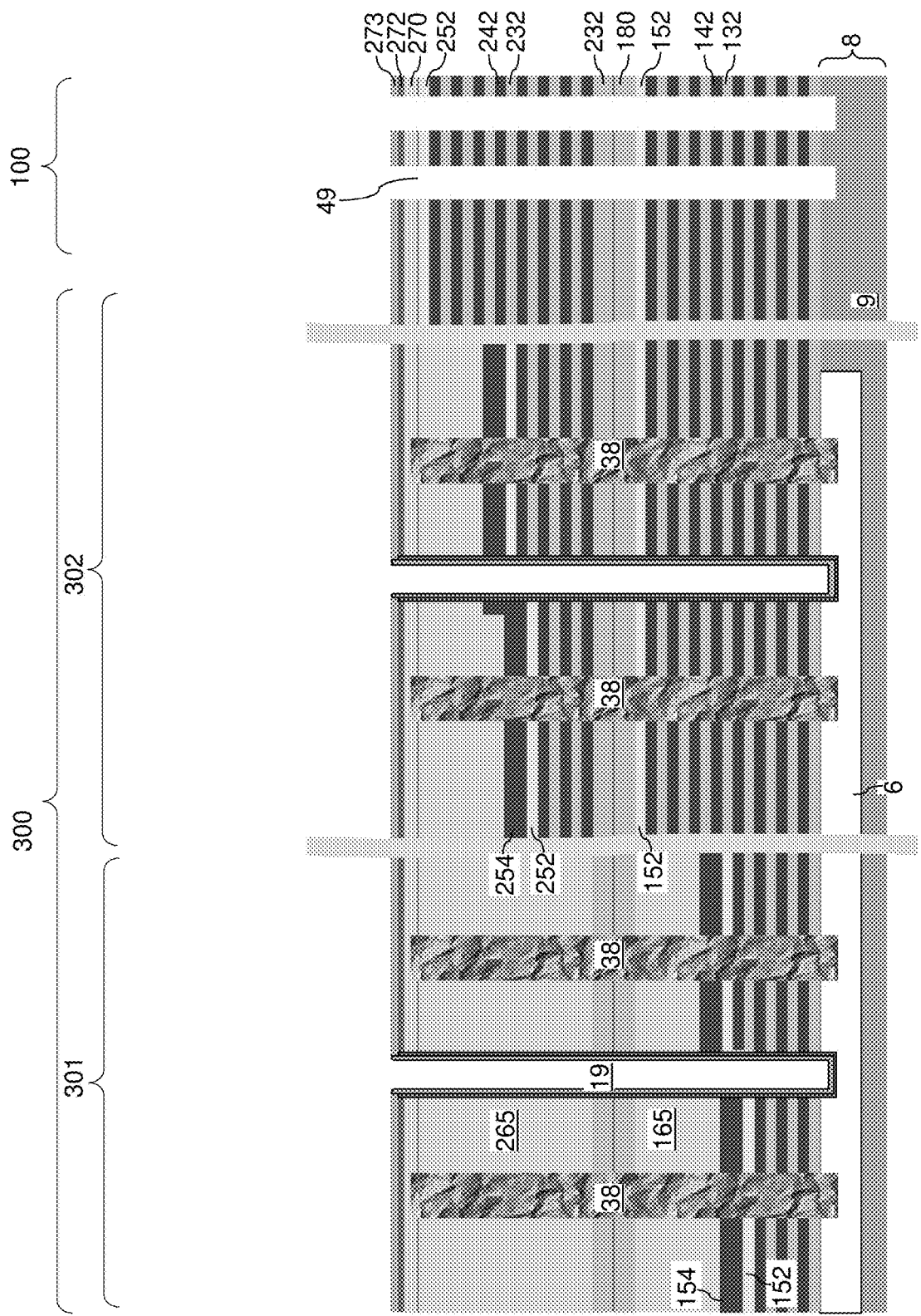
FIG. 14 is a vertical cross-sectional view of the first exemplary structure after formation of memory openings according to an embodiment of the present disclosure.

Referring to FIG. 14, a photoresist layer (not shown) may be applied over the dielectric spacer layers (272, 273), and can be lithographically patterned to form openings in areas of the first-tier sacrificial memory opening fill structures 148. An anisotropic etch process can be formed to form openings through the dielectric spacer layers (272, 273), the insulating cap layer 270, and the second alternating stack (232, 242) underneath the openings in the photoresist layer and over the first-tier sacrificial memory opening fill structures 148. The first-tier sacrificial memory opening fill structures 148 can be subsequently removed selective to the materials of the dielectric spacer layers (272, 273), the insulating cap layer 270, the alternating stacks {(132, 142), (232, 242)}, and the inter-tier dielectric layer 180. Multi-tier memory openings 49, which are also referred to as memory openings 49, are formed in the volumes from which the first-tier sacrificial memory opening fill structures 148 are removed and in the volumes of the cavities that overlie the volumes from which the first-tier sacrificial memory opening fill structures 148 are removed. The photoresist layer can be subsequently removed, for example, by ashing.

Figure 15:
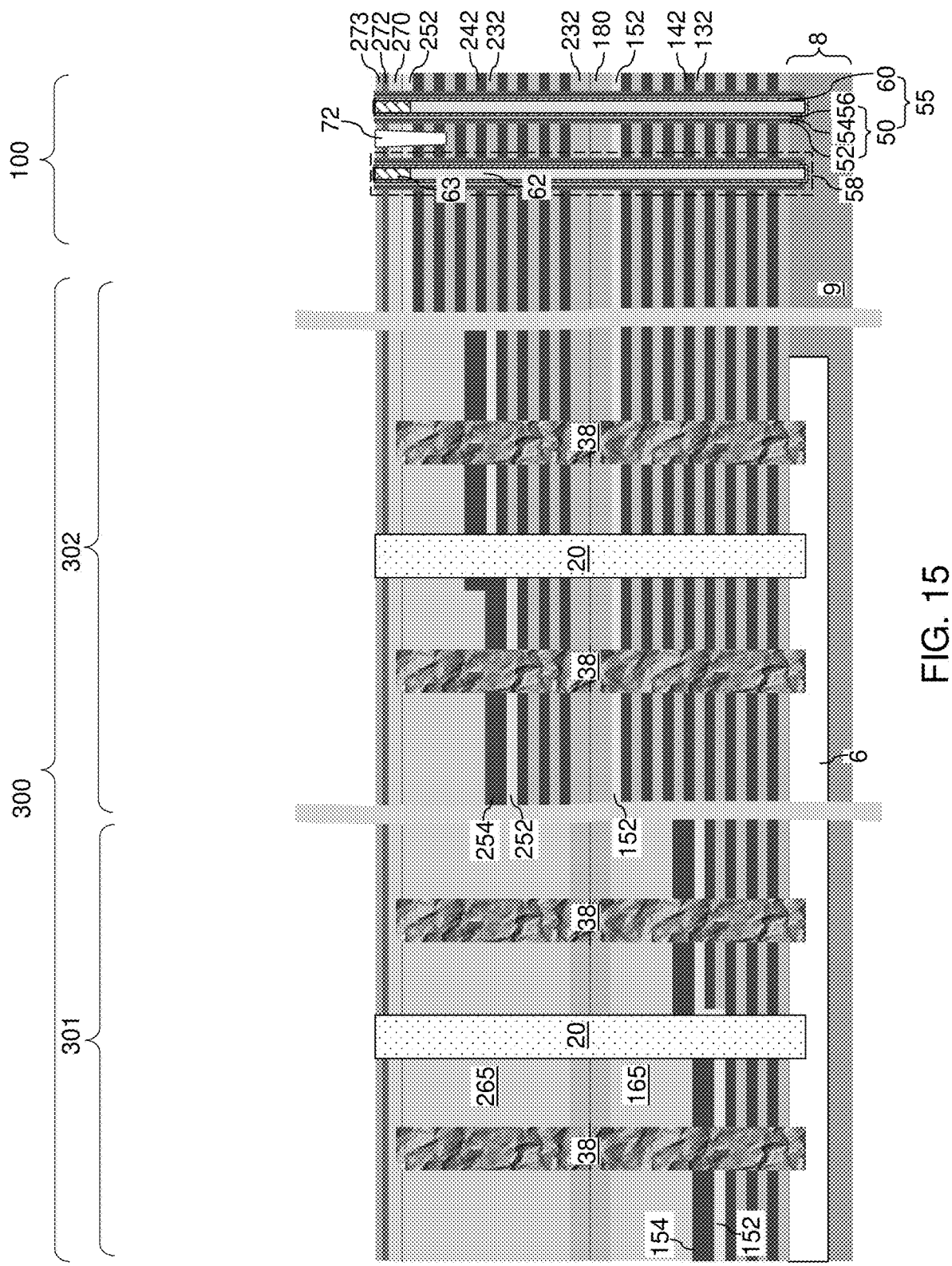
FIG. 15 is a vertical cross-sectional view of the first exemplary structure after formation of memory opening fill structures according to an embodiment of the present disclosure.

Referring to FIG. 15, a sequence of processing steps can be performed to form a memory opening fill structure 58 within each multi-tier memory opening 49 and to form a support pillar structure 20 within each multi-tier support opening 19 at the same time. For example, a memory film 50 can be formed within each of the memory openings 49 and the support openings 19. The memory films 50 may include any memory material that can store information by charge trapping, a change in electrical resistivity, a change in the direction of ferroelectric polarization (e.g., in a ferroelectric material), or any other material that can store information therein. For example, each memory film 50 may comprise a layer stack including a blocking dielectric layer 52, a charge storage layer 54, and a tunneling dielectric layer 56. In one embodiment, the memory films 50 can be formed by depositing material layers and/or material portions and by removing excess portions of the material layers and/or the material portions from outside and the bottoms of the memory openings 49 and the support openings 19, for example, by performing an anisotropic etch process (e.g., a sidewall spacer etch process). In one embodiment, the blocking dielectric layer 52 may comprise a silicon oxide or an aluminum oxide layer. The charge storage layer 54 may comprise a silicon nitride layer. The tunneling dielectric layer 56 may comprise a silicon oxide layer or an "ONO" stack of silicon oxide/silicon nitride/silicon oxide layers.

A vertical semiconductor channel 60 can be formed in each of the memory openings 49 and the support openings 19 by conformal deposition of a semiconductor channel material (such as an amorphous silicon or polysilicon) having a doping of a first conductivity type. The semiconductor channel material may have a doping of a same conductivity type as the horizontal semiconductor channels (not expressly shown) located in the substrate 8. A dielectric fill material can be deposited in the remaining volumes of the memory openings 49 and the support openings 19, and can be vertically recessed to form a dielectric core 62. A semiconductor material (such as an amorphous silicon or polysilicon) having a doping of a second conductivity type can be deposited over each dielectric core 62 at a top end of each vertical semiconductor channel 60 to form a drain region 63 within each of the memory openings 49 and the support openings 19. The second conductivity type is opposite of the first conductivity type. Each contiguous combination of a memory film 50 and a vertical semiconductor channel 60 constitutes a memory stack structure 55. Each memory stack structure 55 comprises a respective vertical stack of memory elements. For example, each vertical stack of memory elements may comprise portions of the charge storage layer 54 located at the levels of the sacrificial material layers (142, 242) which are subsequently replaced with electrically conductive layers.

Generally, the memory opening fill structures 58 are formed in the memory openings 49, and support pillar structures 20 are formed in the support openings 19. Each of the memory opening fill structures 58 comprises a respective vertical semiconductor channel 60, a respective vertical stack of memory elements (e.g., portions of a memory film 50), a drain region 63 and an optional dielectric core 62. Each of the support pillar structures 20 comprises a dummy vertical semiconductor channel (which is not electrically connected to a bit line), a dummy memory film, a dummy drain region, and an optional dielectric core which comprise the same materials as those of the memory opening fill structures 58. In one embodiment, each of the support pillar structures 20 also includes at least one dielectric spacer layer (272, 273) surrounding the dummy memory film, while the memory opening fill structures 58 lack the at least one dielectric spacer layer (272, 273). In an alternative embodiment, the support pillar structures may be formed separately (i.e., before or after) from the memory opening fill structures 58. In the alternative embodiment, the support pillar structures 20 may contain only an insulating material, such as silicon oxide. Drain-select-level dielectric isolation structures 72 can be formed through an uppermost set of second sacrificial material layers 242.

Figure 16A:
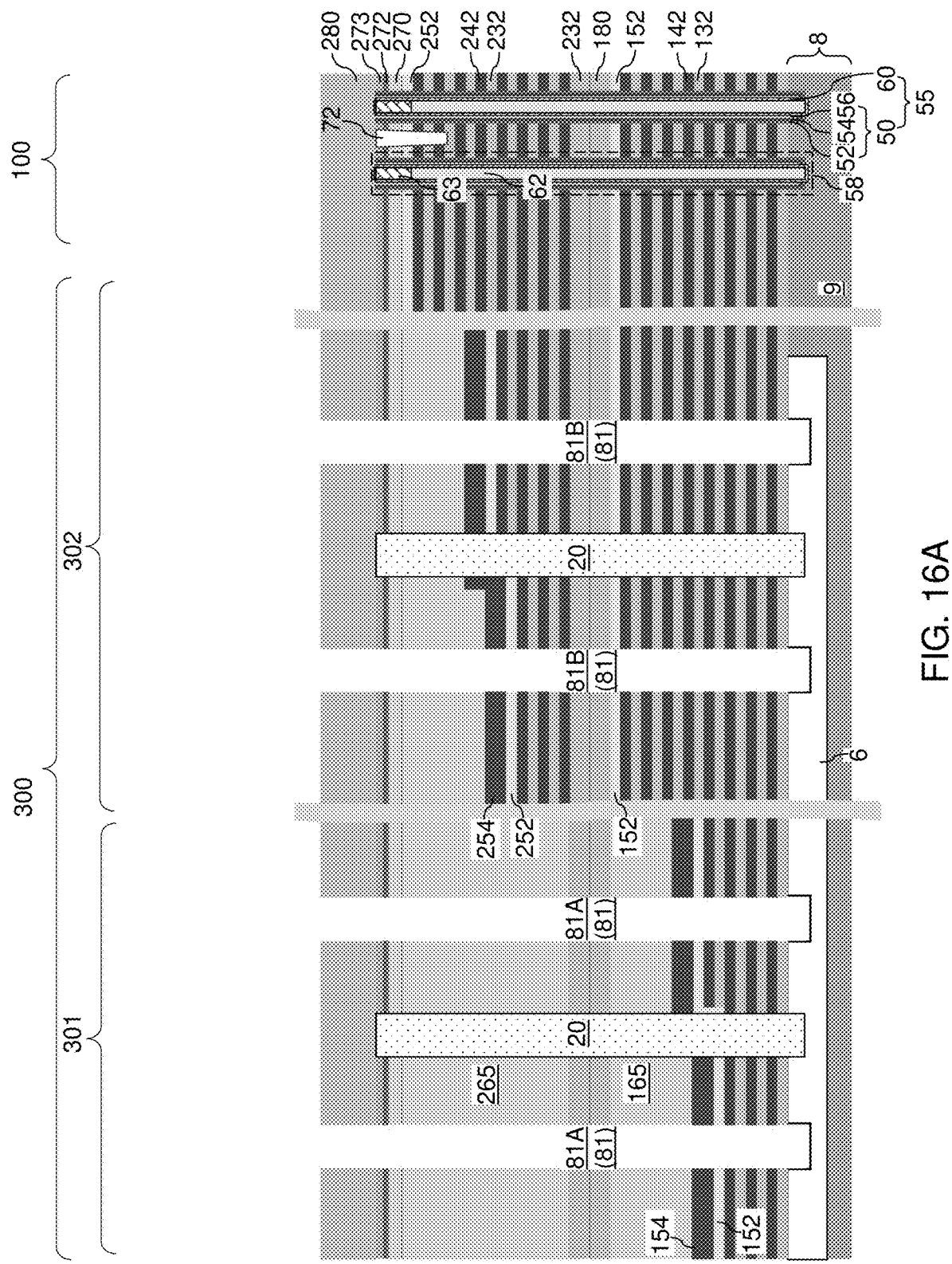
FIG. 16A is a vertical cross-sectional view of the first exemplary structure after formation of a contact-level dielectric layer and contact via cavities according to an embodiment of the present disclosure.
Figure 16B:
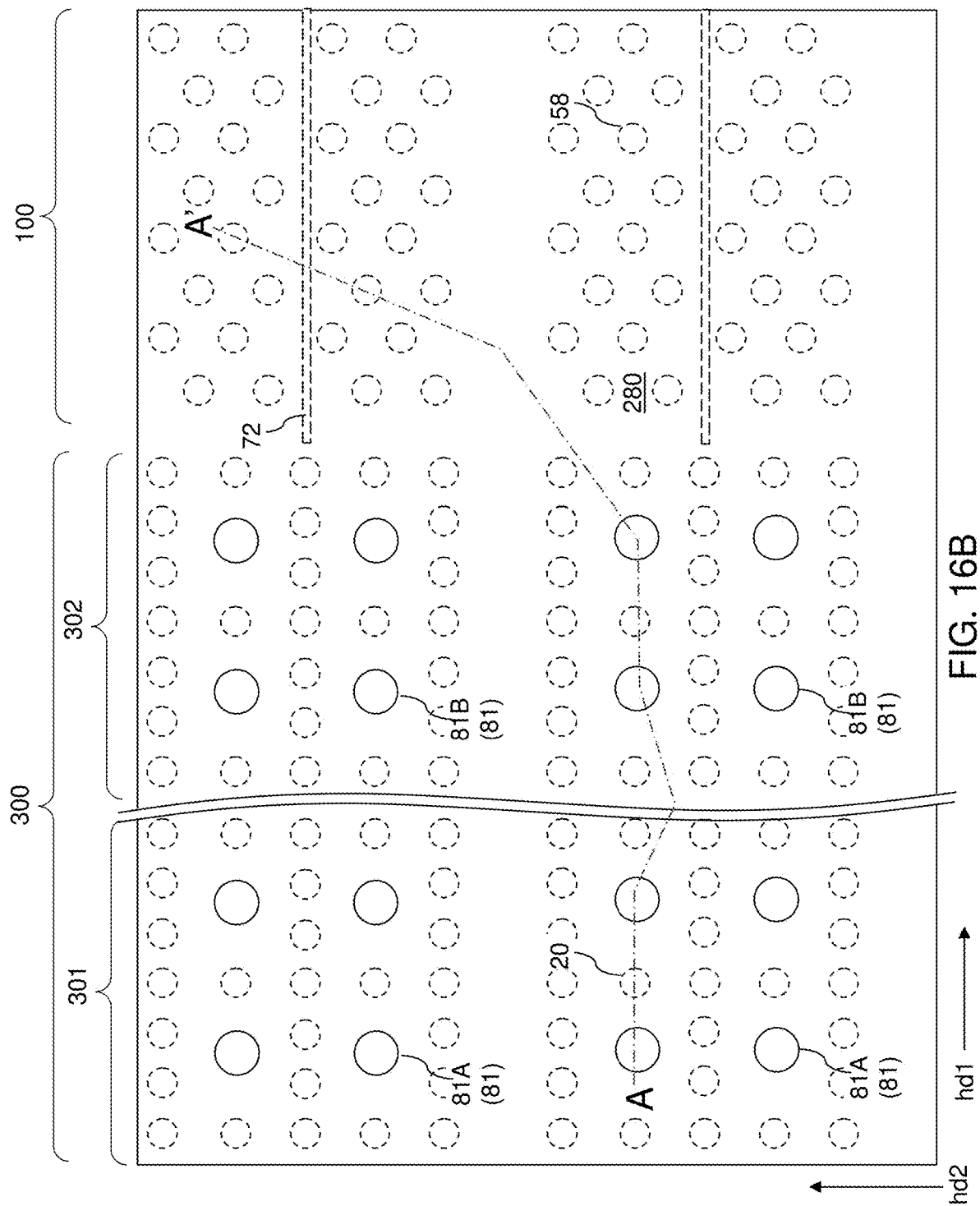
FIG. 16B is a top-down view of the first exemplary structure of FIG. 16A. The hinged vertical plane A-A' is the plane of the vertical cross-sectional view of FIG. 16A.

Referring to FIGS. 16A and 16B, a contact-level dielectric layer 280 may be optionally formed over the dielectric spacer layers (272, 273). A photoresist layer may be applied above the contact-level dielectric layer 280, and can be lithographically patterned to form openings in areas that overlie the sacrificial contact opening fill structures 38. An anisotropic etch process can be performed to transfer the pattern of the openings in the photoresist layer through the contact-level dielectric layer 280 and the dielectric spacer layers (272, 273). Cavities can be formed through the contact-level dielectric layer 280 and the dielectric spacer layers (272, 273) over each of the sacrificial contact opening fill structures 38. The sacrificial contact opening fill structures 38 can be subsequently removed selective to the materials of the contact-level dielectric layer 280, the dielectric spacer layers (272, 273), the insulating cap layer 270, the alternating stacks {(132, 142), (232, 242)}, the inter-tier dielectric layer 180, and the optional dielectric isolation layer 6 (if present). Contact via cavities 81 are formed in the volumes from which the sacrificial contact opening fill structures 38 are removed and in the volumes of the cavities that overlie the volumes from which the sacrificial contact opening fill structures 38 are removed. The photoresist layer can be subsequently removed, for example, by ashing. The contact via cavities 81 comprise first contact via cavities 81A that are formed in the first contact region 301 and extending through the first stepped dielectric material portion 165 and the first alternating stack (132, 142); and second contact via cavities 81B that are formed in the second contact region 302 and extending through the second stepped dielectric material portion 265, the first alternating stack (132, 142) and the second alternating stack (232, 242).

Figure 17:
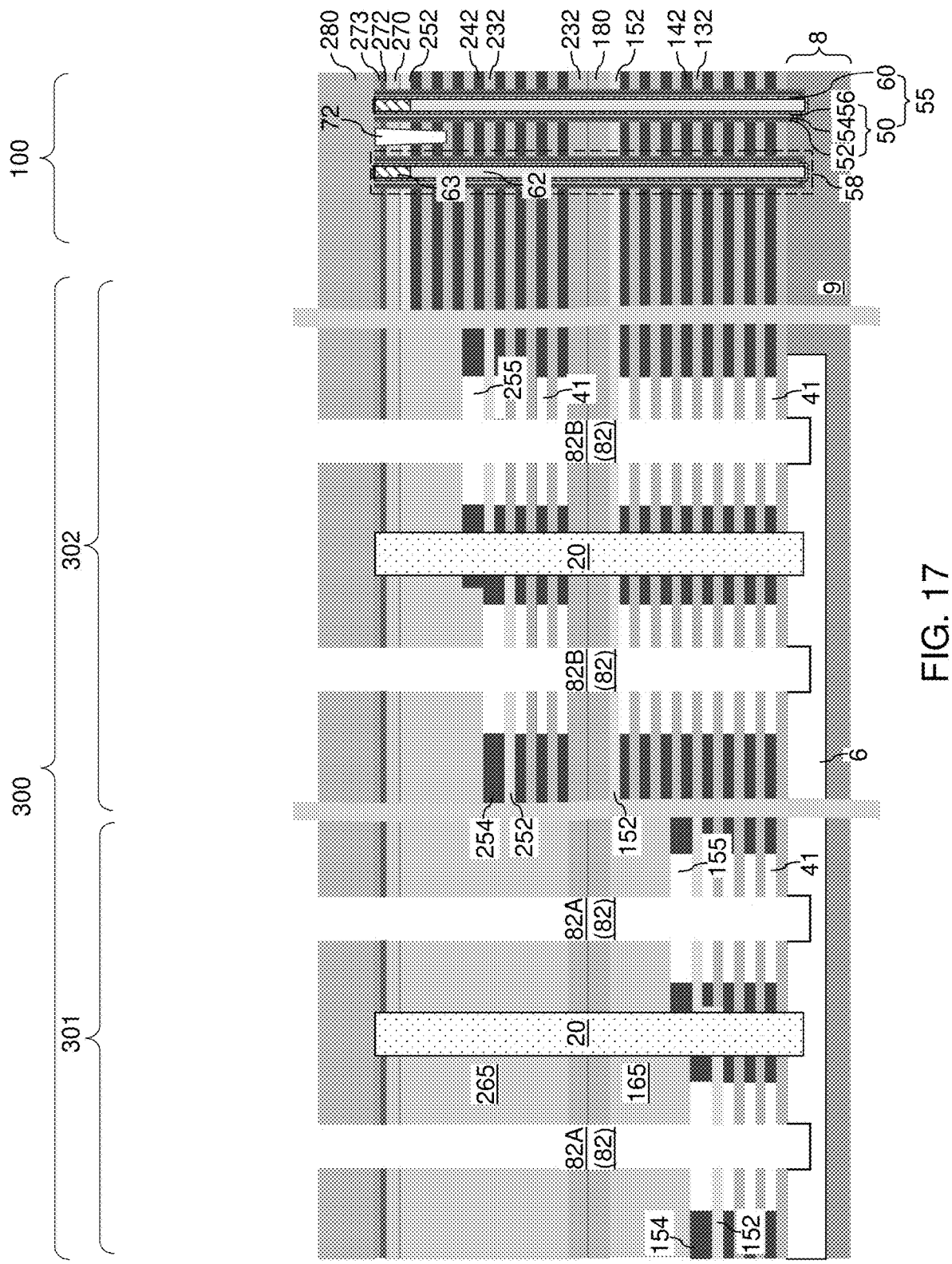
FIG. 17 is a vertical cross-sectional view of the first exemplary structure after formation of first-stage in-process finned contact via cavities according to an embodiment of the present disclosure.

Referring to FIG. 17, a first isotropic etch process can be performed to isotropically recess the material of the sacrificial material layers (142, 242), the first sacrificial liner 154, and the second sacrificial liner 254 selective to the materials of the contact-level dielectric layer 280, the dielectric spacer layers (272, 273), the insulating cap layer 270, the insulating layers (132, 232), the inter-tier dielectric layer 180, and the dielectric isolation layer 6 (if present). For example, if the sacrificial material layers (142, 242), the first sacrificial liner 154, and the second sacrificial liner 254 comprise silicon nitride, a wet etch process employing hot phosphoric acid can be performed to laterally recess the sacrificial material layers (142, 242).

Generally, sidewalls of the sacrificial material layers (142, 242), the first sacrificial liner 154, and the second sacrificial liner 254 may be laterally recessed relative to sidewalls of the insulating layers (132, 232) and the stepped dielectric material portions (165, 265) around the contact via cavities 81. Lateral recesses 41 are formed in volumes from which the materials of the sacrificial material layers (142, 242) are removed. The lateral recesses 41 may have a width of 50 nm to 250 nm, such as 100 nm to 150 nm, and may be set to obtain a desired electric field between word lines and layer contact via structures to be formed in subsequent steps, as will be described below. A first annular cavity 155 can be formed in each volume from which an annular portion of the first sacrificial liner 154 is removed around a respective one of the first contact via cavities 81A. A second annular cavity 255 can be formed in each volume from which an annular portion of the second sacrificial liner 254 is removed around a respective one of the second contact via cavities 81B.

Generally, the first isotropic etch process etches proximal portions of the first sacrificial liner 154 and the first sacrificial material layers 142 from around each first contact via cavity 81A to form a respective finned cavity, which is herein referred to as a first first-stage in-process finned contact via cavity 82A. Further, the first isotropic etch process etches proximal portions of the second sacrificial liner 154, the first sacrificial material layers 142, and the second sacrificial material layers 242 from around each second contact via cavity 81B to form a respective finned cavity, which is herein referred to as a second first-stage in-process finned contact via cavity 82B. The first first-stage in-process finned contact via cavities 82A and the second first-stage in-process finned contact via cavities 82A comprise first-stage in-process finned contact via cavities 82.

Each first first-stage in-process finned contact via cavity 82A comprises a cylindrical cavity including the volume of a respective first contact via cavity 82A, a first annular cavity 155, and at least one lateral recess 41 formed by removal of an annular portion of a respective first sacrificial material layer 142. Each second first-stage in-process finned contact via cavity 82B comprises a cylindrical cavity including the volume of a respective second contact via cavity 82B, a second annular cavity 255, and lateral recesses 41 formed by removal of annular portions of first sacrificial material layers 142 and at least one second sacrificial material layer 242.

Physically exposed, recessed surfaces of the sacrificial material layers (142, 242), the first sacrificial liner 154, and the second sacrificial liner 254 after the first isotropic etch process comprises sidewall segments that are laterally offset by a uniform lateral offset distance from sidewalls of the insulating layers (132, 232) and the stepped dielectric material portions (165, 265) around the cylindrical cavity of a respective first-stage in-process finned contact via cavity 82. The uniform lateral offset distance can be the same as the etch distance of the first isotropic etch process.

Figure 18:
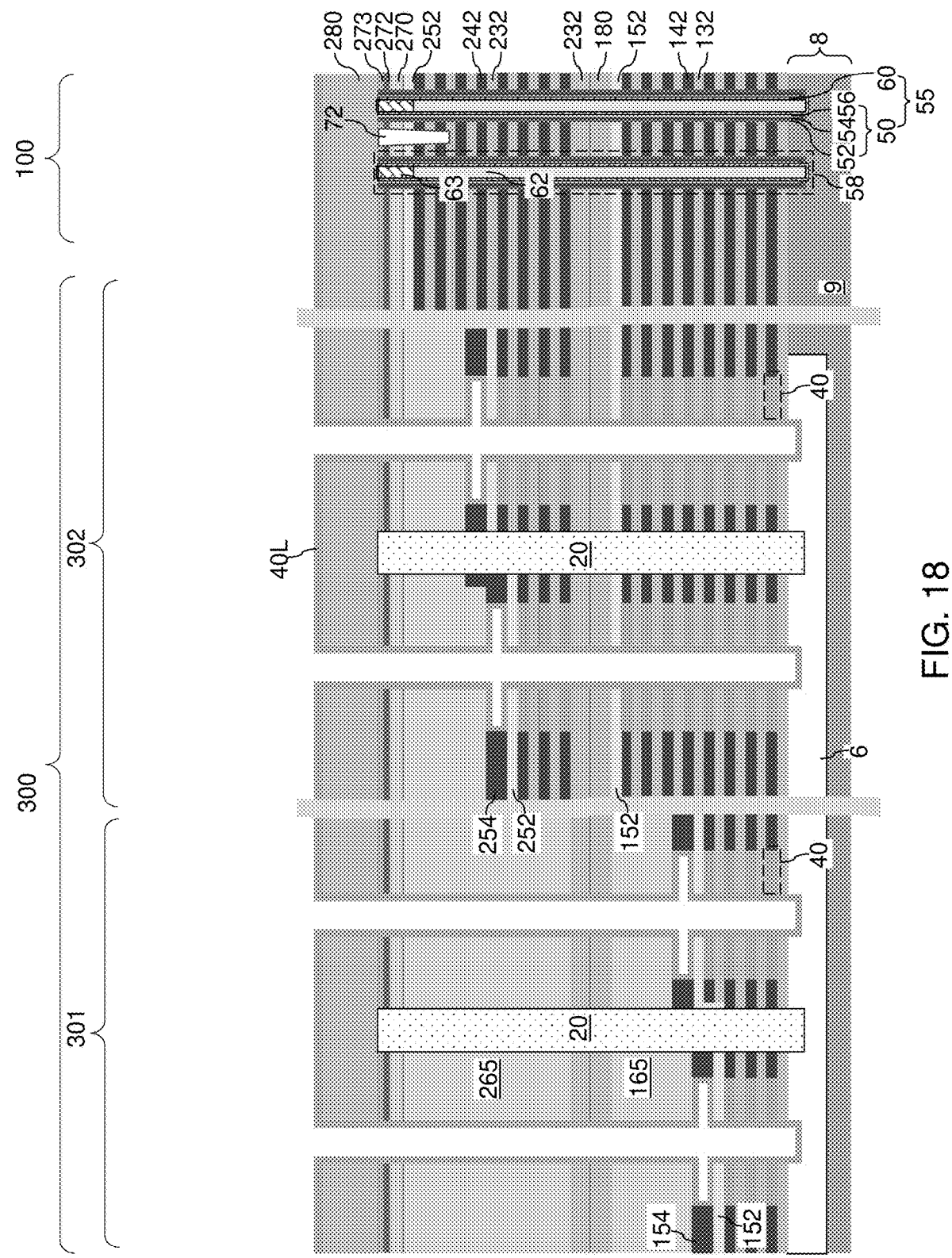
FIG. 18 is a vertical cross-sectional view of the first exemplary structure after conformally depositing a conformal dielectric material layer according to an embodiment of the present disclosure.

Referring to FIG. 18, a conformal dielectric material layer 40L can be deposited in the first-stage in-process finned contact via cavities 82 by a conformal deposition process such as a low-pressure chemical vapor deposition process or an atomic layer deposition process. The conformal dielectric material layer 40L can be conformally deposited to completely fill volumes of the lateral recesses 41 without completely filling the volumes of the first annular cavities 155 or the second annular cavities 255. The conformal dielectric material layer 40L comprises a material that is different from the materials of the sacrificial material layers (142, 242). For example, the conformal dielectric material layer 40L comprises silicon oxide.

As discussed above the first sacrificial liner 154 and the second sacrificial liner 254 have thicknesses that are greater than the thicknesses of the sacrificial material layers (142, 242). Thus, the first annular cavities 155 or the second annular cavities 255 have greater heights than the heights of the lateral recesses 41. The thickness of the conformal dielectric material layer 40L can be greater than one half of the height of the lateral recesses 41, and can be less than one half of the height of the first annular cavities 155 or the second annular cavities 255. Thus, the volumes of the first annular cavities 155 or the second annular cavities 255 can be partially filled with the conformal dielectric material layer 40L, while unfilled volumes are still present within each of the first annular cavities 155 or the second annular cavities 255.

Figure 19:
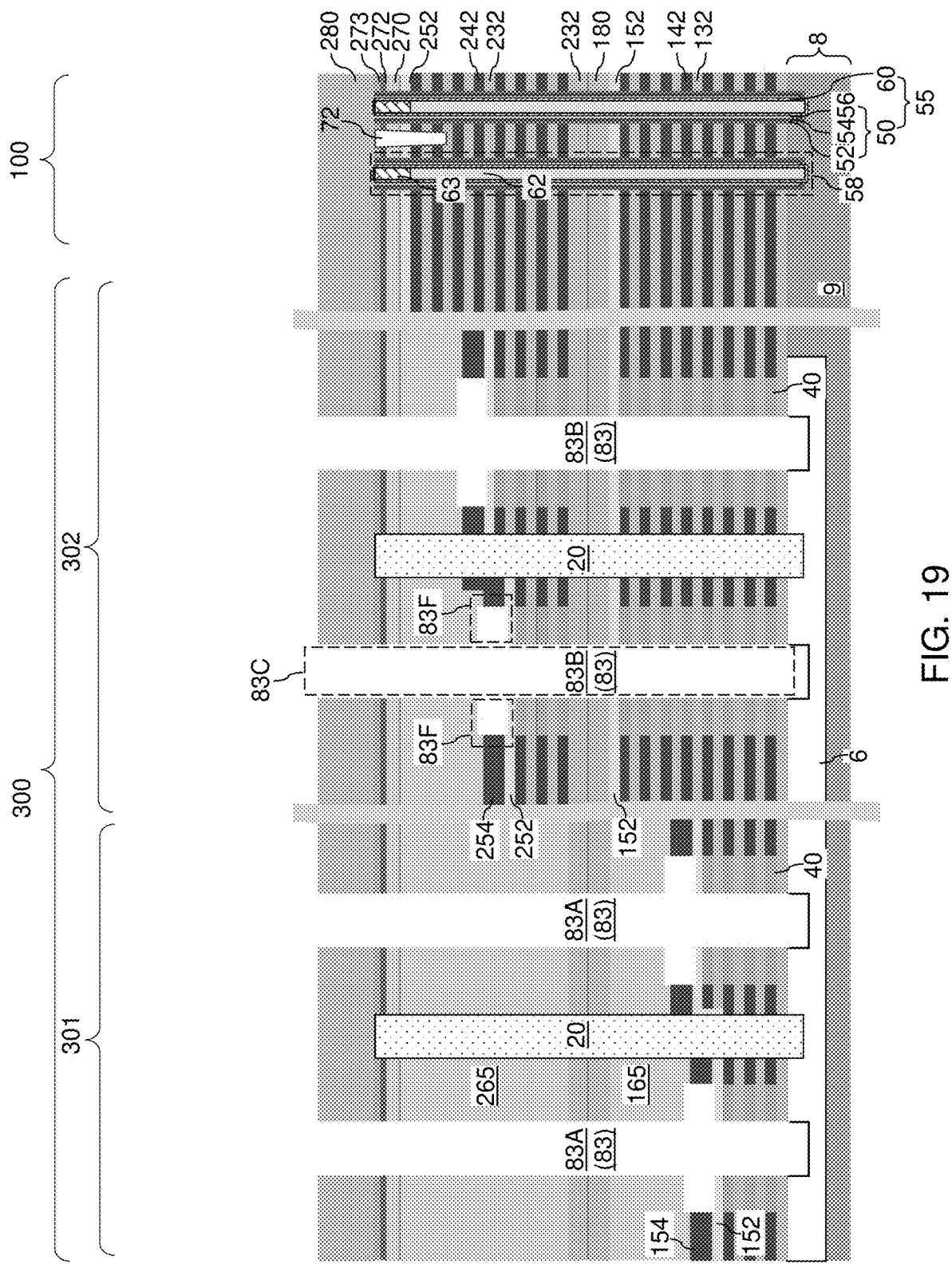
FIG. 19 is a vertical cross-sectional view of the first exemplary structure after formation of vertical stacks of annular insulating plates and according to an embodiment of the present disclosure.

Referring to FIG. 19, an isotropic recess etch process can be performed to isotropically recess the conformal dielectric material layer 40L. For example, if the conformal dielectric material layer 40L comprises silicon oxide, a wet etch process employing dilute hydrofluoric acid can be performed to isotropically recess the conformal dielectric material layer 40L around cavities through the alternating stacks {(132, 142), (232, 242)}. The duration of the isotropic etch process can be selected such that the isotropic recess etch process completely removes the material of the conformal dielectric material layer 40L from inside each of the first annular cavities 155 and the second annular cavities 255. Remaining portions of the conformal dielectric material layer 40L that fill the lateral recesses 41 (i.e., the volumes from which portions of the sacrificial material layers (142, 242) are removed) constitute annular insulating plates 40 (e.g., insulating fins).

The remaining volumes of the first-stage in-process finned contact via cavities 82 are herein referred to as second-stage in-process finned contact via cavities 83. The second stage in-process finned contact via cavities 83 may comprise first second-stage in-process finned contact via cavities 83A that extend through the first stepped dielectric material portion 165 and a portion of the first alternating stack (132, 142), and second second-stage in-process finned contact via cavities 83B that extend through the second stepped dielectric material portion 265 and a portion of the second alternating stack (232, 242). Each second-stage in-process finned contact via cavity 83 comprises a cylindrical cavity portion 83C having a cylindrical shape and vertically extending form the top surface of the contact-level dielectric layer 280 to the dielectric isolation layer 6 (if present, or alternatively to the substrate 8), and an annular cavity portion 83F that is adjoined to and laterally surrounds the cylindrical cavity portion 83C. Each annular cavity portion 83F can be bounded by an annular bottom surface of a stepped dielectric material portion (165, 265), a cylindrical sidewall of a sacrificial liner (154, 254), and an annular top surface segment of an insulating liner (152, 252).

At least one annular insulating plate 40 can be present around each second stage in-process finned contact via cavity 83. A plurality of first second-stage in-process finned contact via cavities 83A and each of the second second-stage in-process finned contact via cavities 83B can be laterally surrounded by a respective vertical stack of annular insulating plates 40. A first second-stage in-process finned contact via cavity 83A may comprise a first cylindrical surface vertically extending through the first stepped dielectric material portion 165 and the second stepped dielectric material portion 265 and having a bottom periphery that is adjoined to an inner periphery of the annular top surface of an annular cavity portion 83F, and a second cylindrical surface vertically extending through a subset of layers within the first alternating stack (132, 142) and having a top periphery that is adjoined to an annular bottom surface the annular cavity portion 83F. A second second-stage in-process finned contact via cavity 83B may comprise a first cylindrical surface vertically extending through the second stepped dielectric material portion 265 and having a bottom periphery that is adjoined to an inner periphery of the annular top surface of an annular cavity portion 83F, and a second cylindrical surface vertically extending through a subset of layers within the second alternating stack (232, 242) and each layer within the first alternating stack (132, 142) and having a top periphery that is adjoined to an annular bottom surface the annular cavity portion 83F. Generally, each second-stage in-process finned contact via cavity 83 comprises an entirety of a volume of a respective contact via cavity 81 and a volume formed by removal of a portion of a sacrificial liner (154, 254) during the first isotropic etch process.

Figure 20:
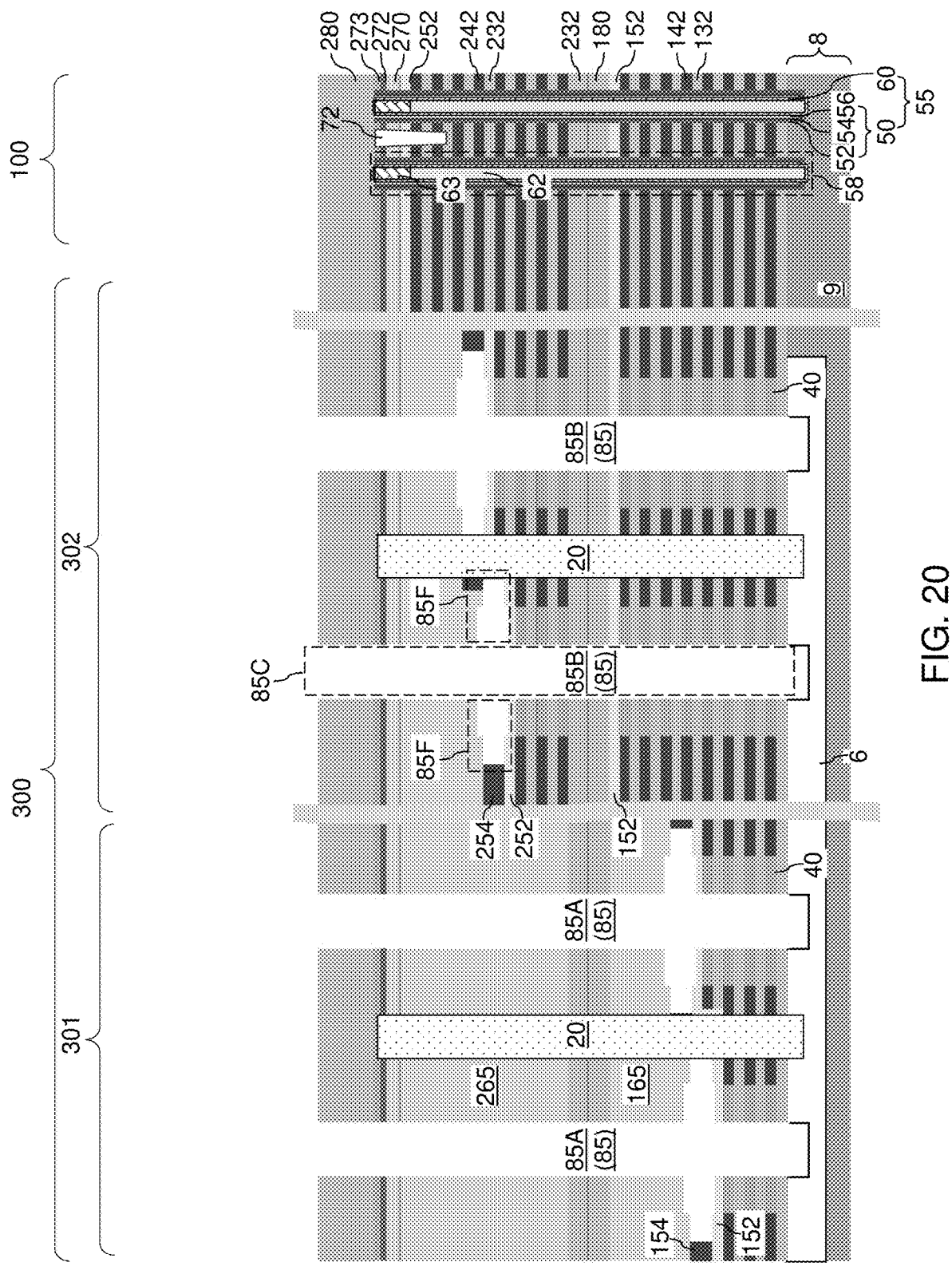
FIG. 20 is a vertical cross-sectional view of the first exemplary structure after laterally expanding the second-stage in-process finned contact via cavities to form third-stage in-process finned contact via cavities according to an embodiment of the present disclosure.

Referring to FIG. 20, a second isotropic etch process can be performed to isotropically recess the materials of the sacrificial liners (154, 254) selective to the materials of the contact-level dielectric layer 280, the dielectric spacer layers (272, 273), the insulating cap layer 270, the insulating layers (132, 232), the inter-tier dielectric layer 180, the dielectric isolation layer 6 (if present), and the annular insulating plates 40. For example, if the sacrificial liners (154, 254) comprise silicon nitride, a wet etch process employing hot phosphoric acid can be performed to isotropically recess the sacrificial liners (154, 254). The volume of each annular cavity portion 83F can be laterally expanded by the second isotropic etch process. The second-stage in-process finned contact via cavities 83, as expanded by the second isotropic etch process, are herein referred to as third-stage in-process finned contact via cavities 85.

Generally, the third-stage in-process finned contact via cavities 85 can be formed by laterally recessing sidewalls of the sacrificial liners (154, 254) around the second-stage in-process finned contact via cavities 83 by performing the second isotropic etch process. The lateral recess distance of the second isotropic etch process may be in a range from 20 nm to 300 nm, such as from 40 nm to 150 nm, although lesser and greater lateral etch distances may also be employed. The third-stage in-process finned contact via cavities 85 comprise first third-stage in-process finned contact via cavities 85A that are formed in the first contact region 301, and second third-stage in-process finned contact via cavities 85B that are formed in the second contact region 302. Each of the third-stage in-process finned contact via cavities 85 comprises a cylindrical cavity portion 85C and an annular cavity portion 85F. In one embodiment, each annular cavity portion 85F may have a stepped top surface that includes a first annular top surface segment which is an annular bottom surface segment of a stepped dielectric material portion (165, 265), a cylindrical surface segment that is adjoined to an outer periphery of the first annular top surface segment, and a second annular top surface segment which is another annular bottom surface segment of the stepped dielectric material portion (165, 265).

Figure 21:
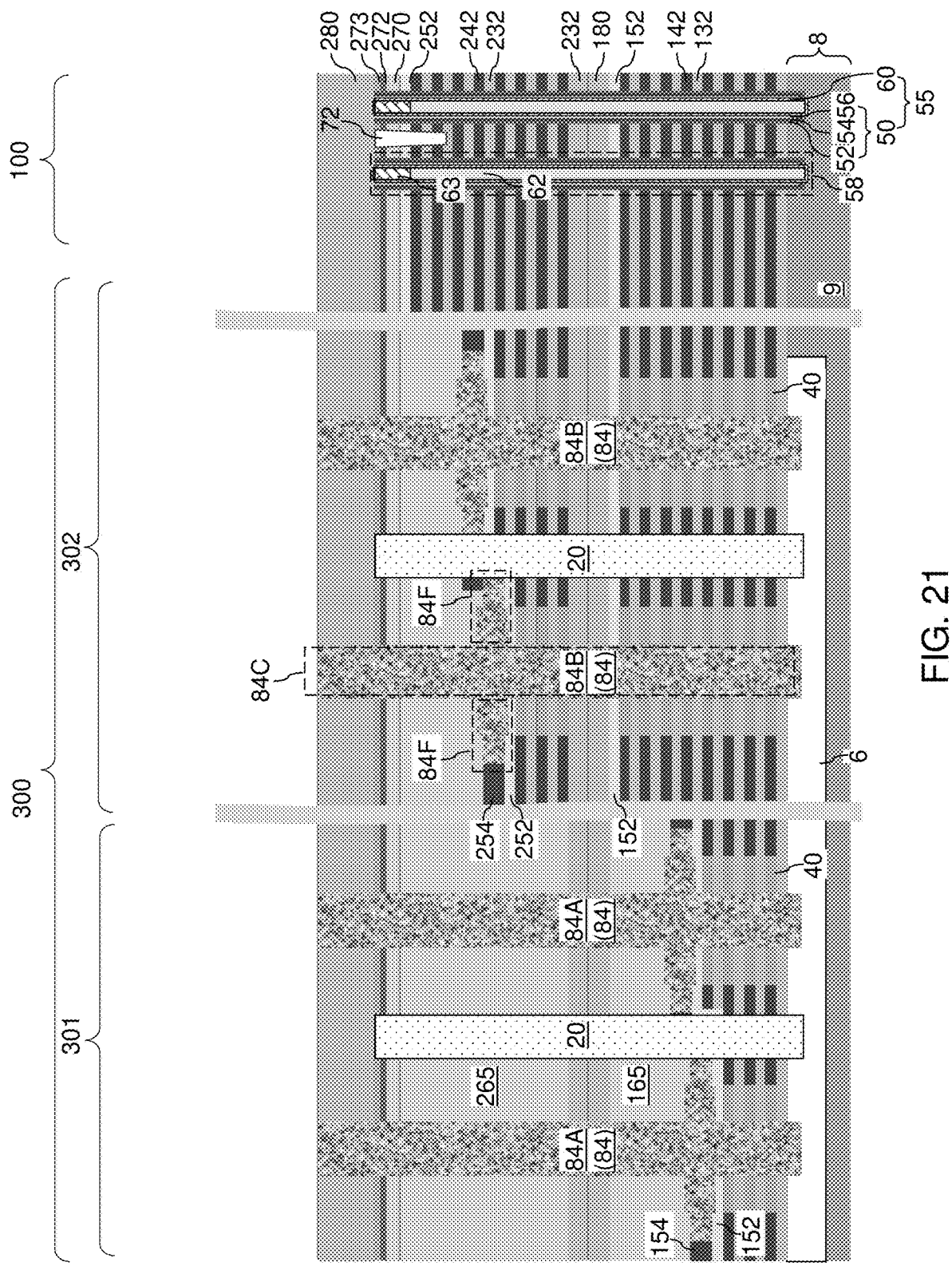
FIG. 21 is a vertical cross-sectional view of the first exemplary structure after formation of sacrificial finned cavity fill material structures according to an embodiment of the present disclosure.

Referring to FIG. 21, a sacrificial fill material can be deposited in the third-stage in-process finned contact via cavities 85. The sacrificial fill material may comprise a semiconductor material (such as amorphous silicon or polysilicon), a carbon-based material (such as amorphous carbon or diamond-like carbon), a dielectric fill material (such as borosilicate glass or organosilicate glass), or a polymer material. Optionally, a thin etch stop liner (not illustrated) may be deposited prior to filling of the third-stage in-process finned contact via cavities 85 with the sacrificial fill material. The thin etch stop liner may comprise silicon oxide or a dielectric metal oxide, and may have a thickness in a range from 2 nm to 6 nm, although lesser and greater thicknesses may also be employed.

Portions of the sacrificial fill material overlying the horizontal plane including the top surface of the contact-level dielectric layer 280 can be removed by a planarization process, which may comprise a recess etch process or a chemical mechanical polishing process. Each remaining portion of the sacrificial fill material that fills a respective one of the third-stage in-process finned contact via cavities 85 constitutes a sacrificial finned cavity fill material structure 84. Each sacrificial finned cavity fill material structure 84 comprises a respective cylindrical fill material portion 84C and at least one fin-shaped fill material portion 84F. Each fin-shaped fill material portion 84F has a respective annular shape.

Figure 22A:
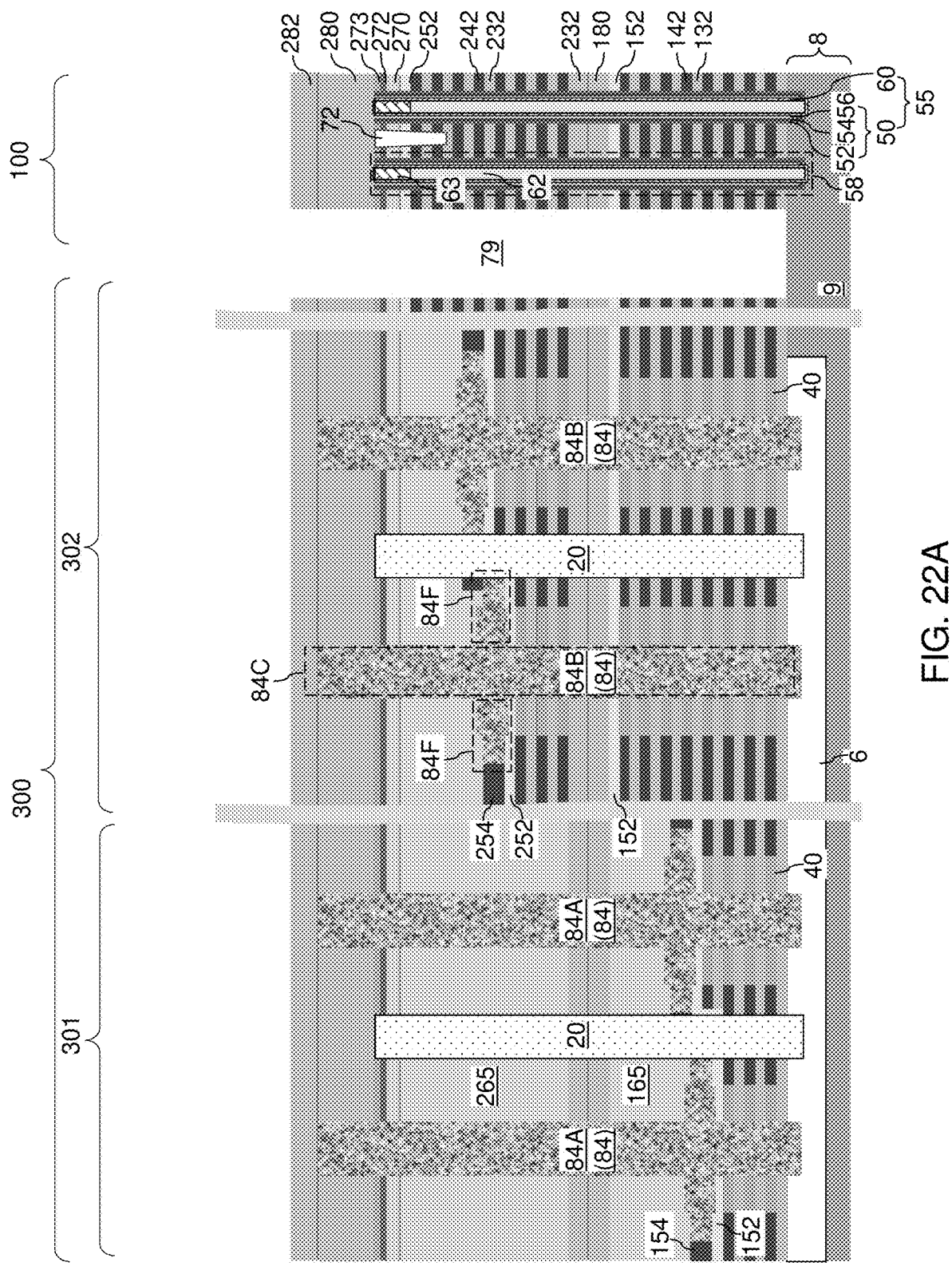
FIG. 22A is a vertical cross-sectional view of the first exemplary structure after formation of a sacrificial contact-level dielectric layer and lateral isolation trenches according to an embodiment of the present disclosure.
Figure 22B:
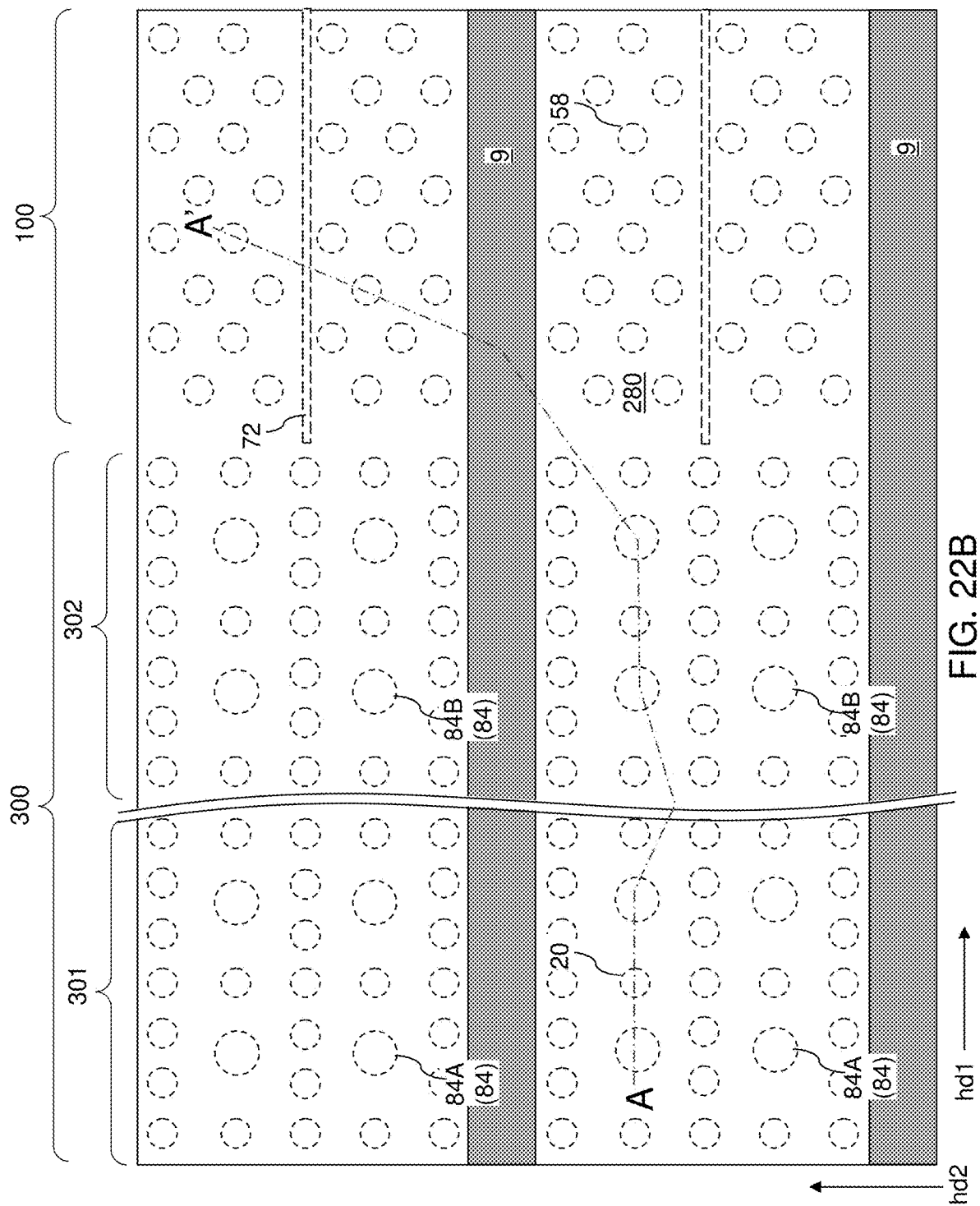
FIG. 22B is a top-down view of the first exemplary structure of FIG. 22A. The hinged vertical plane A-A' is the plane of the vertical cross-sectional view of FIG. 22A.

Referring to FIGS. 22A and 22B, a sacrificial contact-level dielectric layer 282 can be formed over the contact-level dielectric layer 280. The sacrificial contact-level dielectric layer 282 comprises a dielectric material, such as undoped silicate glass or a doped silicate glass, and may have a thickness in a range from 10 nm to 200 nm, such as from 20 nm to 100 nm, although lesser and greater thicknesses may also be employed.

A photoresist layer (not shown) can be applied over the sacrificial contact-level dielectric layer 282 and can be lithographically patterned to form openings within areas extending across the memory array region 100 and the contact region 300. The openings in the photoresist layer can laterally extend along the first horizontal direction hd1 between each neighboring cluster of memory opening fill structures 58. Lateral isolation trenches 79 can be formed by transferring the pattern in the photoresist layer through the sacrificial contact-level dielectric layer 282, the contact-level dielectric layer 280, the second alternating stack (232, 242), and the first alternating stack (132, 142), the stepped dielectric material portions (165, 265), and into the substrate 8. Portions of the sacrificial contact-level dielectric layer 282, the contact-level dielectric layer 280, the second alternating stack (232, 242), and the first alternating stack (132, 142), the stepped dielectric material portions (165, 265) that underlie the openings in the photoresist layer can be removed to form the lateral isolation trenches 79. In one embodiment, the lateral isolation trenches 79 can be formed between clusters (e.g., blocks) of memory opening fill structures 58. The clusters of the memory opening fill structures 58 can be laterally spaced apart along the second horizontal direction hd2 by the lateral isolation trenches 79. In one embodiment, the lateral isolation trenches 79 form sidewalls of a memory block.

Figure 23:
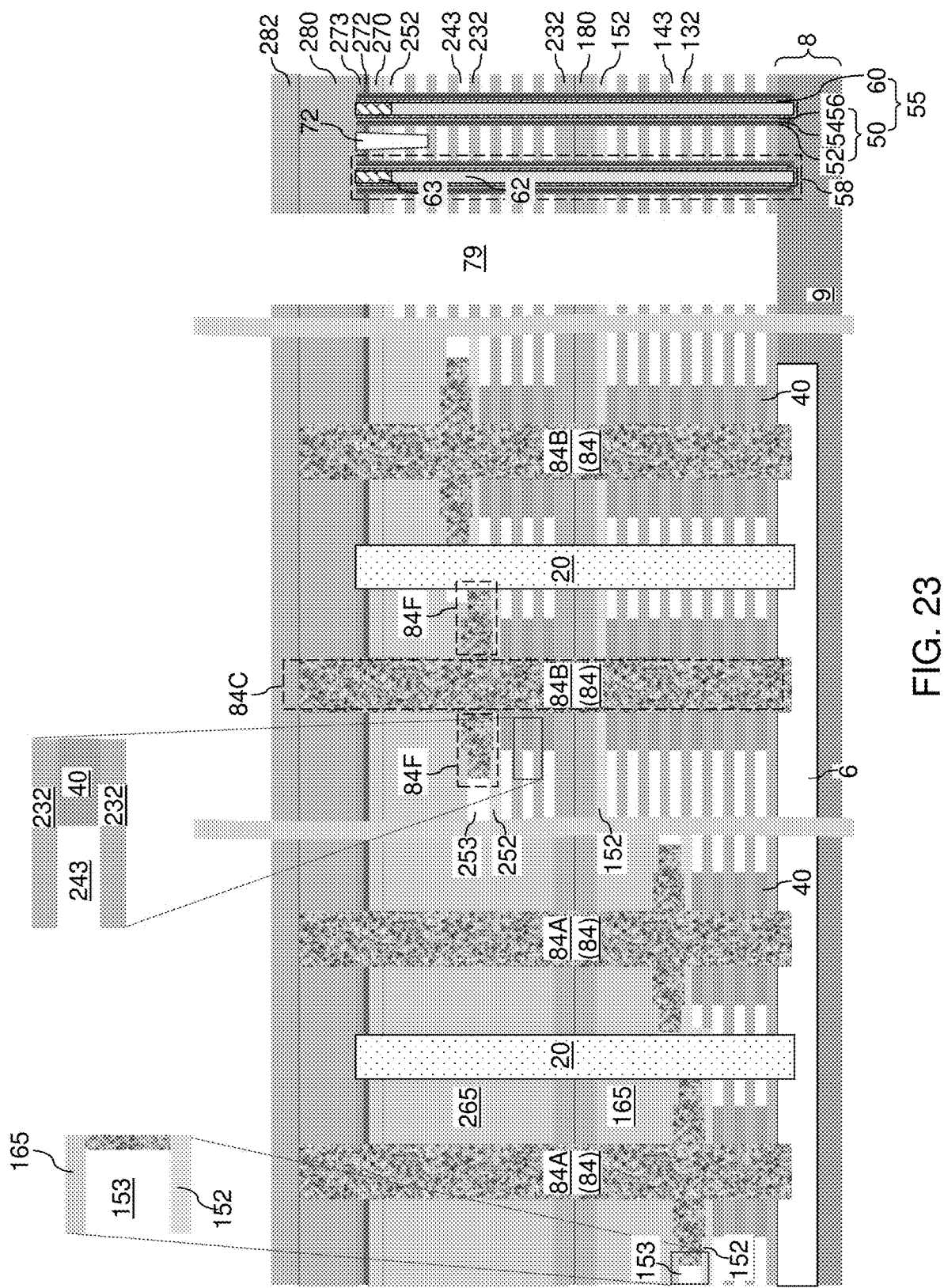
FIG. 23 is a vertical cross-sectional view of the first exemplary structure after formation of laterally-extending cavities according to an embodiment of the present disclosure.

Referring to FIG. 23, an etchant that selectively etches the materials of the first and second sacrificial material layers (142, 242), the first sacrificial liner 154, and the second sacrificial liner 254 with respect to the materials of the first and second insulating layers (132, 232), the material of the outermost layer of the memory films 50 of the memory opening fill structures 58, and the material of the at least one dielectric spacer layer (272, 273) of the support pillar structures 20 can be introduced into the lateral isolation trenches 79, for example, employing an isotropic etch process. First laterally-extending cavities 143 are formed in volumes from which the first sacrificial material layers 142 are removed. Second laterally-extending cavities 143 are formed in volumes from which the second sacrificial material layers 242 are removed. A first staircase-shaped cavity 153 is formed in the volume from which the first sacrificial liner 154 is removed. A second staircase-shaped cavity 253 is formed in the volume from which the second sacrificial liner 254 is removed.

The isotropic etch process can be a wet etch process employing a wet etch solution, or can be a gas phase (dry) etch process in which the etchant is introduced in a vapor phase into the lateral isolation trenches 79. For example, if the first and second sacrificial material layers (142, 242), the first sacrificial liner 154, and the second sacrificial liner 254 include silicon nitride, the etch process can be a wet etch process in which the first exemplary structure is immersed within a wet etch tank including phosphoric acid, which etches silicon nitride selective to silicon oxide and silicon.

The annular insulating plates 40 and the sacrificial finned cavity fill material structures 84 vertically extend from the dielectric isolation layer 6 (if present, or from the substrate 8) to the contact-level dielectric layer 280, and provide structural support for the portions of the insulating layers (132, 232) that are present in the contact region 300 and for the stepped dielectric material portions (165, 265), after removal of the sacrificial material layers. The annular insulating plates 40 can enhance structural support for the insulating layers (132, 232) and the stepped dielectric material portions (165, 265). The memory opening fill structures 58 provide structural support to the insulating layers (132, 232) in the memory array region 100.

Each of the first and second laterally-extending cavities (143, 243) can be a laterally extending cavity having a lateral dimension that is greater than the vertical extent of the cavity. In other words, the lateral dimension of each of the first and second laterally-extending cavities (143, 243) can be greater than the height of the respective laterally-extending cavity. A plurality of first laterally-extending cavities can be formed in the volumes from which the material of the first sacrificial material layers 142 is removed. A plurality of second laterally-extending cavities can be formed in the volumes from which the material of the second sacrificial material layers 242 is removed. Each of the first and second laterally-extending cavities can extend substantially parallel to the top surface of the substrate 8. A laterally-extending cavity (143, 243) can be vertically bounded by a top surface of an underlying insulating layer (132 or 232) and a bottom surface of an overlying insulating layer (132 or 232). In one embodiment, each of the first and second laterally-extending cavities (143, 243) can have a uniform height throughout.

The first staircase-shaped cavity 153 can be formed over the first staircase-shaped surfaces and the first insulating liner 152. As discussed above, the first sacrificial liner 154 can be formed by a conformal deposition process, and has a uniform thickness that is greater than the thickness of each first sacrificial material layer 142.

Thus, after removal of the first sacrificial liner 154, each horizontally-extending portion of the first staircase-shaped cavity 153 has a uniform height, which is the same as the uniform width of each vertically-extending portion of the first staircase-shaped cavity 153. Each horizontally-extending portion of the second staircase-shaped cavity 253 has a uniform height, which is the same as the uniform width of each vertically-extending portion of the second staircase-shaped cavity 253. The uniform widths and the uniform heights of the first staircase-shaped cavity 153 and the second staircase-shaped cavity 253 are greater than the thicknesses of the sacrificial material layers (142, 242).

Figure 24:
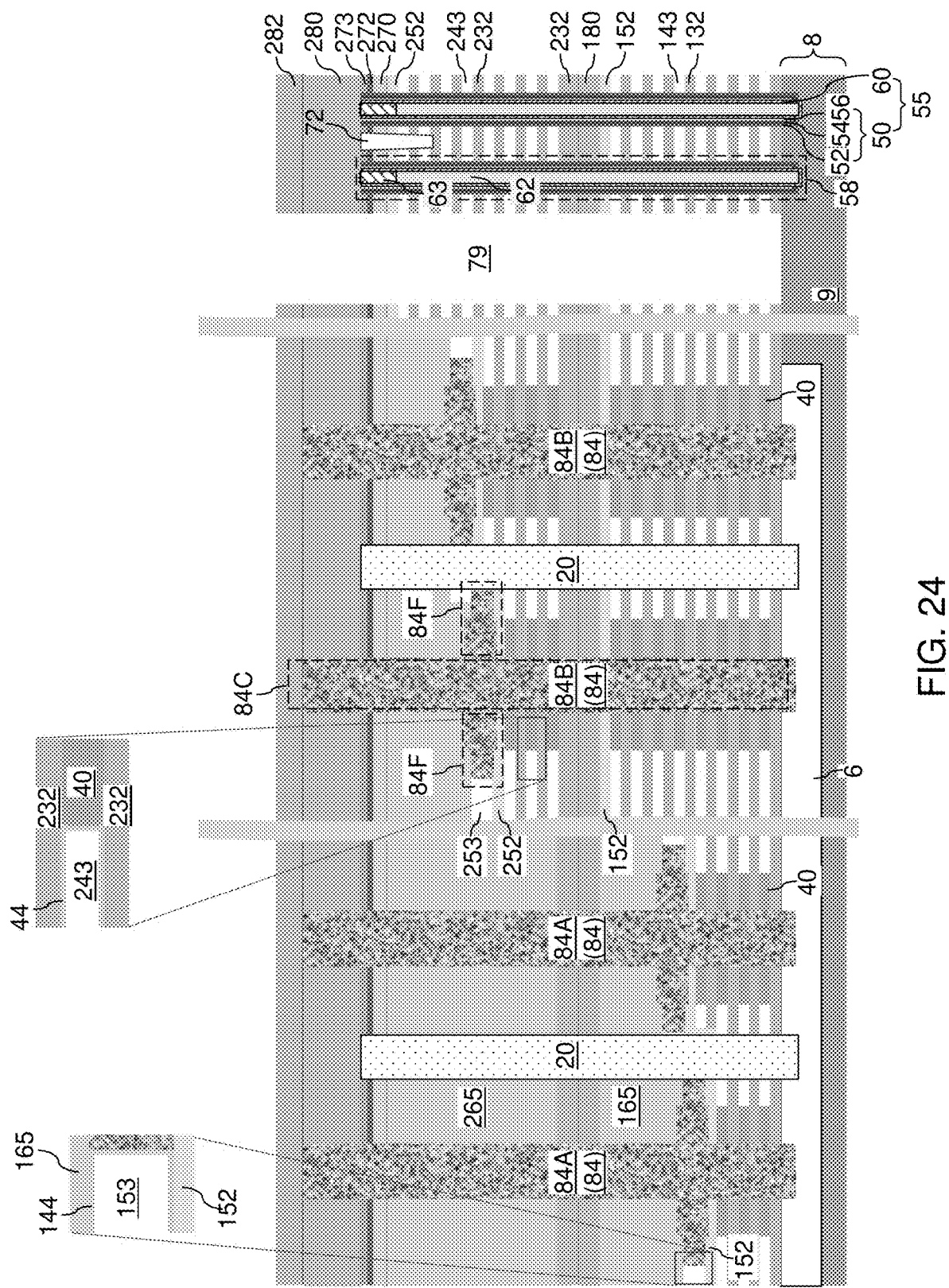
FIG. 24 is a vertical cross-sectional view of the first exemplary structure after formation of backside blocking dielectric layers and a blocking dielectric liner according to an embodiment of the present disclosure.

Referring to FIG. 24, an optional blocking dielectric material (i.e., a dielectric material that can be employed to block tunneling of electrons) can be conformally deposited in the laterally-extending cavities (143, 243), the first staircase-shaped cavity 153, and the second staircase-shaped cavity 253. In one embodiment, the blocking dielectric material comprises a dielectric metal oxide material, such as aluminum oxide, hafnium oxide, tantalum oxide, titanium oxide, yttrium oxide, etc. Alternatively or additionally, the blocking dielectric material may comprise silicon oxide, silicon nitride, silicon oxynitride, and/or silicon carbide nitride. The thickness of the blocking dielectric material may be in a range from 2 nm to 20 nm, such as from 6 nm to 12 nm, although lesser and greater thicknesses may also be employed.

A backside blocking dielectric layer 44 can be formed within each laterally-extending cavity (143, 243). A blocking dielectric liner 144 can be formed in each of the first staircase-shaped cavity 153 and the second staircase-shaped cavity 253. Each outer sidewall of the annular insulating plates 40 can be contacted by the backside blocking dielectric layer 44. Each fin-shaped fill material portion 84F of the sacrificial finned cavity fill material structures 84 can contact a respective blocking dielectric liner 144. A first blocking dielectric liner 144 that is formed within the first staircase-shaped cavity 153 may contact each of the first sacrificial finned cavity fill material structures 84A. A second blocking dielectric liner 144 that is formed within the second staircase-shaped cavity 253 may contact each of the second sacrificial finned cavity fill material structures 84B.

Figure 25:
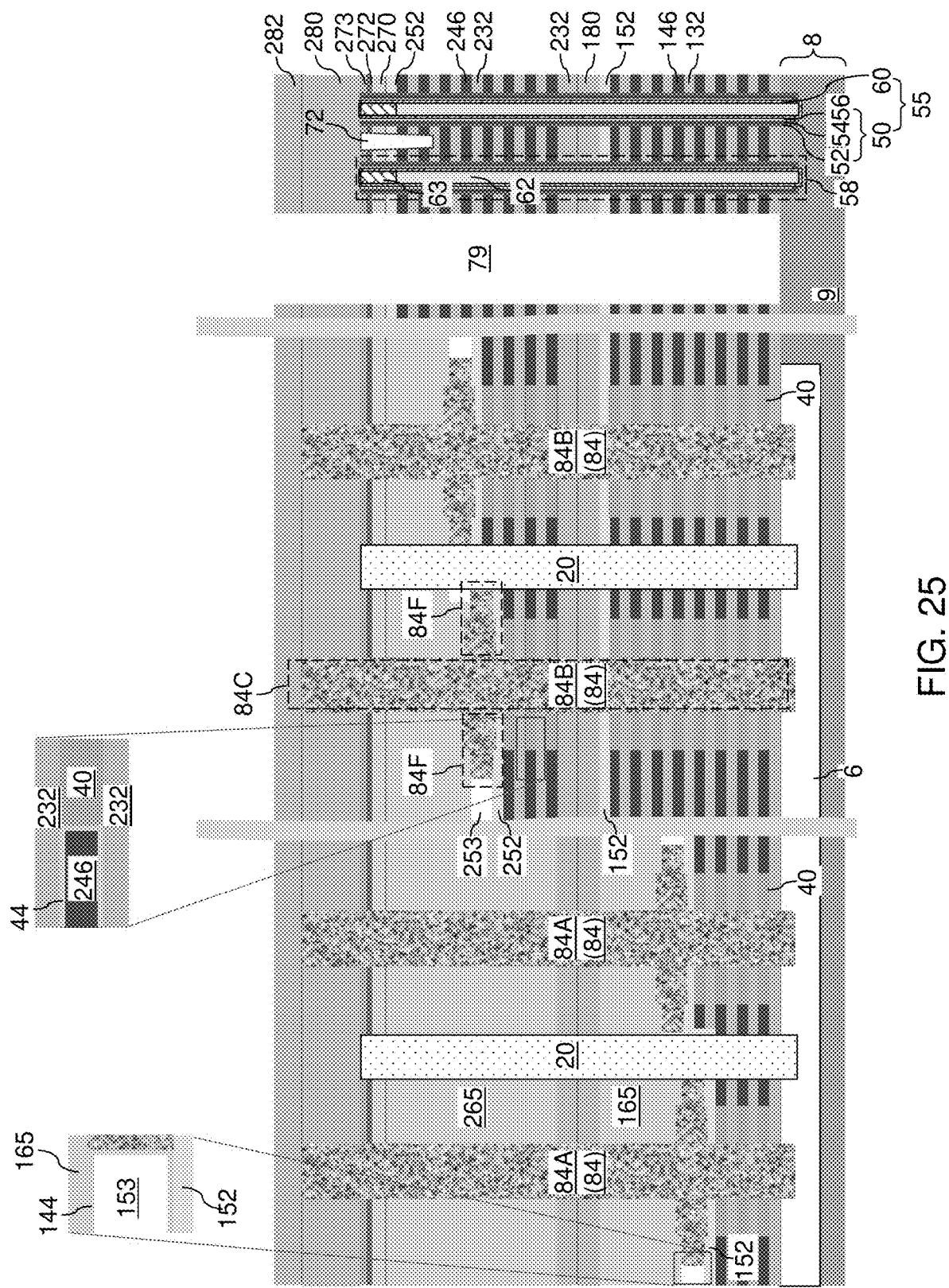
FIG. 25 is a vertical cross-sectional view of the first exemplary structure after formation of electrically conductive layers according to an embodiment of the present disclosure.

Referring to FIG. 25, at least one conductive material can be conformally deposited in the plurality of laterally-extending cavities (143, 243), in the staircase-shaped cavities (153, 253), on the sidewalls of the lateral isolation trench 79, and over the contact-level dielectric layer 280. The at least one conductive material can include at least one metallic material, i.e., an electrically conductive material that includes at least one metal element.

The at least one metallic material can be deposited by a conformal deposition method, which can be, for example, chemical vapor deposition (CVD), atomic layer deposition (ALD), electroless plating, electroplating, and/or a combination thereof. The at least one metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the laterally-extending cavities include tungsten, tungsten nitride, titanium, titanium nitride, tantalum, tantalum nitride, cobalt, and/or ruthenium. In one embodiment, the at least one metallic material may comprise a combination of a metallic barrier liner material and a metallic fill material. The metallic barrier liner material may comprise titanium nitride, tantalum nitride, tungsten nitride, molybdenum nitride, or a combination thereof. The metallic fill material may comprise titanium, tantalum, tungsten, cobalt, molybdenum, ruthenium, copper, etc. In one embodiment, the at least one metallic material can be deposited by chemical vapor deposition or atomic layer deposition.

According to an aspect of the present disclosure, the total thickness of the at least one conformally-deposited conductive material may be greater than one half of the height of the laterally-extending cavities (143, 243), and can be less than one half the height of the horizontally-extending portions of the staircase-shaped cavities (153, 253) (which is the same as the width of the vertically-extending portions of the staircase-shaped cavities (153, 253). Thus, each of the laterally-extending cavities (143, 243) can be completely filled with the at least one conformally-deposited conductive material, while the staircase-shaped cavities (153, 253) are only partially filled and contain unfilled voids are present within.

The deposited at least one conductive material can be isotropically etched back the at least one conformally-deposited conductive material from inside the staircase-shaped cavities (153, 253), from the sidewalls of lateral isolation trenches 79, and from above the sacrificial contact-level dielectric layers 282 by performing an isotropic etch back process. The etch distance of the isotropic etch back process may be the same as, or may be greater than, the total thickness of the deposited at least one conductive material. Each remaining portion of the deposited metallic material in the first laterally-extending cavities constitutes an electrically conductive layer 146. Each remaining portion of the deposited metallic material in the second laterally-extending cavities constitutes a second electrically conductive layer 246. Each electrically conductive layer (146, 246) can be a conductive line structure (which may be a word line or a select gate electrode). The at least one conductive material can be completely removed from inside the staircase-shaped cavities (153, 253), and a blocking dielectric liner 144 can be physically exposed around each staircase-shaped cavity (153, 253).

A plurality of electrically conductive layers 146 can be formed in the plurality of first laterally-extending cavities 143, and a plurality of second electrically conductive layers 246 can be formed in the plurality of second laterally-extending cavities 243. Thus, the first and second sacrificial material layers (142, 242) can be replaced with the first and second conductive material layers (146, 246), respectively. Specifically, each first sacrificial material layer 142 can be replaced with a backside blocking dielectric layer 44 and a first electrically conductive layer 146, and each second sacrificial material layer 242 can be replaced with a backside blocking dielectric layer 44 and a second electrically conductive layer 246. A backside cavity is present in the portion of each lateral isolation trench 79 that is not filled with the continuous metallic material layer.

Each of the memory opening fill structures 58 (which contains a respective memory stack structures 55) comprises a vertical stack of memory elements located at each level of the electrically conductive layers (146, 246). A subset of the middle electrically conductive layers (146, 246) can comprise the word lines for the memory elements. At least one uppermost electrically conductive layer 246 may comprise a drain side select gate electrode. At least one bottommost electrically conductive layer 146 may comprise a source side select gate electrode.

The backside blocking dielectric layers 44 can be interposed between each neighboring pair of a first electrically conductive layer 146 and a first insulating layer 132 within the first alternating stack (132, 146), and can be interposed between each neighboring pair of a second electrically conductive layer 246 and a second insulating layer 232. In one embodiment, a subset of the backside blocking dielectric layers 44 embeds a respective one of the first electrically conductive layers 146, and is interposed between the respective one of the first electrically conductive layers 146 and a respective one of the first insulating layers 132. A subset of the backside blocking dielectric layers 44 embeds a respective one of the first electrically conductive layers 246, and is interposed between the respective one of the first electrically conductive layers 246 and a respective one of the first insulating layers 232. In one embodiment, each annular insulating plate 40 may contact a sidewall of a respective one of the backside blocking dielectric layers 44. Each fin-shaped fill material portion 84F of the sacrificial finned cavity fill material structures 84 can contacts a sidewall of a respective blocking dielectric liner 144. The blocking dielectric liners 144 and the backside blocking dielectric layers 44 may have the same material composition and the same thickness. A first alternating stack of first insulating layers 132 and first electrically conductive layers 146 can be formed underneath the inter-tier dielectric layer 180, and a second alternating stack of second insulating layers 232 and second electrically conductive layers 246 can be formed over the inter-tier dielectric layer 180.

Figure 26:
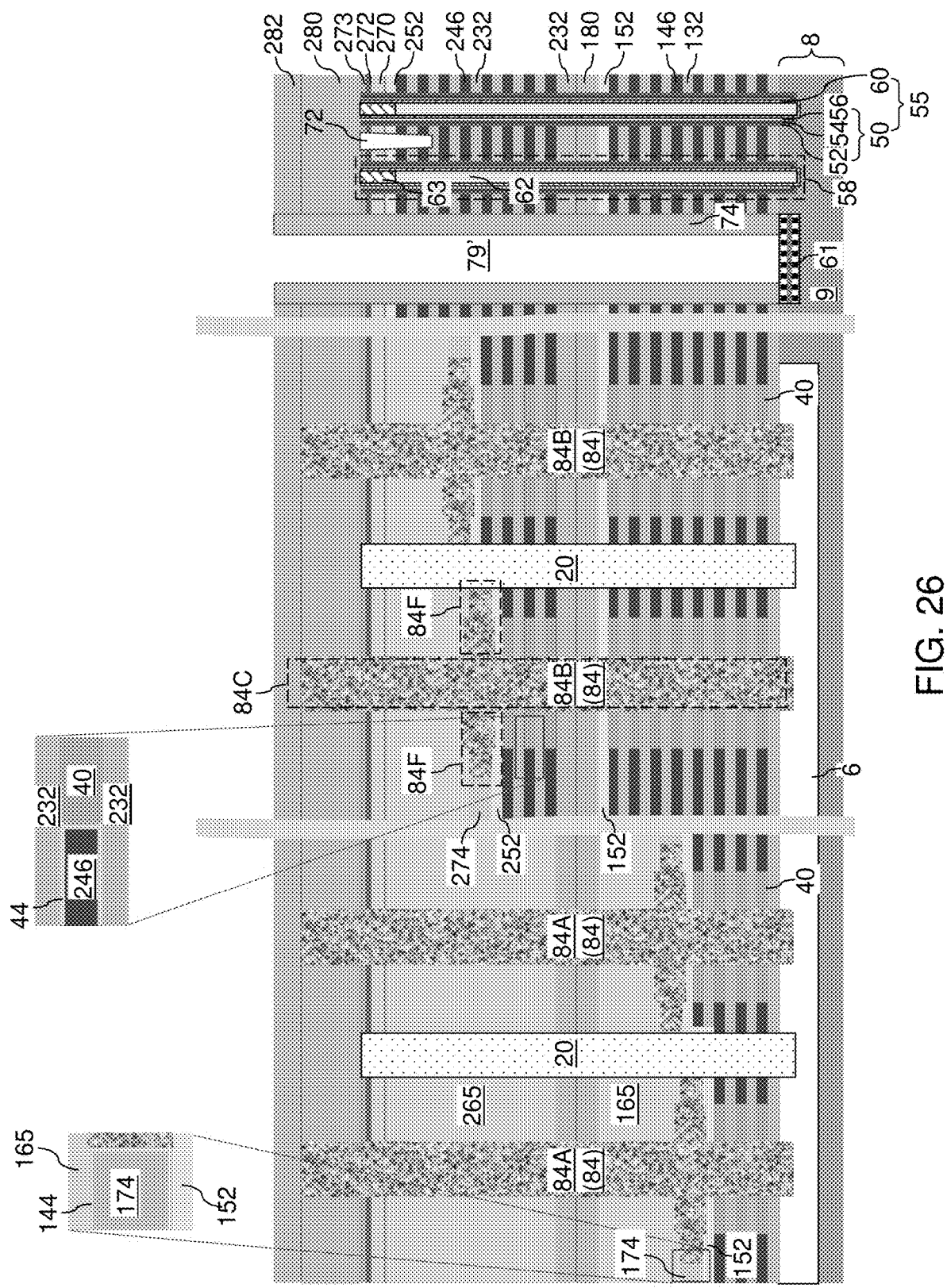
FIG. 26 is a vertical cross-sectional view of the first exemplary structure after formation of source regions and insulating spacers according to an embodiment of the present disclosure.

Referring to FIG. 26, dopants of the second conductivity type may optionally be implanted into surface portions of the semiconductor material layer 9 that underlie the lateral isolation trenches 79 to form source regions 61. The source regions 61 may comprise dopants of the second conductivity type at an atomic concentration in a range from $5.0 \times 10^{18}/\text{cm}^3$ to $2.0 \times 10^{21}/\text{cm}^3$. Alternatively, formation of the source regions 61 may be omitted at this time and instead a top source contact is formed over the bottom tips of the vertical semiconductor channels after removal of the substrate 8.

A dielectric fill material can be conformally deposited in the staircase-shaped cavities (153, 253) and in the peripheral portions of the lateral isolation trenches 79 by a conformal deposition process. The dielectric fill material may comprise silicon oxide or silicon nitride. The thickness of the deposited dielectric fill material can greater than one half of the height of the horizontally-extending portions of the staircase-shaped cavities (153, 253) so that the staircase-shaped cavities (153, 253) are filled within the dielectric fill material. The portion of the dielectric fill material that fills the first staircase-shaped cavity 153 constitutes a first dielectric fill material layer 174. The portion of the dielectric fill material that fills the second staircase-shaped cavity 253 constitutes a second dielectric fill material layers 274. A contiguous combination of the first dielectric fill material layer 174 and a blocking dielectric liner 144 constitutes a first composite dielectric layer (144, 174). A contiguous combination of the second dielectric fill material layer 274 and a blocking dielectric liner 144 constitutes a second composite dielectric layer (144, 274).

An anisotropic etch process can be performed to remove horizontally-extending portions of the dielectric fill material from above the top surface of the sacrificial contact-level dielectric layer 282 and at the bottom of each of the lateral isolation trenches 79. Each remaining tubular portion of the dielectric fill material that remains in a respective lateral isolation trenches 79 constitutes an insulating spacer 74. A laterally-extending cavity 79' can be present within each unfilled volume of the lateral isolation trenches 79 that is laterally surrounded by a respective one of the insulating spacers 74.

Generally, a first composite dielectric layer (144, 174) can be interposed between the first stepped surfaces and the first stepped dielectric material portion 165 and including a first blocking dielectric liner 144 and a first dielectric fill material layer 174 embedded within the first blocking dielectric liner 144. The first blocking dielectric liner 144 contacts each top surface of the first dielectric fill material layer 174 each bottom surface of the first dielectric fill material layer 174, and a subset of sidewalls of the first dielectric fill material layer 174. A second composite dielectric layer (144, 274) can be interposed between the second stepped surfaces and the second stepped dielectric material portion 265 and including a second blocking dielectric liner 144 and a second dielectric fill material layer 274 embedded within the blocking dielectric liner 144. The second blocking dielectric liner 144 contacts each top surface of the second dielectric fill material layer 274 each bottom surface of the second dielectric fill material layer 274, and a subset of sidewalls of the second dielectric fill material layer 274.

Each composite dielectric layer {(144, (174 or 274)} comprises horizontally-extending portions and vertically-extending potions that are interconnected over the stepped surfaces. A vertical thickness of the horizontally-extending portions and a lateral thickness of the vertically-extending portions are the same for each composite dielectric layer {(144, (174 or 274)}, and are greater than an inter-layer gap between vertically neighboring pairs of the first insulating layers 132 within the first alternating stack (132, 146), and are greater than an inter-layer gap between vertically neighboring pairs of the second insulating layers 232 within the second alternating stack (232, 246).

Figure 27:
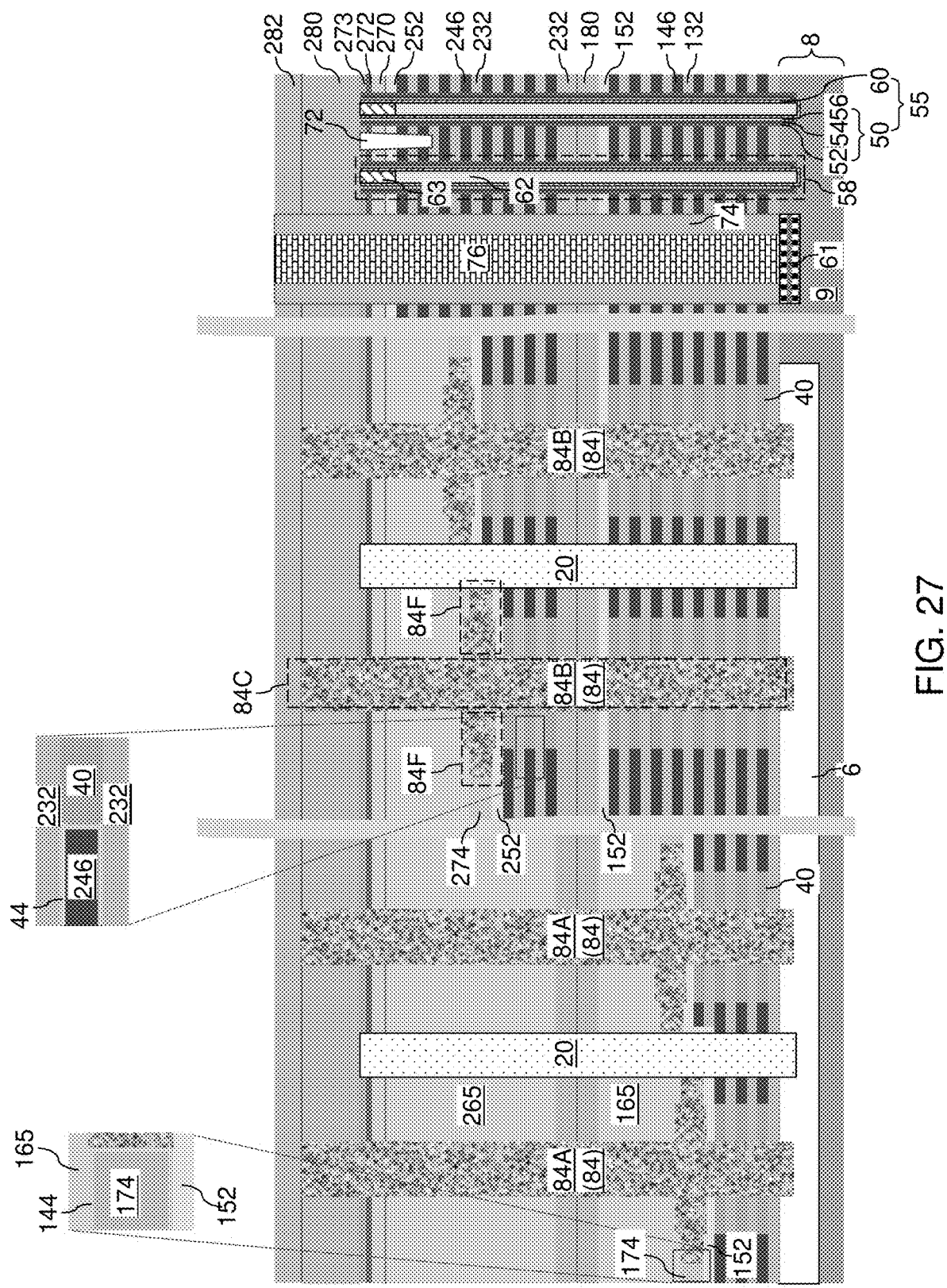
FIG. 27 is a vertical cross-sectional view of the first exemplary structure after formation of source contact via structures according to an embodiment of the present disclosure.

Referring to FIG. 27, at least one conductive fill material can optionally be deposited in the laterally-extending cavities 79'. Portions of the at least one conductive material that overlie the horizontal plane including the top surface of the sacrificial contact-level dielectric layer 282 can be removed by a planarization process such as a recess etch process and/or a chemical mechanical polishing process. Each remaining portion of the at least one conductive fill material that fills a respective laterally-extending cavity 79' constitutes a source contact via structure 76. Alternatively, if the source region 61 is omitted, then the source contact via structure 76 can also be omitted at this step. Instead, the lateral isolation trenches 79 may be completely filled with the insulating spacers 74.

Figure 28:
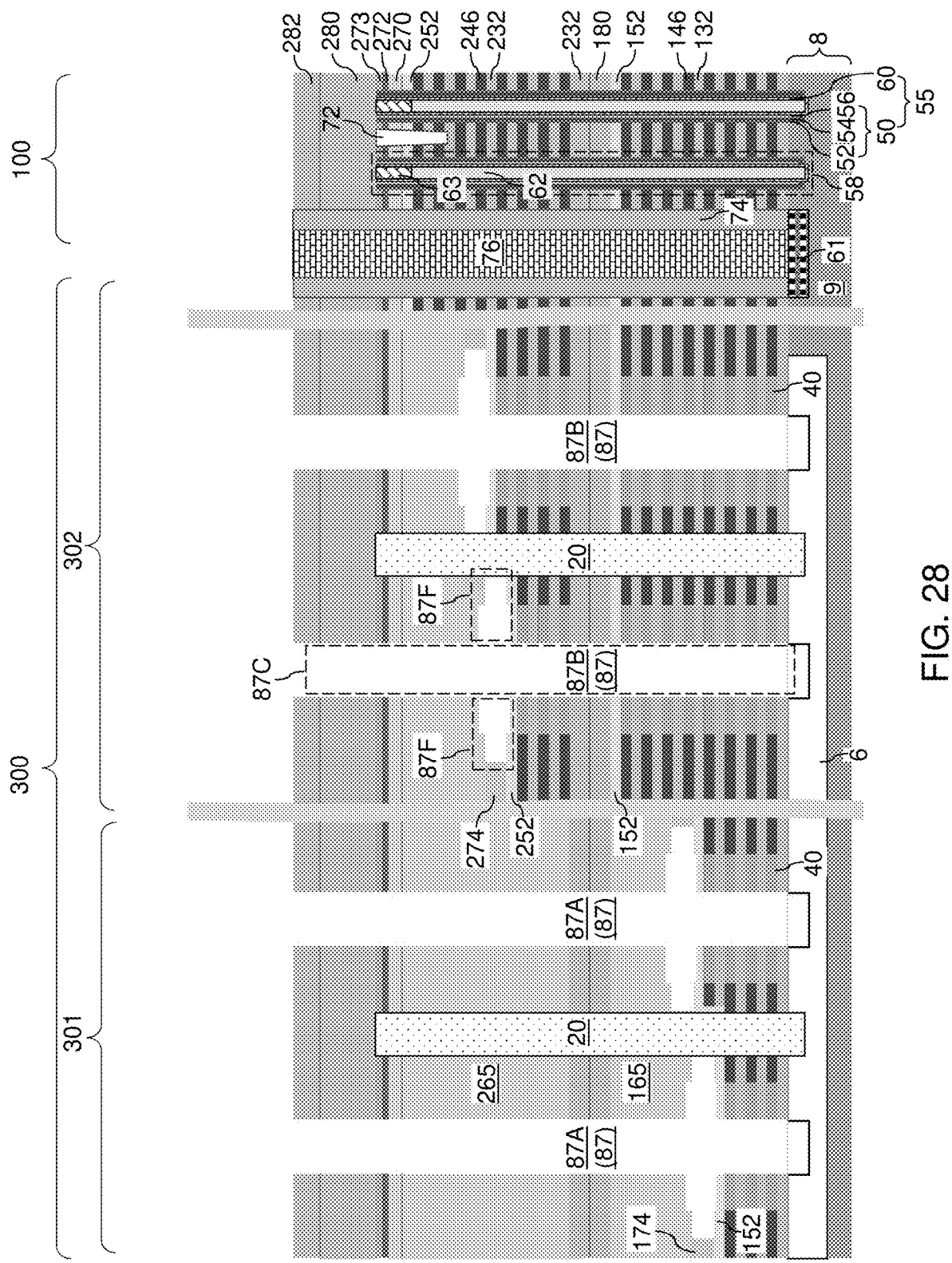
FIG. 28 is a vertical cross-sectional view of the first exemplary structure after removal of the sacrificial finned cavity fill material structures according to an embodiment of the present disclosure.

Referring to FIG. 28, a photoresist layer (not shown) can be applied over the sacrificial contact-level dielectric layer 282, and can be lithographically patterned to form openings in areas that overlap with top surfaces of the sacrificial finned cavity fill material structures 84. An anisotropic etch process can be performed to form etch through unmasked portions of the sacrificial contact-level dielectric layer 282 to physically expose top surfaces of the sacrificial finned cavity fill material structures 84. A selective etch process can be performed to remove the sacrificial fill material of the sacrificial finned cavity fill material structures 84 selective to materials of the annular insulating plates 40, the stepped dielectric material portions (165, 265), and the dielectric isolation layer 6 (if present). Finned contact via cavities 87 are formed in volumes from which the sacrificial finned cavity fill material structures 84 are removed. The finned contact via cavities 87 comprises first finned contact via cavities 87A to which the first stepped dielectric material portion 165 is exposed, and second finned contact via cavities 87B to which the first stepped dielectric material portion 165 is not exposed. Each finned contact via cavity 87 comprises a cylindrical cavity portion 87C and a fin cavity portion 87F.

Figure 29:
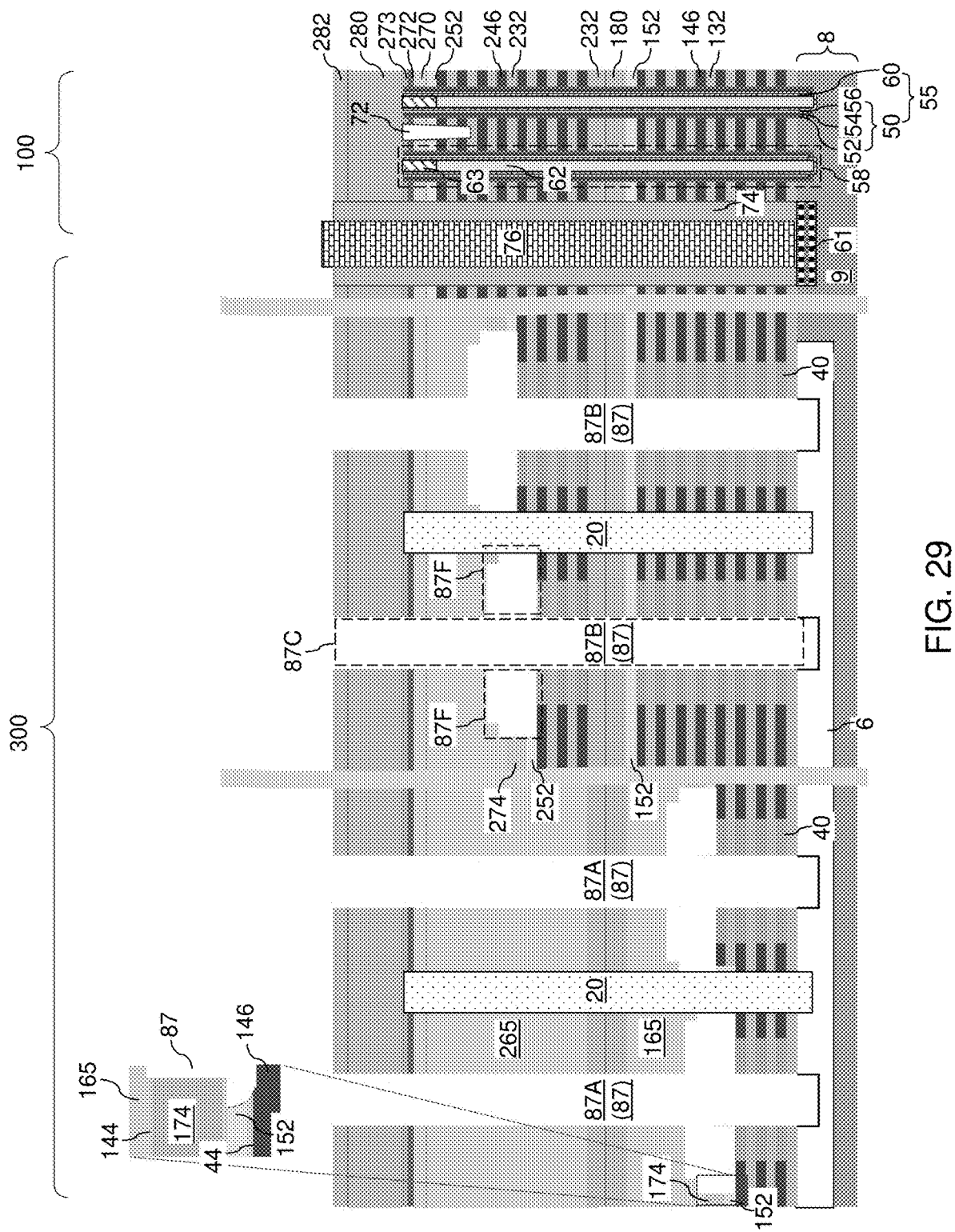
FIG. 29 is a vertical cross-sectional view of the first exemplary structure after expanding finned contact via cavities according to an embodiment of the present disclosure.

Referring to FIG. 29, an isotropic etch process can be performed to isotropically etch the material of the first insulating liner 152 and the second insulating liner 252. The duration of the isotropic etch can be selected such that the etch distance for the material of the first insulating liner 152 and the second insulating liner 252 is greater than the thicknesses of the first insulating liner 152 and the second insulating liner 252. Thus, each physically exposed portion of the first insulating liner 152 and the second insulating liner 252 that underlie the fin cavity portions 87F are etched through. Each of the electrically conductive layers (146, 246) has a respective annular top surface segment that is physically exposed to a respective one of the fin cavity portions 87F of the finned contact via cavities 87. An annular tapered concave surface of an insulating liner (152, 252) can be physically exposed around each fin cavity portion 87F. The isotropic etch for the first insulating liner 152 and the second insulating liner 252 may comprise a dilute hydrofluoric acid etch.

In case the blocking dielectric layers 44 are present, an additional isotropic etch may be performed to remove exposed portions of the respective blocking dielectric liner 144 and the respective backside blocking dielectric layer 44. If the respective blocking dielectric liner 144 and the backside blocking dielectric layer 44 comprise aluminum oxide, then the isotropic etch may comprise a hot phosphoric acid etch.

In one embodiment, surface portions of the stepped dielectric material portions (165, 265), the annular insulating plates 40, the contact-level dielectric layer 280, the inter-tier dielectric layer 180, and the dielectric isolation layer 6 can be collaterally isotropically recessed during the isotropic etch process.

Referring collectively to the processing steps of FIGS. 16A-29, a proximal portion of the first sacrificial liner 154 and a proximal portion of the first insulating liner 152 can be removed around a volume of each first contact via cavity 81A to form a first finned contact via cavity 87A, and a proximal portion of the second sacrificial liner 254 and a proximal portion of the second insulating liner 252 can be removed around a volume of each second contact via cavity 81B to form a second finned contact via cavity 87B. The annular top surface segments of the first electrically conductive layers 146 can be physically exposed by removing at least the proximal portion of the first insulating liner 152 after removal of the first sacrificial finned cavity fill material structures 84A, which forms the first finned contact via cavities 87A. The annular top surface segments of the second electrically conductive layers 246 can be physically exposed by removing at least the proximal portion of the second insulating liner 252 after removal of the second sacrificial finned cavity fill material structures 84B, which forms the second finned contact via cavities 87B.

Figure 30A:
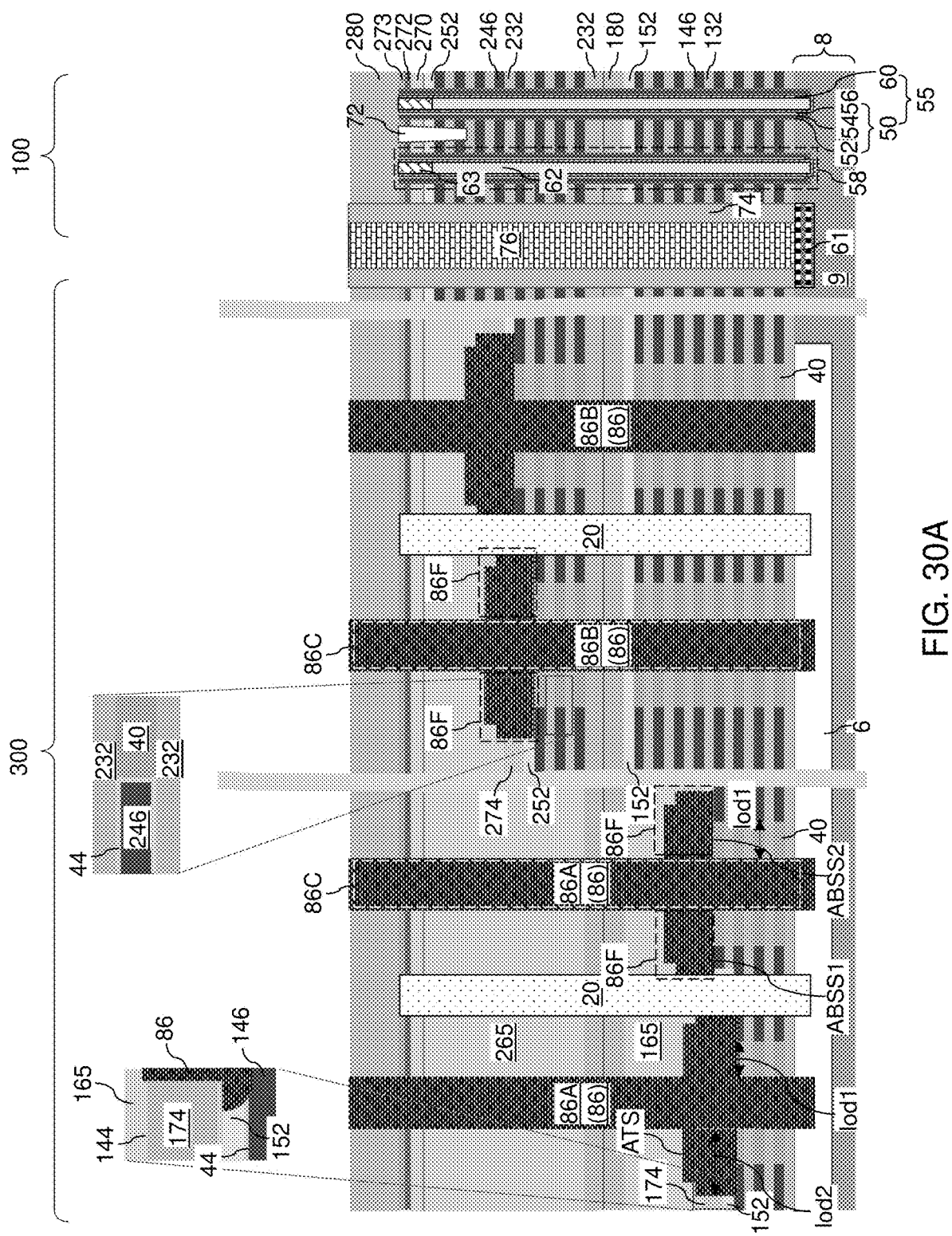
FIG. 30A is a vertical cross-sectional view of the first exemplary structure after formation of contact via structures according to an embodiment of the present disclosure.
Figure 30B:
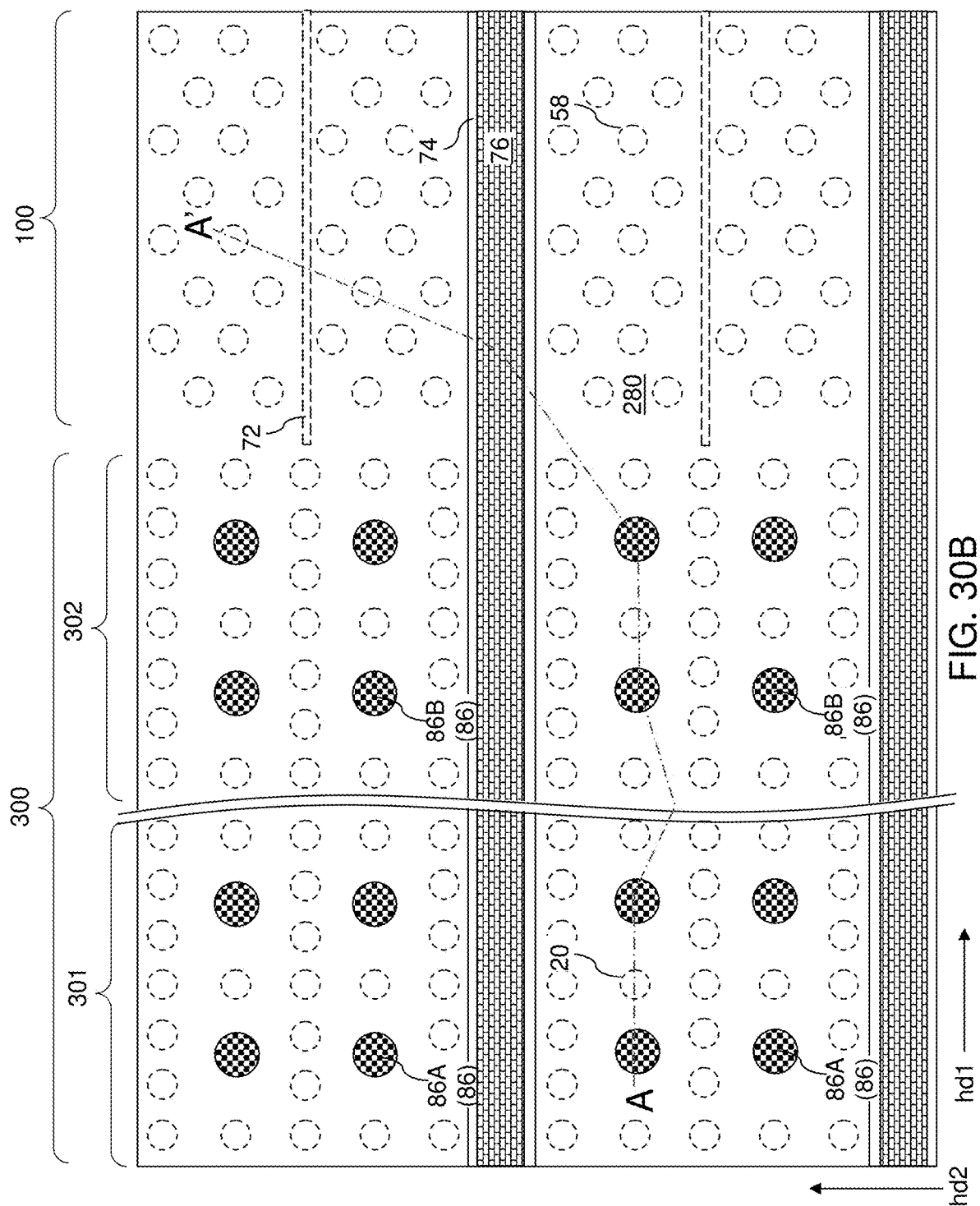
FIG. 30B is a top-down view of the first exemplary structure of FIG. 30A. The hinged vertical plane A-A' is the plane of the vertical cross-sectional view of FIG. 30A.

Referring to FIGS. 30A and 30B, at least one conductive material, such as at least one metallic material, can be deposited in the finned contact via cavities 87. The at least one conductive material may comprise a combination of a metallic barrier liner material (such as TiN, TaN, WN, MoN, or a combination thereof) and a metallic fill material (such as W, Ti, Ta, Mo, Ru, Co, Cu, etc.). Excess portions of the at least one conductive material can be removed from above the horizontal plane including the top surface of the contact-level dielectric layer 280 by a planarization process such as a chemical mechanical polishing process. In one embodiment, the sacrificial contact-level dielectric layer 282 and portions of the insulating spacers 74 and the source contact via structures 76 that overlie the horizontal plane including the top surface of the contact-level dielectric layer 280 can be collaterally removed during the planarization process. Each remaining portion of the at least one conductive material that fills a respective finned contact via cavity 87 constitutes a contact via structure, which is herein referred to as a layer contact via structure 86.

The layer contact via structures 86 comprise first contact via structures 86A that are formed in the first finned contact via cavities 87A and second contact via structures 86B that are formed in the second finned contact via cavities 87B. Each of the layer contact via structures 86 vertically extends at least from a bottommost surface of the first alternating stack (132, 146) to a horizontal plane located at or above a top surface of the memory opening fill structure 58. Each layer contact via structure 86 comprises a respective conductive pillar portion 86C and a respective conductive fin portion 86F that laterally protrudes from the respective conductive pillar portion 86C and has a first annular bottom surface segment ABSS1 contacting an annular top surface segment of one of the electrically conductive layers (146, 246). Each conductive fin portion 86F may also have a second annular bottom surface segment ABSS2 contacting an annular top surface segment of an annular insulating plate 40, which may be a topmost annular insulating plate 40 within a vertical stack of annular insulating plates 40 underlying the respective conductive fin portion 86F. Segments ABSS1 and ABSS2 may be horizontally co-planar. Each conductive fin portion 86F may have an annular top surface ATS that contacts an annular bottom surface segment of one of the stepped dielectric material portions (165, 265).

A plurality of first contact via structures 86A vertically extends through the first stepped dielectric material portion 165 and the second stepped dielectric material portion 265. A plurality of second contact via structures 86B vertically extends through the second stepped dielectric material portion 265. In one embodiment, each annular insulating plate 40 within a vertical stack of annular insulating plates 40 has a lateral width which laterally offsets a respective electrically conductive layer (146, 246) from the conductive pillar portion 86C by a uniform lateral offset distance, which is herein referred to as a first lateral offset distance lod1. Each conductive fin portion 86F of a layer contact via structure 86 may have an outer sidewall that is laterally spaced from a sidewall of the conductive pillar portion 86C of the layer contact via structure 86 by a second lateral offset distance lod2.

Referring collectively to FIGS. 1-30B and according to various embodiments of the present disclosure, a memory device comprises: a first alternating stack (132, 146) of first insulating layers 132 and first electrically conductive layers 146, wherein the first alternating stack (132, 146) comprises first stepped surfaces in a contact region 300; a first stepped dielectric material portion 165 overlying the first stepped surfaces of the first alternating stack (132, 146); a memory opening 49 vertically extending at least through each layer within the first alternating stack (132, 146); a memory opening fill structure 58 located in the memory opening 49 and comprising a vertical semiconductor channel 60 and a vertical stack of memory elements (e.g., portions of the memory film 50); and a first contact via structure 86A vertically extending at least from a bottommost surface of the first alternating stack (132, 146), through the first stepped dielectric material portion 165, and to a horizontal plane located at or above a top surface of the memory opening fill structure 58. The first contact via structure 86A comprises a conductive pillar portion 86C and a conductive fin portion 86F that laterally protrudes from the conductive pillar portion 86C and having a first annular bottom surface segment ABSS1 contacting an annular top surface segment of one of the first electrically conductive layers 146.

In one embodiment, the memory device comprises a vertical stack of annular insulating plates 40 laterally surrounding and contacting the conductive pillar portion 86C and underlying the conductive fin portion 86F. The annular insulating plates 40 isolate the electrically conductive layers (146, 246) which underlie the conductive fin portion 86F from contacting the conductive pillar portion 86C. This prevents a short circuit of the electrically conductive layers located in different vertical levels by the conductive pillar portion 86C.

In one embodiment, a topmost annular insulating plate 40 within the vertical stack of annular insulating plates 40 is in contact with a second annular bottom surface segment of the conductive fin portion 86F.

In one embodiment, the memory device comprises backside blocking dielectric layers 44, wherein each of the backside blocking dielectric layers 44 embeds a respective one of the first electrically conductive layers 146 and is interposed between the respective one of the first electrically conductive layers 146 and a respective one of the first insulating layers 132. In one embodiment, each annular insulating plate 40 within the vertical stack of annular insulating plates 40 contacts a sidewall of a respective one of the backside blocking dielectric layers 44.

In one embodiment, each annular insulating plate 40 within the vertical stack of annular insulating plates 40 has a lateral width which laterally offsets a respective one of the electrically conductive layers (146, 246) located at a same vertical level (as the plate 40) from the conductive pillar portion 86C by a uniform lateral offset distance lod1.

In one embodiment, the conductive fin portion 86F comprises an annular top surface in contact with an annular planar surface segment of the first stepped dielectric material portion 165. In one embodiment, the conductive pillar portion 86C comprises: a first cylindrical surface vertically extending through the first stepped dielectric material portion 165 and having a bottom periphery that is adjoined to an inner periphery of the annular top surface of the conductive fin portion 86F; and a second cylindrical surface vertically extending through a subset of layers within the first alternating stack (132, 146) and having a top periphery that is adjoined to a bottom surface of the conductive fin portion 86F.

In one embodiment, the memory device comprises a composite dielectric layer (144, 174) interposed between the first stepped surfaces and the first stepped dielectric material portion 165 and including a blocking dielectric liner 144 and a dielectric fill material layer 174 embedded within the blocking dielectric liner 144, wherein the blocking dielectric liner 144 contacts each top surface of the dielectric fill material layer 174 and each bottom surface of the dielectric fill material layer 174. In one embodiment, the conductive fin portion 86F contacts a sidewall of the dielectric fill material layer 174.

In one embodiment, the memory device further comprises backside blocking dielectric layers 44 interposed between each neighboring pair of a first electrically conductive layer 146 and a first insulating layer 132 within the first alternating stack (132, 146) and having a same material composition and a same thickness as the blocking dielectric liner 144. In one embodiment, the composite dielectric layer (144, 174) comprises horizontally-extending portions and vertically-extending potions that are interconnected over the first stepped surfaces; and a vertical thickness of the horizontally-extending portions and a lateral thickness of the vertically-extending portions are the same, and are greater than an inter-layer gap between vertically neighboring pairs of the first insulating layers 132 within the first alternating stack (132, 146).

In one embodiment, the memory device further comprises: a second alternating stack (232, 246) of second insulating layers 232 and second electrically conductive layers 246 located the first alternating stack (132, 146), wherein the second alternating stack (232, 246) comprises second stepped surfaces in the contact region 300, and wherein the memory opening fill structure 58 vertically extends through the second alternating stack (232, 246); a second stepped dielectric material portion 265 overlying the second stepped surfaces of the second alternating stack (232, 246); a second contact via structure 86B vertically extending at least from the bottommost surface of the first alternating stack (132, 146) to the horizontal plane located at, or above, the top surface of the memory opening fill structure 58 and comprising an additional conductive pillar portion 86C and an additional conductive fin portion 86F that laterally protrudes from the additional conductive pillar portion 86C and having an additional annular bottom surface segment contacting an annular top surface segment of one of the second electrically conductive layers 246.

The method described above provides a more precise method of forming the contact via structures 86. Thus, formation of contact via cavities 87 which penetrate through or fail to reach the respective electrically conductive layer (146, 246) due to etching non-uniformities can be avoided. The conductive fin portions 86F of the layer contact via structures 86 provide reliable electrical contact between the electrically conductive layers (146, 246) and the layer contact via structures 86, which can be employed as word line contact via structures.

Figure 31:
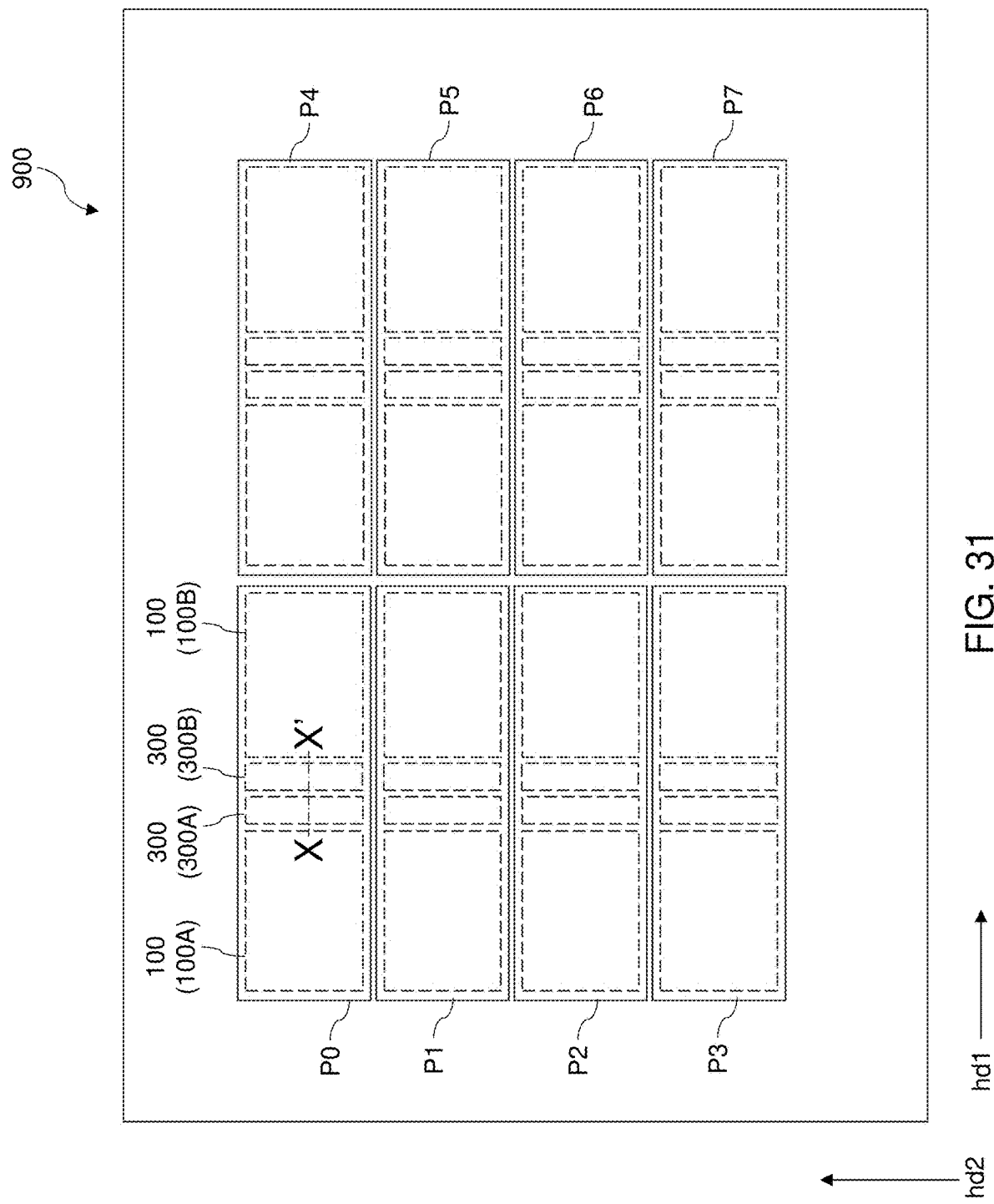
FIG. 31 is a top-down view of a semiconductor die including a second exemplary structure according to an embodiment of the present disclosure.

Referring to FIG. 31, a schematic top-down view of a semiconductor die 900 is shown, which includes a second exemplary structure according to an embodiment of the present disclosure. The semiconductor die may comprise a plurality of memory planes (P0-P7), each including a respective pair of three-dimensional memory arrays located in respective memory array regions 100 (e.g., 100A and 100B). Each three-dimensional memory array may be formed in the respective memory array region 100. A pair of contact regions 300 (e.g., 300A and 300B) may be provided between the pair of memory array regions 100 in each plane (P0-P7). The pair of memory array regions 100 within each plane (P0-P7) may be laterally spaced from each other along a first horizontal direction (e.g., word line direction) hd1. Generally, at least two alternating stacks of insulating layers (132, 232) and electrically conductive layers (146, 246) and the layer contact via structures 86 described with reference to the first exemplary structure can be employed in the second exemplary structure.

Figure 32:
FIG. 32 is a vertical cross-sectional view of the second exemplary structure after formation of a three-tier structure including various alternating stacks, retro-stepped dielectric material portions, sacrificial memory opening fill structures up to the middle-tier level, and sacrificial contact opening fill structures up to the middle-tier level according to an embodiment of the present disclosure.

Referring to FIG. 32, a second exemplary structure including a vertical stack of three tier structures (1000, 2000, 3000) is illustrated, which can be formed employing the processing steps described with reference to the first exemplary structure with modifications in patterns of the alternating stacks {(132, 142), (232, 242), (332, 342)} therein.

The second exemplary structure illustrated in FIG. 32 is a three-tier structure including a lower-tier structure 1000, a middle-tier structure 2000, and an upper-tier structure 3000. The cut plane of the vertical cross-sectional view of FIG. 32 corresponds to the vertical plane X-X' in FIG. 31. The illustrated regions in FIG. 32 include, from left to right, an end portion of a first memory array region 100A, a first contact region 300A, a second contact region 300B, and an end portion of a second memory array region 100B.

The lower-tier structure 1000 can be formed by performing the processing steps described with reference to FIGS. 1-6 with a modification in the pattern of the first stepped surfaces that are formed at the processing steps of FIG. 1. Specifically, the first stepped surface of each patterned first alternating stack (132, 142) can be formed in a respective contact region 300. Since a pair of contact regions 300 (e.g., 300A and 300B) is adjoined to each other, and is laterally spaced from each other along the first horizontal direction hd1, within each plane (P0-P7), a pair of first stepped surfaces within a neighboring pair of contact regions (300A and 300B) can be laterally spaced apart along the first horizontal direction by a first lateral spacing LS1, which may be in a range from 100 nm to 1,000 nm, although lesser and greater first lateral spacings LS1 may also be employed. A first stepped dielectric material portion 165 can be formed over a neighboring pair of first stepped surfaces.

Each first alternating stack (132, 142) in the second exemplary structure is also referred to as a lower-tier alternating stack (132, 142). Each set of stepped surfaces on the first alternating stacks (132, 142) is herein referred to as lower-tier stepped surfaces. The first-tier sacrificial memory opening fill structures 148 are also referred to as lower-tier sacrificial memory opening fill structures 148, and the first-tier sacrificial contact opening fill structures 138 are also referred to as lower-tier sacrificial contact opening fill structures 138 in the second exemplary structure.

A first lower-tier alternating stack (132, 142) is located in the first memory array region 100A and in the first contact region 300A, and a second lower-tier alternating stack (132, 142) is located in the second memory array region 100B and in the second contact region 300B. Each of the lower-tier alternating stacks (132, 232) comprises a respective vertically alternating sequence of lower-tier insulating layers 132 and lower-tier sacrificial material layers 142. The first stepped dielectric material portion 165 is also referred to as a lower-tier stepped dielectric material portion 165 in the second exemplary structure. The first insulating liners 152 are also referred to as lower-tier insulating liners 152 in the second exemplary structure. The first sacrificial liners 154 are also referred to as lower-tier sacrificial liners 154 in the second exemplary structure. Lower-tier sacrificial support opening fill structures (not shown) may be formed as needed.

The lower-tier sacrificial memory opening fill structures 148 are formed in the first memory array region 100A and in the second memory array region 100B. The lower-tier sacrificial contact opening fill structures 138 are formed in each area in which layer contact via structures 86 are to be subsequently formed. The areas in which the lower-tier sacrificial contact opening fill structures 138 are formed include areas of the lower-tier stepped surfaces of the lower-tier alternating stacks (132, 232), areas of middle-tier stepped surfaces of the middle-tier structure 2000, and areas of upper-tier stepped surfaces of the upper-tier structure 3000. Specifically, the areas of the lower-tier sacrificial contact opening fill structures 138 include areas of center portions of the horizontally-extending surfaces of the lower-tier stepped surfaces of the lower-tier alternating stacks (132, 232), the middle-tier stepped surfaces of the middle-tier structure 2000, and the upper-tier stepped surfaces of the upper-tier structure 3000.

The middle-tier structure 2000 can be formed by performing the processing steps described with reference to FIGS. 7-9 and by performing processing steps described with reference to FIGS. 4-6 with suitable modifications in the processing parameters to form middle-tier sacrificial memory opening fill structures 248 and middle-tier sacrificial contact opening fill structures 238. Each second alternating stack (232, 242) in the second exemplary structure is also referred to as a middle-tier alternating stack (232, 242). Each set of stepped surfaces on the middle-tier alternating stacks (232, 242) is herein referred to as middle-tier stepped surfaces. The middle-tier sacrificial memory opening fill structures 248 are formed on the lower-tier sacrificial memory opening fill structures 148. The middle-tier sacrificial contact opening fill structures 238 are formed on the lower-tier sacrificial contact opening fill structures 138.

In one embodiment, the middle-tier structure 2000 comprises a first middle-tier alternating stack (232, 242) formed in the first memory array region 100A and the first contact region 300A, and a second middle-tier alternating stack (232, 242) formed in the second memory array region 100B and the second contact region 300B, and a passive alternating stack 203 that is formed between the first middle-tier alternating stack (232, 242) and the second middle-tier alternating stack (232, 242), and extends across the first contact region 300A and the second contact region 300B. Each of the first middle-tier alternating stack (232, 242), the second middle-tier alternating stack (232, 242), and the passive alternating stack 203 comprises a respective vertically alternating sequence of middle-tier insulating layers 232 and middle-tier sacrificial material layers 242.

The first middle-tier alternating stack (232, 242) and the second middle-tier alternating stack (232, 242) can be laterally spaced apart along the first horizontal direction hd1 by a lateral spacing, which may be referred to as a second lateral spacing LS2 or as a first lateral spacing LS1'. The second lateral spacing LS2 or the first lateral spacing LS1' is greater than the lateral extent of the passive alternating stack 203 along the first horizontal direction hd1. Second stepped dielectric material portions 265 can be formed over stepped surfaces of the middle-tier alternating stacks (232, 242), for example, between the passive alternating stack 203 and the first middle-tier alternating stack (232, 242) and between the passive alternating stack 203 and the second middle-tier alternating stack (232, 242).

The second stepped dielectric material portions 265 are also referred to as a middle-tier stepped dielectric material portions 265 in the second exemplary structure. The second insulating liners 252 are also referred to as middle-tier insulating liners 252 in the second exemplary structure. The second sacrificial liners 254 are also referred to as middle-tier sacrificial liners 254 in the second exemplary structure. The passive alternating stack 203 may be free of any middle-tier sacrificial memory opening fill structures 248, i.e., may not include any middle-tier sacrificial memory opening fill structures 248 therein.

The passive alternating stack 203 may comprise first stepped surfaces that are formed in the first contact region 300A, and second stepped surfaces that are formed in the second contact region 300B. Each horizontally-extending surface of the first stepped surfaces of the passive alternating stack 203 may have an areal overlap with a respective horizontally-extending surface of stepped surfaces of the first lower-tier alternating stack (132, 142) in the first contact region 300A. Each horizontally-extending surface of the second stepped surfaces of the passive alternating stack 203 may have an areal overlap with a respective horizontally-extending surface of stepped surfaces of the second lower-tier alternating stack (132, 142) om the second contact region 300B. Middle-tier sacrificial support opening fill structures (not shown) may be formed as needed.

The middle-tier sacrificial memory opening fill structures 248 are formed in the first memory array region 100A and in the second memory array region 100B. The middle-tier sacrificial contact opening fill structures 238 are formed in each area in which layer contact via structures 86 are to be subsequently formed. The areas in which the middle-tier sacrificial contact opening fill structures 238 are formed include areas of the lower-tier stepped surfaces of the lower-tier alternating stacks (132, 232), areas of the middle-tier stepped surfaces of the middle-tier structure 2000, and areas of the upper-tier stepped surfaces of the upper-tier structure 3000. Specifically, the areas of the middle-tier sacrificial contact opening fill structures 238 include areas of center portions of the horizontally-extending surfaces of the lower-tier stepped surfaces of the lower-tier alternating stacks (132, 232), the middle-tier stepped surfaces of the middle-tier structure 2000, and the upper-tier stepped surfaces of the upper-tier structure 3000.

The upper-tier structure 3000 can be formed by performing the processing steps described with reference to FIGS. 7-9 with suitable modifications in the patterns of various elements. The alternating stacks formed within the upper-tier structure 3000 are collectively referred to as upper-tier alternating stacks (332, 342). Each set of stepped surfaces on the upper-tier alternating stacks (332, 342) is herein referred to as upper-tier stepped surfaces.

In one embodiment, the upper-tier structure 3000 comprises a first upper-tier alternating stack (332, 342) formed in the first memory array region 100A and the first contact region 300A, and a second upper-tier alternating stack (332, 342) formed in the second memory array region 100B and the second contact region 300B, and a passive alternating stack 303 that is formed between the first upper-tier alternating stack (332, 342) and the second upper-tier alternating stack (332, 342), and extends across the first contact region 300A and the second contact region 300B. Each of the first upper-tier alternating stack (332, 342), the second upper-tier alternating stack (332, 342), and the passive alternating stack 303 comprises a respective vertically alternating sequence of upper-tier insulating layers 332 and upper-tier sacrificial material layers 342.

The first upper-tier alternating stack (332, 342) and the second upper-tier alternating stack (332, 342) can be laterally spaced apart along the first horizontal direction hd1 by a lateral spacing, which may be referred to as a second lateral spacing LS2'. The second lateral spacing LS2' is greater than the lateral extent of the passive alternating stack 303 along the first horizontal direction hd1. Upper-tier stepped dielectric material portions 365 can be formed over stepped surfaces of the upper-tier alternating stacks (332, 342), for example, between the passive alternating stack 303 and the first upper-tier alternating stack (332, 342) and between the passive alternating stack 303 and the second upper-tier alternating stack (332, 342).

Upper-tier insulating liners 352 can be formed in the second exemplary structure by performing processing steps that are employed to form the second insulating liners 252 in the first exemplary structure. Upper-tier sacrificial liners 354 can be formed in the second exemplary structure by performing processing steps that are employed to form the second sacrificial liners 254 in the first exemplary structure.

The passive alternating stack 303 may comprise first stepped surfaces that are formed in the first contact region 300A, and second stepped surfaces that are formed in the second contact region 300B. Each horizontally-extending surface of the first stepped surfaces of the passive alternating stack 303 may have an areal overlap with a respective horizontally-extending surface of stepped surfaces of the first middle-tier alternating stack (232, 242) in the first contact region 300A. Each horizontally-extending surface of the second stepped surfaces of the passive alternating stack 303 may have an areal overlap with a respective horizontally-extending surface of stepped surfaces of the second middle-tier alternating stack (232, 242) in the second contact region 300B.

Figure 33:
FIG. 33 is a vertical cross-sectional view of the second exemplary structure after formation of multi-tier sacrificial contact opening fill structures according to an embodiment of the present disclosure.

Referring to FIG. 33, the processing steps described with reference to FIGS. 10 and 11 can be performed with suitable modifications in the patterns of the openings that are formed through the upper-tier structure to form various sacrificial contact opening fill structures 38 and sacrificial support opening fill structures (not illustrated). The sacrificial contact opening fill structures 38 are formed in each area in which layer contact via structures 86 are to be subsequently formed. The areas in which the sacrificial contact opening fill structures 38 are formed include areas of the lower-tier stepped surfaces of the lower-tier alternating stacks (132, 232), areas of the upper-tier stepped surfaces of the upper-tier structure 2000, and areas of the upper-tier stepped surfaces of the upper-tier structure 3000. Specifically, the areas of the sacrificial contact opening fill structures 38 include areas of center portions of the horizontally-extending surfaces of the lower-tier stepped surfaces of the lower-tier alternating stacks (132, 232), the upper-tier stepped surfaces of the upper-tier structure 2000, and the upper-tier stepped surfaces of the upper-tier structure 3000.

Figure 34:
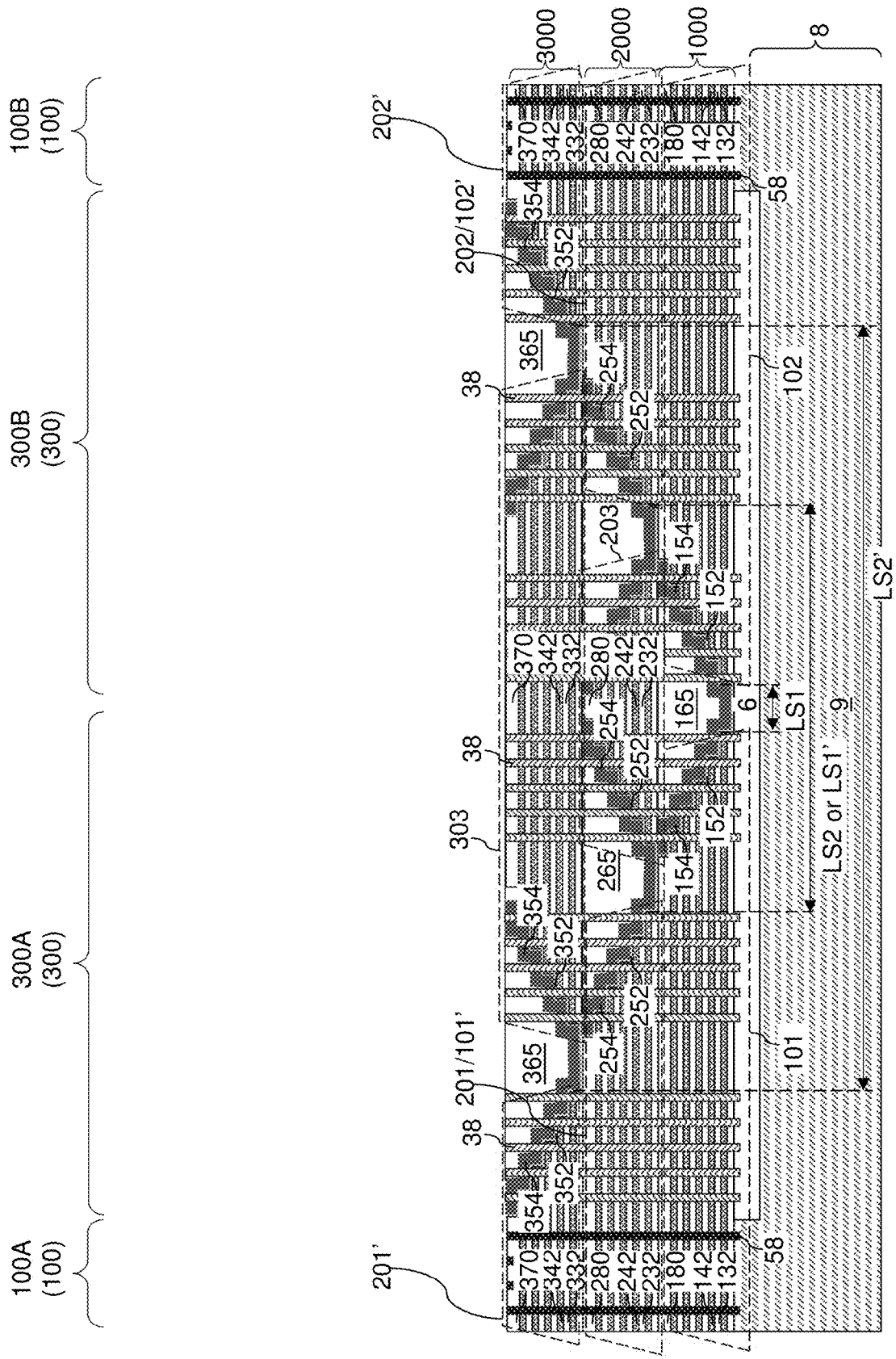
FIG. 34 is a vertical cross-sectional view of the second exemplary structure after formation of memory opening fill structures according to an embodiment of the present disclosure.

Referring to FIG. 34, the processing steps described with reference to FIGS. 12-15 are formed without suitable modifications in view of presence of the middle-tier structure 2000 and the lower-tier structure 1000 underneath the upper-tier structure 3000 to form memory opening fill structures 58 and optional support pillar structures (not illustrated). As discussed above, each of the memory opening fill structures 58 comprises a respective vertical semiconductor channel 60, a respective vertical stack of memory elements (e.g., portions of a memory film 50), a drain region 63 and an optional dielectric core 62. Each of the support pillar structures 20 may comprise a dielectric material or may comprise a dummy vertical semiconductor channel (which is not electrically connected to a bit line), a dummy memory film, a dummy drain region, and an optional dielectric core which comprise the same materials as those of the memory opening fill structures 58. Generally, the passive alternating stacks (203, 303) may be free of memory openings or memory opening fill structures 58.

While an embodiment is described in which the second exemplary structure comprises three tier structures including a lower-tier structure 1000, a middle-tier structure 2000, and an upper-tier structure 3000, the present disclosure may be practiced in general with two or more tier structures, such as two, four, etc. tier structures. Thus, the illustrated second exemplary structure may be modified to include only two tier structures, or to include four or more tier structures that includes the three tier structures (1000, 2000, 3000) and at least one additional tier structure. Further, the locations of the tier structures may be varied vertically in any order. For example, the patterns of any pair of tier structures (1000, 2000, 3000) in the second exemplary structure may be swapped without affecting the functionality of the second exemplary structure. In an illustrative example, the pattern of the upper-tier structure 3000 and the pattern of the lower-tier structure 1000 may be swapped, the pattern of the upper-tier structure 3000 and the pattern of the middle-tier structure 2000 may be swapped, etc.

In summary, the second exemplary structure may comprise a vertical stack of multiple tier structures including at least a first-tier structure and a second-tier structure. The first-tier structure may be any of the lower-tier structure 1000, the middle-tier structure 2000, the upper-tier structure 3000, or any additional tier structure (not illustrated) that is formed above the upper-tier structure 3000. The second-tier structure may comprise any other tier structure within the vertical stack. In an illustrative example, the first-tier structure may comprise, for example, the lower-tier structure 1000 or the middle-tier structure 2000, and the second-tier structure may comprise the middle-tier structure 2000 or the upper-tier structure 3000. In one embodiment, the first-tier structure may comprise the lower-tier structure 1000 and the second-tier structure may comprise the middle-tier structure 2000. In another embodiment, the first-tier structure may comprise the middle-tier structure 2000 and the second-tier structure may comprise the upper-tier structure 3000.

According to an aspect of the present disclosure, a first-tier structure comprising a first first-tier alternating stack (101 or 101') and a second first-tier alternating stack (102 or 102') is formed over a substrate 8. Each of the first first-tier alternating stack (101 or 101') and the second first-tier alternating stack (102 or 102') comprises a respective vertically alternating sequence of first-tier insulating layers (132, 232, or 332) and first-tier sacrificial material layers (142, 242, or 342). In a first exemplary embodiment, the first first-tier alternating stack 101 comprises a first lower-tier alternating stack (132, 142) that is formed in the first memory array region 100A, and the second first-tier alternating stack 102 comprises a second lower-tier alternating stack (132, 142) that is formed in the second memory array region 100B. In a second exemplary embodiment, the first first-tier alternating stack 101' comprises a first middle-tier alternating stack (232, 242) that is formed in the first memory array region 100A, and the second first-tier alternating stack 102' comprises a second middle-tier alternating stack (232, 242) that is formed in the second memory array region 100B.

Further, a second-tier structure comprising a first second-tier alternating stack (201 or 201') and a second second-tier alternating stack (202 or 202') that are laterally spaced apart from each other by a passive alternating stack (203 or 303) is formed over the substrate 8. The second-tier structure may be formed above or below the first-tier structure. Each of the first second-tier alternating stack (201 or 201'), the second second-tier alternating stack (202 or 202'), and the passive alternating stack (203 or 303) comprises a respective vertically alternating sequence of second-tier insulating layers (232, 332, or 132) and second-tier sacrificial material layers (242, 342, or 142). In the first exemplary embodiment, the first second-tier alternating stack 201 comprises a first middle-tier alternating stack (232, 242) that is formed in the first memory array region 100A, and the second second-tier alternating stack 202 comprises a second middle-tier alternating stack (232, 242) that is formed in the second memory array region 100B. In the second exemplary embodiment, the first second-tier alternating stack 201' comprises a first upper-tier alternating stack (332, 342) that is formed in the first memory array region 100A, and the second second-tier alternating stack 202' comprises a second upper-tier alternating stack (332, 342) that is formed in the second memory array region 100B.

In one embodiment, the first-tier structure and the second-tier structure overlie a substrate 8, and the first first-tier alternating stack (101 or 101') comprises first stepped surfaces such that lateral extents of the first-tier sacrificial material layers (142, 242, or 342) in the first first-tier alternating stack (101 or 101') decrease with a vertical distance from the substrate 8. The passive alternating stack (203 or 303) comprises second stepped surfaces such that lateral extents of the second-tier sacrificial material layers (242, 342, or 142) in the passive alternating stack (203 or 303) decrease with the vertical distance from the substrate 8. The sacrificial contact opening fill structures 38 vertically extend through the first stepped surfaces and through the second stepped surfaces.

In one embodiment, the first first-tier alternating stack (101 or 101') and the second first-tier alternating stack (102 or 102') are laterally spaced apart from each other along a first horizontal direction hd1 by a first lateral spacing (LS1 or LS1'); the first second-tier alternating stack (201 or 201') and the second second-tier alternating stack (202 or 202') are laterally spaced apart from each other along the first horizontal direction hd1 by a second lateral spacing (LS2 or LS2') that is greater than the first lateral spacing (LS1 or LS1'); and the passive alternating stack (203 or 303) has a lateral extent along the first horizontal direction hd1 that is less than the second lateral spacing (LS2 or LS2').

In one embodiment, the passive alternating stack (203 or 303) comprises a first set of stepped surfaces and a second set of stepped surfaces that are laterally spaced apart from each other; the first set of stepped surfaces has an areal overlap with the first first-tier alternating stack (101 or 101') in a plan view; and the second set of stepped surfaces has an areal overlap with the second first-tier alternating stack (102 or 102') in the plan view.

In one embodiment, the passive alternating stack (203 or 303) does not laterally surround any material portion having a same material composition as the memory elements (such as portions of charge storage layers 54). In one embodiment, the passive alternating stack (203 or 303) does not laterally surround any semiconductor material portion, such as a vertical semiconductor channel 60 or drain region 63.

A subset of the sacrificial contact opening fill structures 38 vertically extends through and contacts cylindrical surface segments of a respective pair of sacrificial liners (154, 254, 354). The subset of the sacrificial contact opening fill structures 38 can vertically extend through two horizontally-extending surfaces of two stepped surfaces located within the first-tier structure and the second-tier structure.

In one embodiment, first memory stack structures 55 (located in the first memory opening fill structures 58) vertically extend through the first first-tier alternating stack (101 or 101') and the first second-tier alternating stack (201 or 201'), and second memory stack structures 55 (located in the second memory opening fill structures 58) vertically extend through the second first-tier alternating stack (102 or 102') and the second second-tier alternating stack (202 or 202'). Each of the first memory stack structures 55 and the second memory stack structures 55 comprises a respective set of memory elements (such as portions of charge storage layers 54) located at levels of the first-tier sacrificial material layers (142, 242, or 342) and the second-tier sacrificial material layers (242, 342, or 142).

Figure 35:
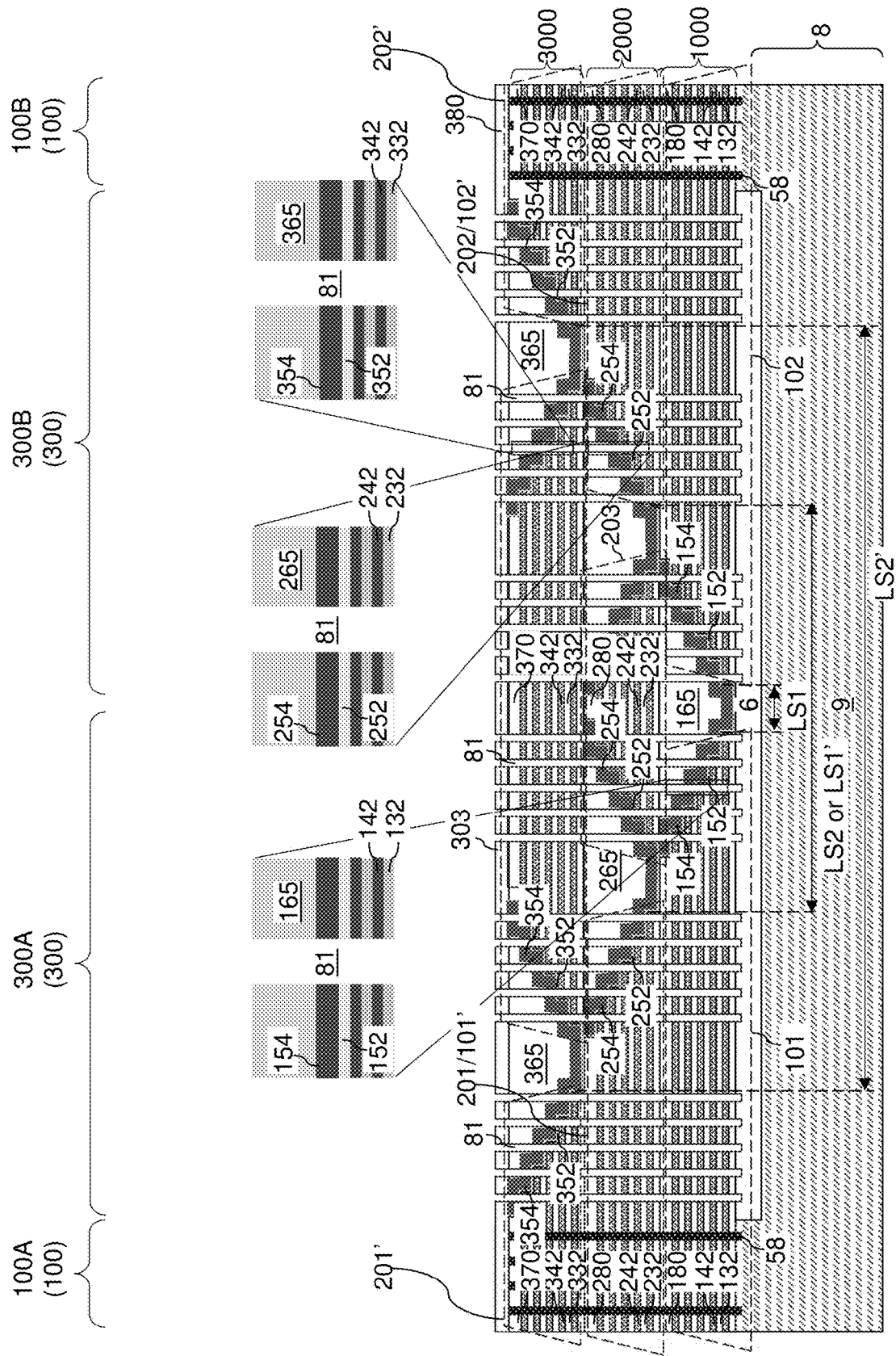
FIG. 35 is a vertical cross-sectional view of the second exemplary structure after formation of contact via cavities according to an embodiment of the present disclosure.

Referring to FIG. 35, a contact-level dielectric layer 380 may be optionally formed over the upper-tier structure 3000.

The processing steps described with reference to FIGS. 16A and 16B can be performed to form the contact via cavities 81. Specifically, the contact via cavities 81 can be formed by forming openings through the contact-level dielectric layer 380 and by removing the sacrificial contact opening fill structures 38.

Figure 36:
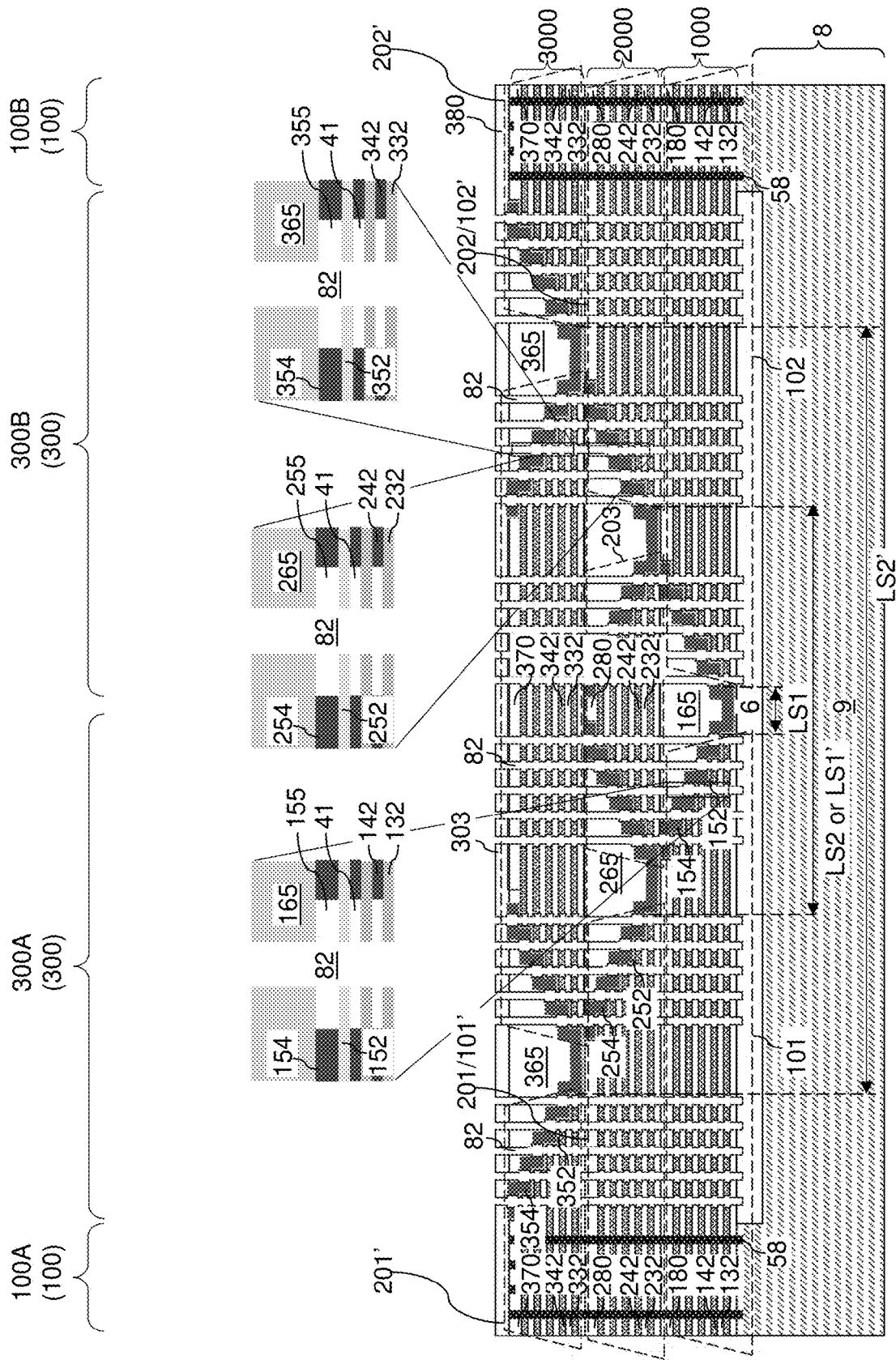
FIG. 36 is a vertical cross-sectional view of the second exemplary structure after formation of lateral recesses and annular cavities around the contact via cavities according to an embodiment of the present disclosure.

Referring to FIG. 36, the processing steps described with reference to FIG. 17 can be performed. Lateral recesses 41 are formed in volumes from which the materials of the sacrificial material layers (142, 242, 342) are removed. A lower-tier annular cavity 155 can be formed in each volume from which an annular portion of the lower-tier sacrificial liners 154 is removed around a respective one of the contact via cavities 81. A middle-tier annular cavity 255 can be formed in each volume from which an annular portion of the middle-tier sacrificial liners 254 is removed around a respective one of the contact via cavities 81. An upper-tier annular cavity 355 can be formed in each volume from which an annular portion of the upper-tier sacrificial liners 354 is removed around a respective one of the contact via cavities 81. The contact via cavities 81 are converted into first-stage in-process finned contact via cavities 82. A subset of the first-stage in-process finned contact via cavities 82 that vertically extends through a respective pair of stepped surfaces located in two different tier structures comprise a respective pair of annular cavities (155 and 255) or (255 and 355).

Figure 37:
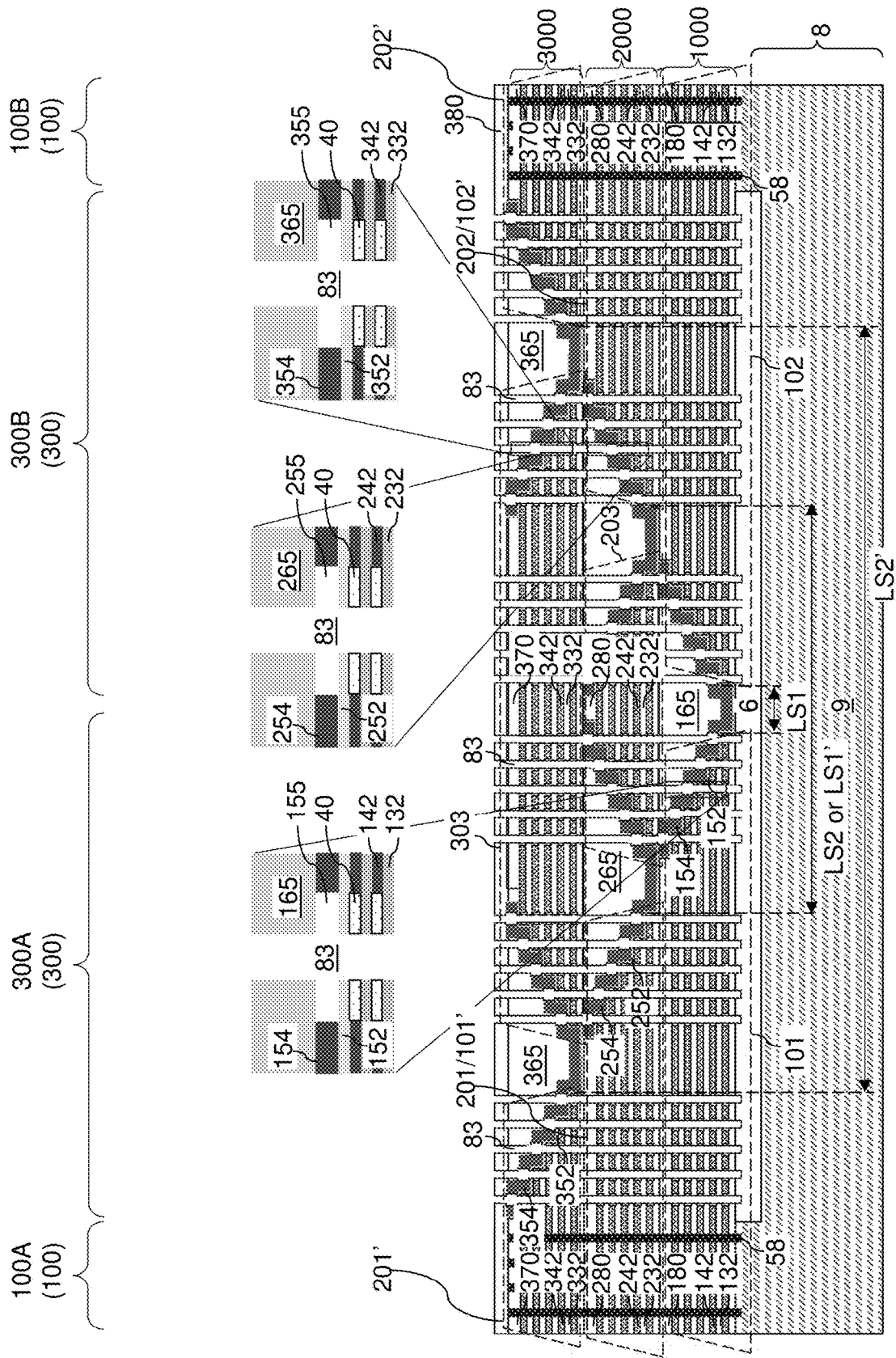
FIG. 37 is a vertical cross-sectional view of the second exemplary structure after formation of annular insulating plates according to an embodiment of the present disclosure.

Referring to FIG. 37, the processing steps described with reference to FIGS. 18 and 19 can be performed to form annular insulating plates 40 in the lateral recesses 41. The first-stage in-process finned contact via cavities 82 are converted into second-stage in-process finned contact via cavities 83. A subset of the second-stage in-process finned contact via cavities 83 that vertically extends through a respective pair of stepped surfaces located in two different tier structures comprise a respective pair of annular cavities (155 and 255) or (255 and 355).

Figure 38:
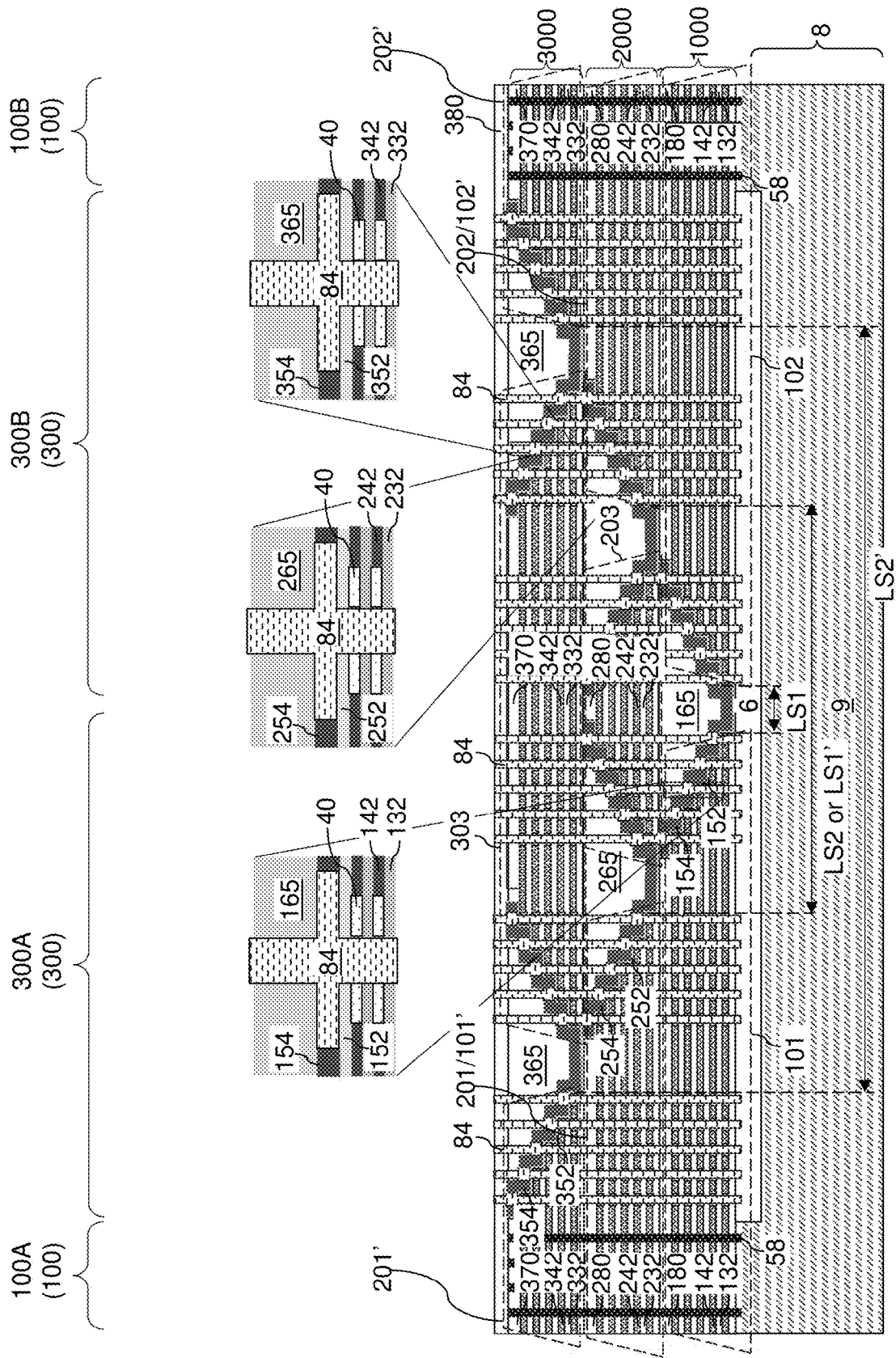
FIG. 38 is a vertical cross-sectional view of the second exemplary structure after formation of sacrificial finned cavity fill material structures according to an embodiment of the present disclosure.

Referring to FIG. 38, the processing steps described with reference to FIGS. 20 and 21 can be performed. Specifically, a second isotropic etch process can be performed to isotropically recess the materials of the sacrificial liners (154, 254, 354) selective to the materials of the contact-level dielectric layer 380, the insulating layers (132, 232, 332), the inter-tier dielectric layers (180, 280), the dielectric isolation layer 6 (if present), and the annular insulating plates 40. For example, if the sacrificial liners (154, 254, 354) comprise silicon nitride, a wet etch process employing hot phosphoric acid can be performed to isotropically recess the sacrificial liners (154, 254, 354). The volume of each annular cavity portion can be laterally expanded by the second isotropic etch process. The second-stage in-process finned contact via cavities 83, as expanded by the second isotropic etch process, are herein referred to as third-stage in-process finned contact via cavities. A sacrificial fill material can be deposited in the third-stage in-process finned contact via cavities to form sacrificial finned cavity fill material structures 84. Each sacrificial finned cavity fill material structure 84 comprises a respective cylindrical fill material portion and at least one fin-shaped fill material portion. Each fin-shaped fill material portion has a respective annular shape. According to an aspect of the present disclosure, a subset of the sacrificial finned cavity fill material structure 84 that vertically extend through two stepped surfaces located in two different tier structures comprises a pair of fin-shaped fill material portions.

In summary, the sacrificial finned cavity fill material structures 84 can be formed through the first-tier structure and the second-tier structure. A subset of the sacrificial finned cavity fill material structures 84 can be laterally surrounded by first annular insulating plates 40 at levels of a subset of the first-tier sacrificial material layers (142, 242, or 342) within the first first-tier alternating stack (101 or 101'), and can be laterally surrounded by second annular insulating plates 40 at levels of a subset of the second-tier sacrificial material layers (242, 342, or 142) within the passive alternating stack (203 or 303).

Figure 39:
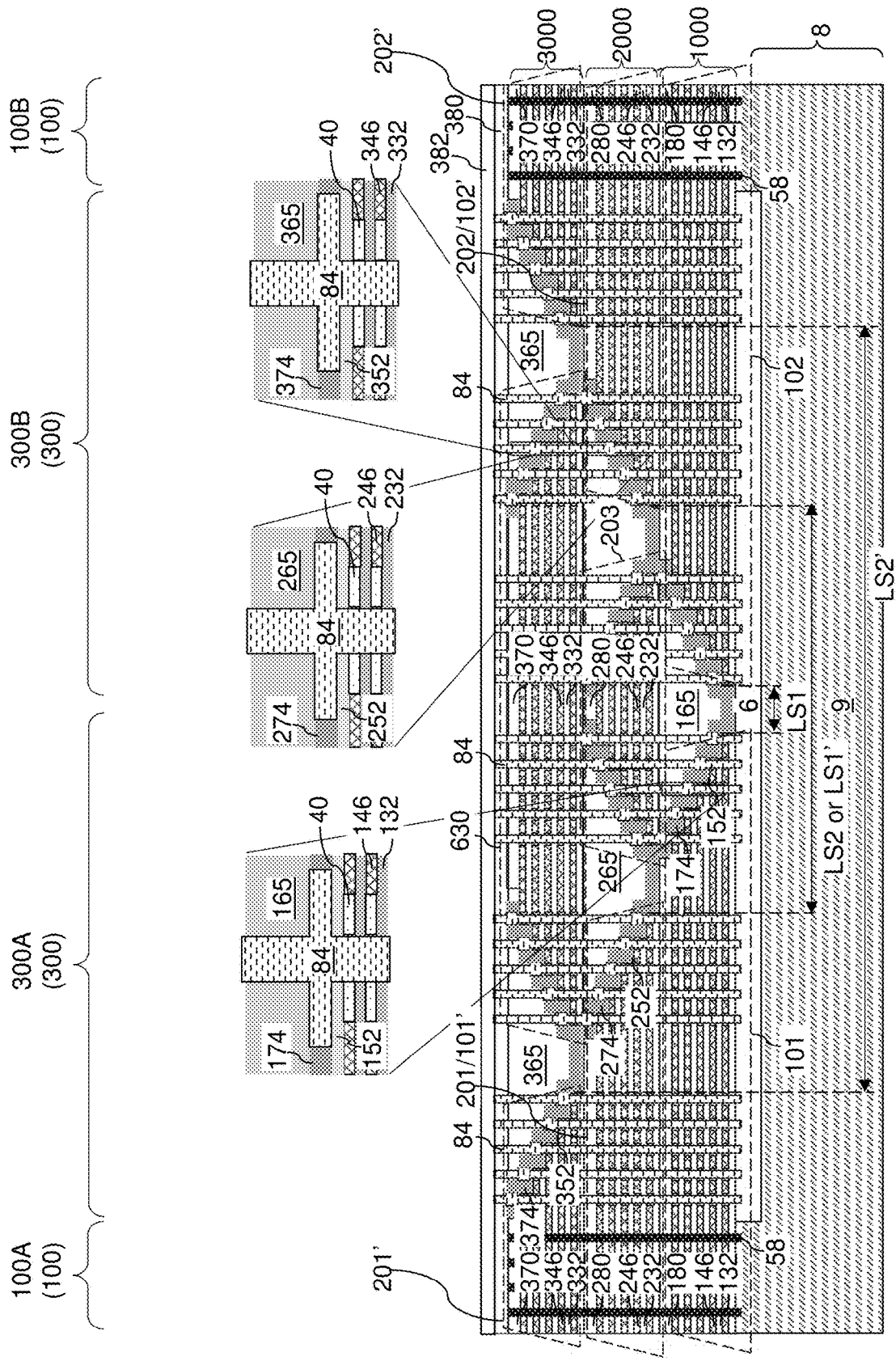
FIG. 39 is a vertical cross-sectional view of the second exemplary structure after replacement of sacrificial material layers with electrically conductive layers according to an embodiment of the present disclosure.

Referring to FIG. 39, the processing steps described with reference to FIGS. 22A and 22B, 23, 24, 25, and 26 can be performed to form lateral isolation trenches, source regions (not shown), and laterally-extending cavities; to form electrically conductive layers (146, 246, 346) in the laterally-extending cavities, and to replace the sacrificial liners (154, 254, 354) with dielectric fill material layers (174, 274, 374). The electrically conductive layers (146, 246, 346) may comprise lower-tier electrically conductive layers 146 that are formed in the lower-tier structure 1000, middle-tier electrically conductive layers 246 that are formed in the middle-tier structure 2000, and upper-tier electrically conductive layers 346 that are formed in the upper-tier structure 3000. The bottommost lower-tier electrically conductive layers 146 may function as source select gate electrodes and the uppermost upper-tier electrically conductive layers 346 may function as drain select gate electrodes in the active alternating stacks that include the memory opening fill structures 58. The remaining electrically conductive layers (146, 246, 346) may function as word lines in the active alternating stacks. The dielectric fill material layers (174, 274, 374) may comprise lower-tier dielectric fill material layers 174 that are formed in the lower-tier structure 1000, middle-tier dielectric fill material layers 274 that are formed in the middle-tier structure 2000, and upper-tier dielectric fill material layers 374 that are formed in the upper-tier structure 3000.

Figure 40:
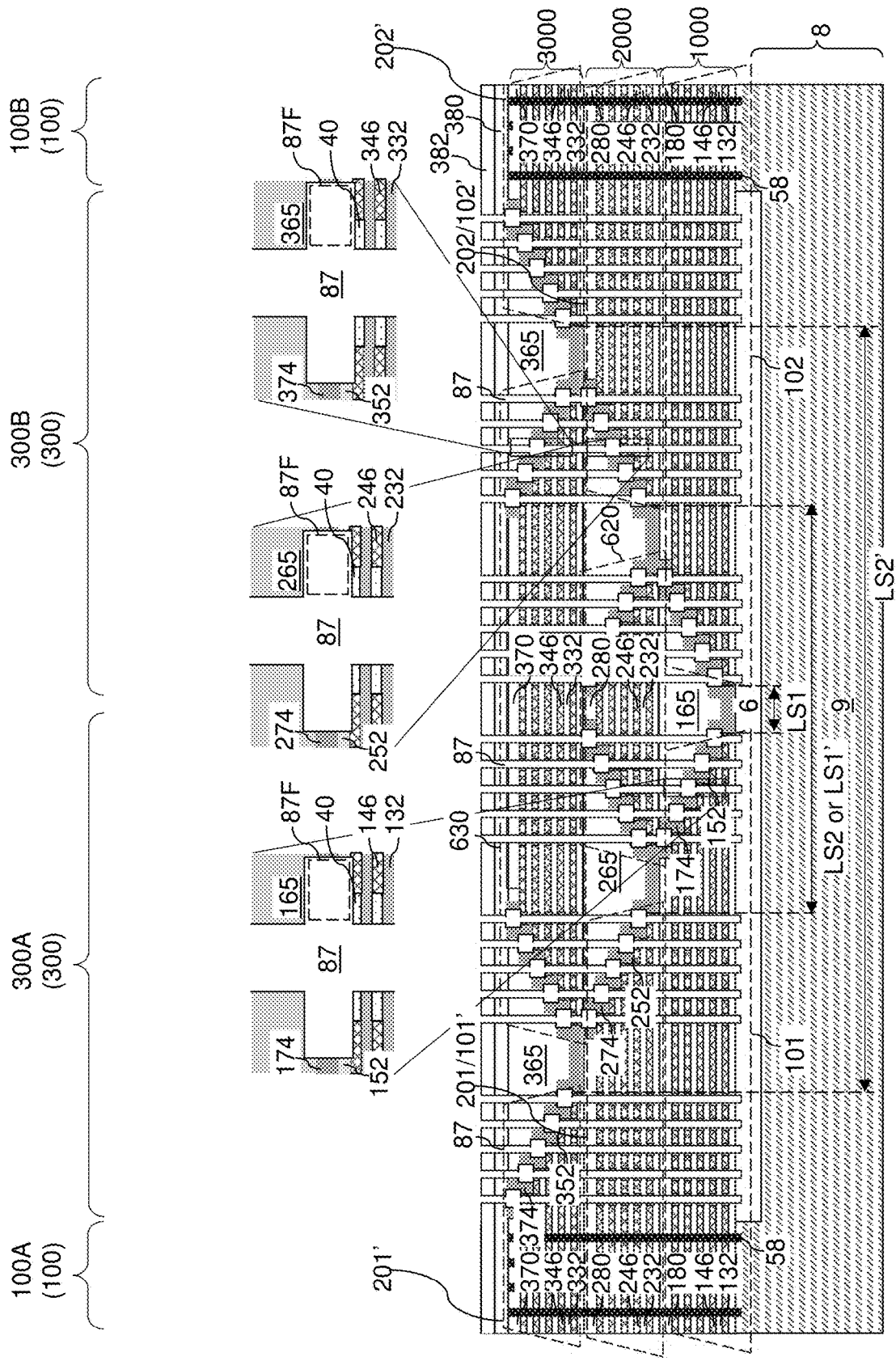
FIG. 40 is a vertical cross-sectional view of the second exemplary structure after formation of finned contact via cavities according to an embodiment of the present disclosure.

Referring to FIG. 40, the processing steps described with reference to FIG. 27 can be performed to form source contact via structures (not shown). The processing steps described with reference to FIG. 28 can be performed to form finned contact via cavities 87. Specifically, a selective etch process can be performed to remove the sacrificial fill material of the sacrificial finned cavity fill material structures 84 selective to materials of the annular insulating plates 40, the insulating layers (132, 232, 332), the stepped dielectric material portions (165, 265, 365), and the dielectric isolation layer 6 (if present). Finned contact via cavities 87 are formed in volumes from which the sacrificial finned cavity fill material structures 84 are removed. Each finned contact via cavity 87 comprises a cylindrical cavity portion 87C and a fin cavity portion 87F.

Subsequently, an isotropic etch process can be performed to isotropically etch the materials of the insulating liners (152, 252, 352). The duration of the isotropic etch can be selected such that the etch distance for the materials of the insulating liners (152, 252, 352) is greater than the thicknesses of the insulating liners (152, 252, 352). Thus, each physically exposed portion of the insulating liners (152, 252, 352) that underlie the fin cavity portions 87F are etched through. Each of the electrically conductive layers (146, 246, 346) has a respective annular top surface segment that is physically exposed to a respective one of the fin cavity portions 87F of the finned contact via cavities 87. An annular tapered concave surface (not expressly shown) of an insulating liner (152, 252, 352) can be physically exposed around each fin cavity portion 87F. The isotropic etch for the insulating liners (152, 252, 352) may comprise a dilute hydrofluoric acid etch.

In case the blocking dielectric liners (not shown) are present, an additional isotropic etch may be performed to remove exposed portions of a respective blocking dielectric liner and a respective blocking dielectric layer (not shown) around each fin cavity portion 87F. If the respective blocking dielectric liner and the blocking dielectric layer comprise aluminum oxide, then the isotropic etch may comprise a hot phosphoric acid etch.

Figure 41:
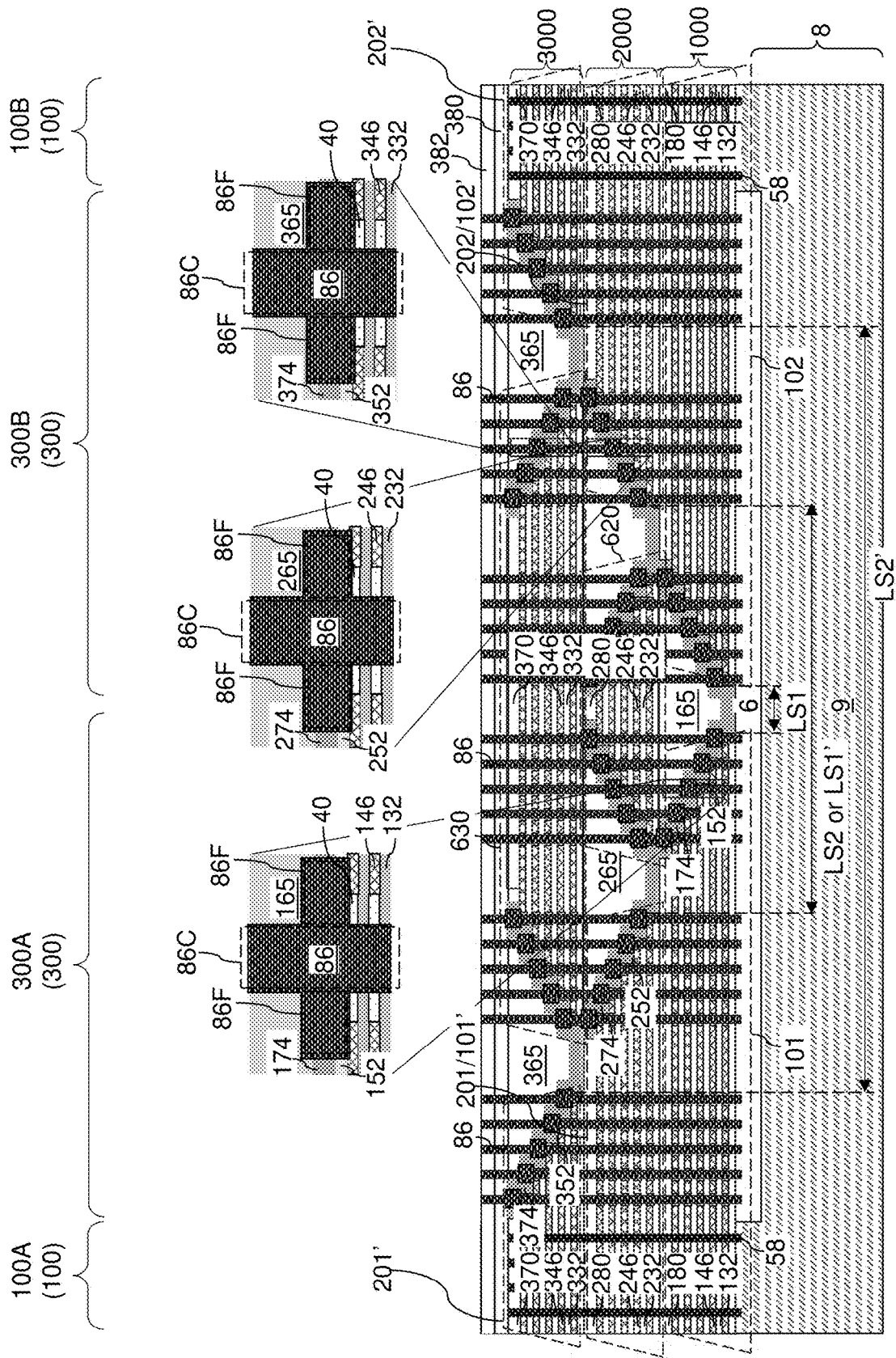
FIG. 41 is a vertical cross-sectional view of the second exemplary structure after formation of layer contact via structures according to an embodiment of the present disclosure.

Referring to FIG. 41, the processing steps described with reference to FIGS. 30A and 30B can be performed to form a layer contact via structures 86 within each fined contact via cavity 87. Generally, the sacrificial finned cavity fill material structures 84 are replaced with the layer contact via structures 86. Inter-tier electrically conductive paths 886 including a respective pair of layer contact via structures 86, two electrically conductive layers (146, 246, or 346) located in two different alternating stacks of insulating layers (132, 232, or 332) and electrically conductive layers (146, 246, or 346) located within a same tier structure, and an electrically conductive layer (246, 346, or 146) located in a passive alternating stack (203 or 303) located in a different tier structure can be formed.

Figure 42:
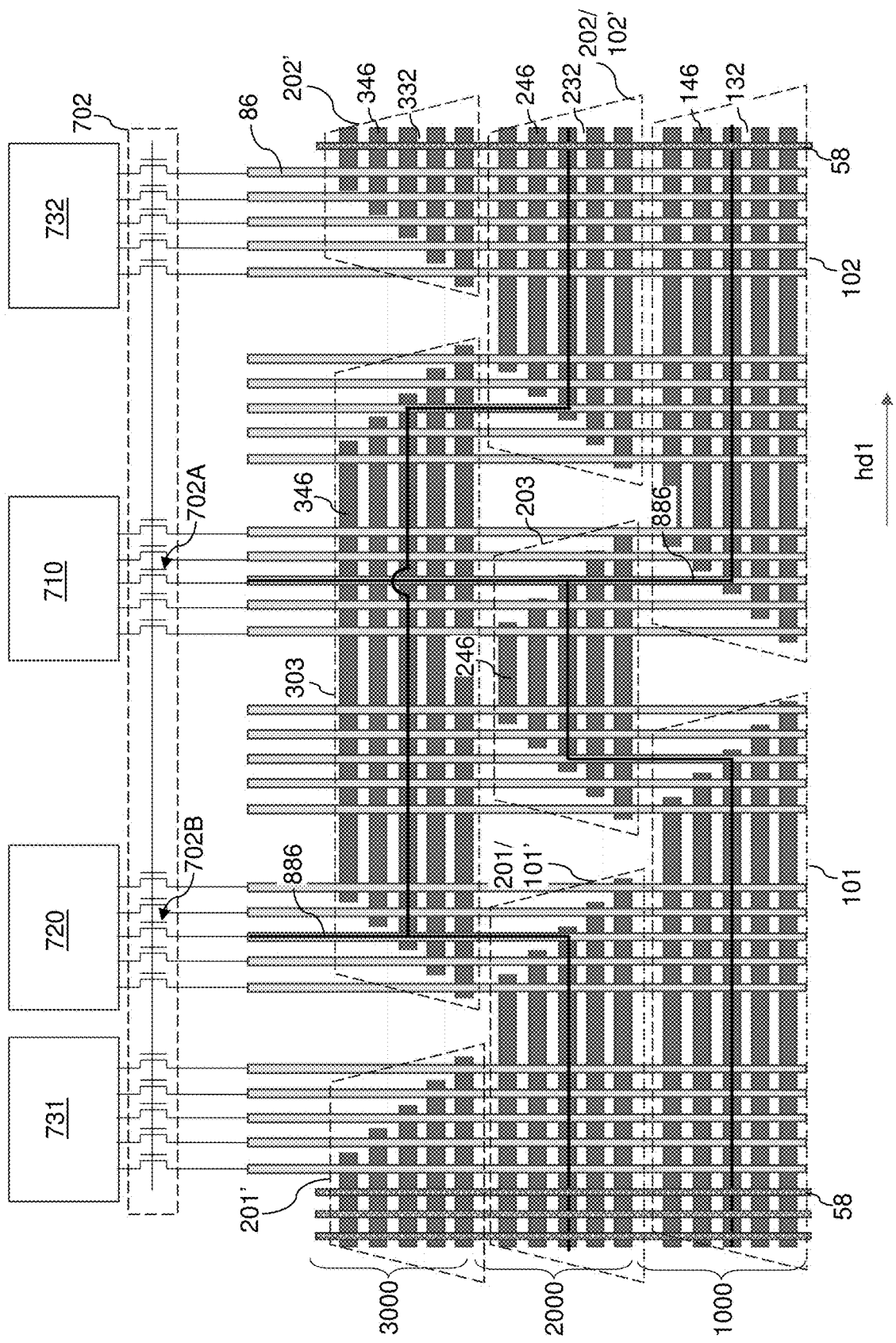
FIG. 42 is a composite view including a schematic vertical cross-sectional view of the second exemplary structure and a circuit schematic for electrically biasing various layers within the second exemplary structure according to an embodiment of the present disclosure.

Referring to FIG. 42, a composite view is illustrated, which includes a schematic vertical cross-sectional view of the second exemplary structure and a circuit schematic for electrically biasing various layers within the second exemplary structure according to an embodiment of the present disclosure.

Word line driver circuits (e.g., word line switching circuits) (710, 720, 731, 732) can be subsequently electrically connected to each of the layer contact via structures 86 through respective word line switching transistors 702. For each electrically conductive path 886 including a pair of a first layer contact via structure 86 and a second layer contact via structure 86, one of the first layer contact via structure 86 and the second layer contact via structure 86 can be electrically connected to a respective word line driver circuit (710, 720) through a respective word line switching transistor 702. For example, if a pair of lower-level electrically conductive layers 146 located in different active lower-tier alternating stacks (132, 146) is electrically connected to each other through a first layer contact via structure 86 and a second layer contact via structure 86 and a middle-tier electrically conductive layer 246 located in a passive alternating stack 203, then one of the first layer contact via structure 86 and the second layer contact via structure 86 can be electrically connected to an output node (i.e., the word line switching transistor 702A) of a lower-tier word line driver circuit 710.

In another example, if a pair of middle-level electrically conductive layers 246 located in different active middle-tier alternating stacks (232, 246) is electrically connected to each other through a first layer contact via structure 86 and a second layer contact via structure 86 and an upper-tier electrically conductive layer 346 located in a passive alternating stack 303, then one of the first layer contact via structure 86 and the second layer contact via structure 86 can be electrically connected to an output node (i.e., the word line switching transistor 702B) of a middle-tier word line driver circuit 720. If a pair of upper-level electrically conductive layers 346 located in different memory array regions 100 and located at a same level are not electrically connected to each other, then such upper-level electrically conductive layers 346 may be independently driven by two different upper-tier word line driver circuits (731, 732) through respective word line switching transistors 702.

Thus, inter-tier electrically conductive paths 886 between two active alternating stacks of insulating layers (132, 232, 332) and electrically conductive layers (146, 246, 336) that are located within a same tier structure (i.e., at the same vertical level from the substrate 8) and laterally spaced apart from each other are provided through a passive alternating stack (203, 303) and a pair of layer contact via structures 86.

Active alternating stacks include memory cells which can store data. For example, the active alternating stacks include memory opening fill structures 58 containing a memory film 50 which can store data. Passive alternating stacks do not include any memory opening fill structures 58 and do not include memory cells which can store data. The electrically conductive layers of the passive alternating stack (203, 303) act as electrical jumpers or interconnects between (e.g., dummy word lines) the electrically conductive layers of the active alternating stacks which function as word lines or select gate electrodes located at the same vertical level from the substrate. Thus, the passive alternating stacks may be referred to as jumper alternating stacks. The passive alternating stacks are located in different tiers from the active alternating stacks which they electrically connect to each other. Thus, each layer contact via structure 86 in the inter-tier electrically conductive path 886 contacts two electrically conductive layers (146, 246, 346) that are located in different tier structures (i.e., the jumper electrically conductive layer in the passive alternating stack is located in a different tier structure from the active electrically conductive layers (i.e., word lines or select gate electrodes) in the active alternating stacks).

In another embodiment, instead of using dummy word lines of passive alternating stacks as jumpers between active word lines and select gate electrodes of active alternating stacks, all alternating stacks comprise active alternating stacks. In this embodiment, active word lines or select gate electrodes of the jumper alternating stacks (203, 303) may be used as jumpers for word lines or select gate electrodes of the active alternating stacks located in different tier structures. Thus, in this embodiment, the alternating stacks (203, 303) are also active alternating stacks which include memory cells, such as the memory opening fill structures 58 containing a memory film 50 which can store data.

Thus, the total number of word line drivers and/or word line switching transistors 702 can be reduced by driving multiple electrically conductive layers (146, 246, 346) that are located in different alternating stacks and interconnected through the inter-tier electrically conductive paths 886, and a more compact semiconductor die can be manufactured. For example, a single word line driver 720 may be used to drive both the first active alternating stack (201/101') and the second active alternating stack (202/102') (and optionally the "jumper" alternating stack 303 if it comprises an active rather than a passive alternating stack). In another example, a single word line driver 710 may be used to drive both the first active alternating stack 101 and the second active alternating stack 102. Thus, a separate word line driver is not required for at least the second active alternating stack. Furthermore, only one word line switching transistor 702 instead of plural word line switching transistors is used for each electrically conductive layer in the respective inter-tier electrically conductive path 886.

Figure 43:
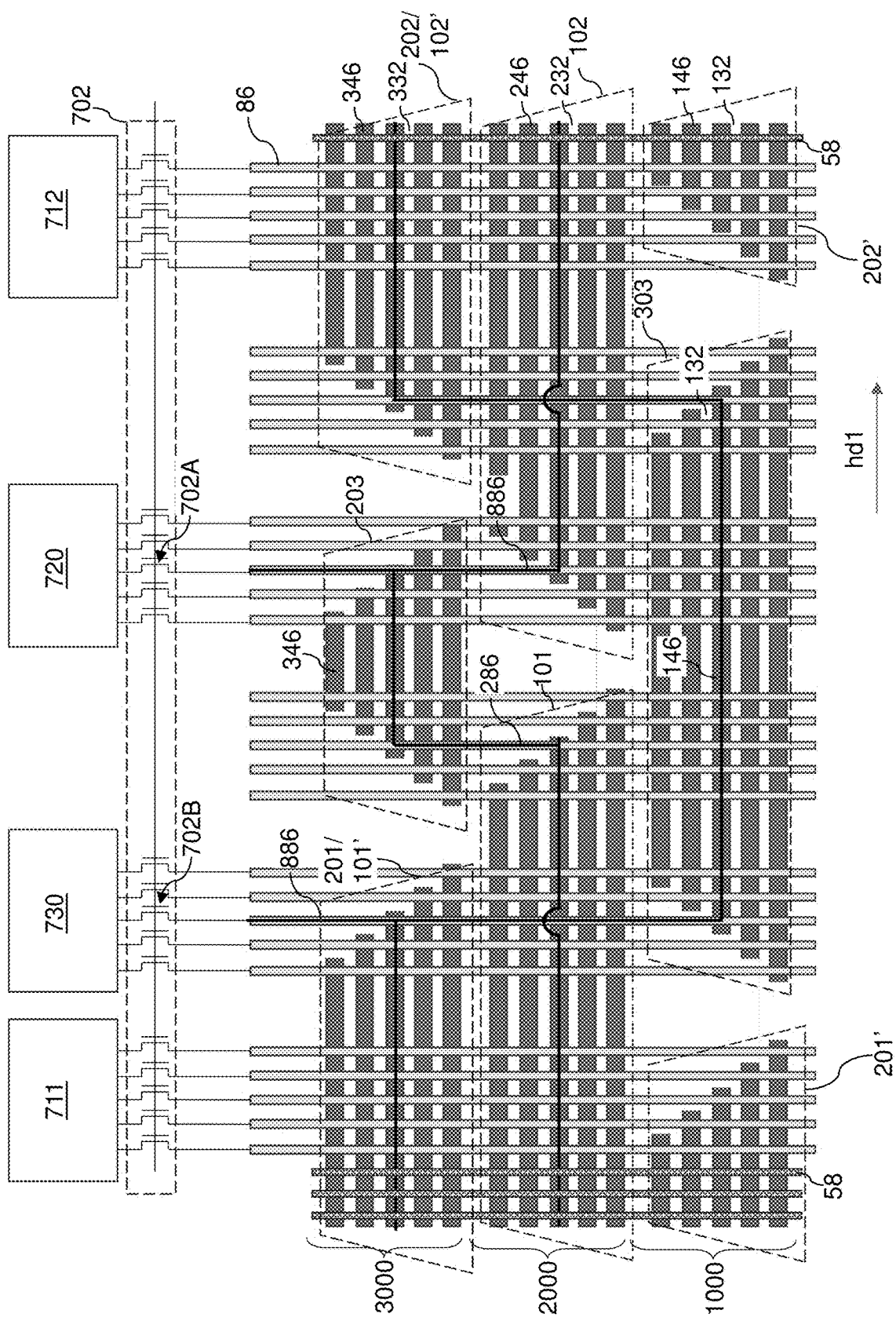
FIG. 43 is a composite view including a schematic vertical cross-sectional view of an alternative embodiment of the second exemplary structure and a circuit schematic for electrically biasing various layers within the alternative embodiment of the second exemplary structure according to an embodiment of the present disclosure.

Referring to FIG. 43, a composite view for an alternative embodiment of the present disclosure is illustrated, in which the passive alternating stack is located below rather than above the active alternating stacks that it electrically connects to each other.

The alternative second exemplary structure of FIG. 43 can be derived from the second exemplary structure illustrated in FIGS. 41 and 42 by forming a lower-tier structure 1000 as a structure having a same pattern as the upper-tier structure 3000 in FIGS. 41 and 42, by forming a middle-tier structure 2000 as a structure having a same pattern as the lower-tier structure 1000 in FIGS. 41 and 42, and by forming an upper-tier structure 3000 as a structure having a same pattern as the middle-tier structure 2000 in FIGS. 41 and 42. In other words, in FIG. 43, the upper tier structure 3000 from FIG. 42 is moved below the lower-tier structure 1000 from FIG. 42.

Word line driver circuits (710, 720, 731, 732) can be subsequently electrically connected to each of the layer contact via structures 86. For each electrically conductive path 886 including a pair of a first layer contact via structure 86 and a second layer contact via structure 86, one of the first layer contact via structure 86 and the second layer contact via structure 86 can be electrically connected to a respective word line driver circuit (720, 730). For example, if a pair of middle-level electrically conductive layers 246 located in different active middle-tier alternating stacks (232, 246) are electrically connected to each other through a first layer contact via structure 86 and a second layer contact via structure 86 and an upper-tier electrically conductive layer 346 located in a passive alternating stack 203, then one of the first layer contact via structure 86 and the second layer contact via structure 86 can be electrically connected to an output node (e.g., word line switching transistor 702B) of a middle-tier word line driver circuit 720. If a pair of upper-level electrically conductive layers 346 located in different active upper-tier alternating stacks (332, 346) is electrically connected to each other through a first layer contact via structure 86 and a second layer contact via structure 86 and a lower-tier electrically conductive layer 146 located in a passive alternating stack 303, then one of the first layer contact via structure 86 and the second layer contact via structure 86 can be electrically connected to an output node (e.g., the word line switching transistor 702A) of an upper-tier word line driver circuit 730. If a pair of lower-level electrically conductive layers 146 located in different memory array regions 100 and located at a same level are not electrically connected to each other, then such lower-level electrically conductive layers 146 may be independently driven by two different lower-tier word line driver circuits (711, 712).

Referring to all drawings and according to various embodiments of the present disclosure, a first layer contact via structure 86 and a second layer contact via structure 86 can be formed such that an electrically conductive path 886 is provided. The electrically conductive path 886 comprises a first first-tier electrically conductive layer (146, 246, or 346) within the first active first-tier alternating stack (101 or 101'), a first second-tier electrically conductive layer (246, 346, or 146) within the passive alternating stack (203 or 303), a second first-tier electrically conductive layer (146, 246, or 346) within the second active first-tier alternating stack (102 or 102'), the first layer contact via structure 86, and the second layer contact via structure 86. The first layer contact via structure 86 contacts the first first-tier electrically conductive layer (146, 246, or 346) and a first portion of the first second-tier electrically conductive layer (246, 346, or 146) within the passive alternating stack (203 or 303). The second layer contact via structure 86 contacts the second first-tier electrically conductive layer (146, 246, or 346) and a second portion of the first second-tier electrically conductive layer (246, 346, or 146) within the passive alternating stack (203 or 303).

According to an aspect of the present disclosure, memory device is provided, which comprises: a first-tier structure comprising a first first-tier alternating stack (101 or 101') and a second first-tier alternating stack (102 or 102'), wherein each of the first first-tier alternating stack (101 or 101') and the second first-tier alternating stack (102 or 102') comprises a respective vertically alternating sequence of first-tier insulating layers (132, 232, or 332) and first-tier electrically conductive layers (146, 246, or 346); a second-tier structure overlying or underlying the first-tier structure and comprising a first second-tier alternating stack (201 or 201') and a second second-tier alternating stack (202 or 202') that are laterally spaced apart from each other by a jumper alternating stack (203 or 303), wherein each of the first second-tier alternating stack (201 or 201'), the second second-tier alternating stack (202 or 202'), and the jumper alternating stack (203 or 303) comprises a respective vertically alternating sequence of second-tier insulating layers (232, 332, or 132) and second-tier electrically conductive layers (246, 346, or 146); first memory stack structures 55 (located in first memory opening fill structures 58) vertically extending through the first first-tier alternating stack (101 or 101') and the first second-tier alternating stack (201 or 201'); second memory stack structures 55 (located in second memory opening fill structures 58) vertically extending through the second first-tier alternating stack (102 or 102') and the second second-tier alternating stack (202 or 202'), wherein each of the first memory stack structures 55 and the second memory stack structures 55 comprises a respective vertical semiconductor channel 60 and a respective set of memory elements (e.g., memory cells such as portions of charge storage layers 54) located at levels of the first-tier electrically conductive layers (146, 246, or 346) and the second-tier electrically conductive layers (246, 346, or 146); and an electrically conductive path 886 comprising a first first-tier electrically conductive layer (146, 246, or 346) within the first first-tier alternating stack (101 or 101'), a first second-tier electrically conductive layer (246, 346, or 146) within the jumper alternating stack (203 or 303), a second first-tier electrically conductive layer (146, 246, or 346) within the second first-tier alternating stack (102 or 102'), a first layer contact via structure 86 contacting the first first-tier electrically conductive layer (146, 246, or 346) and a first portion of the first second-tier electrically conductive layer (246, 346, or 146) within the jumper alternating stack (203 or 303), and a second layer contact via structure 86 contacting the second first-tier electrically conductive layer (146, 246, or 346) and a second portion of the first second-tier electrically conductive layer (246, 346, or 146) within the jumper alternating stack (203 or 303).

In one embodiment, the jumper alternating stack (203, 303) comprises a passive alternating stack that lacks the memory elements which store data. The passive alternating stack lacks the memory stack structures 55; and the first first-tier alternating stack, the second first-tier alternating stack, the first second-tier alternating stack and the second second-tier alternating stack comprise active alternating stacks.

In one embodiment, the first layer contact via structure 86 vertically extends from a horizontal plane including a bottommost surface of a combination of the first first-tier alternating stack (101 or 101') and the first second-tier alternating stack (201 or 201') to a horizontal plane including a topmost surface of the combination of the first first-tier alternating stack (101 or 101') and the first second-tier alternating stack (201 or 201').

In one embodiment, the first layer contact via structure 86 is electrically isolated from each of the first-tier electrically conductive layers (146, 246, or 346) within the first first-tier alternating stack (101 or 101') other than the first first-tier electrically conductive layer (146, 246, or 346).

In one embodiment, the first layer contact via structure 86 is electrically isolated from each of the second-tier electrically conductive layers (246, 346, or 146) within the passive alternating stack (203 or 303) other than the first second-tier electrically conductive layer (246, 346, or 146) within the passive alternating stack (203 or 303).

In one embodiment, the first layer contact via structure 86 comprises: a conductive pillar portion 86C that vertically extends through a subset of layers within the first first-tier alternating stack (101 or 101') and through a subset of layers within the passive alternating stack (203 or 303); a first conductive fin portion 86F laterally protruding from the conductive pillar portion 86C and contacting an annular top surface segment of the first first-tier electrically conductive layer (146, 246, or 346); and a second conductive fin portion 86F laterally protruding from the conductive pillar portion 86C and contacting an annular top surface segment of the first portion of the first second-tier electrically conductive layer (246, 346, or 146) within the passive alternating stack (203 or 303).

In one embodiment, the memory device comprises: first annular insulating plates 40 laterally surrounding the conductive pillar portion 86C and located at levels of, and laterally surrounded by, a subset of the first-tier electrically conductive layers (146, 246, or 346) within the first first-tier alternating stack (101 or 101'); and second annular insulating plates 40 laterally surrounding the conductive pillar portion 86C and located at levels of, and laterally surrounded by, a subset of the second-tier electrically conductive layers (246, 346, or 146) within the passive alternating stack (203 or 303).

In one embodiment, the memory device comprises: a first layer stack of a first insulating liner (152, 252, or 352) and a first dielectric fill material layer (174, 274, 374) overlying the first conductive fin portion 86F and contacting a first cylindrical surface segment of the first conductive fin portion 86F; and a second layer stack of a second insulating liner (252, 352, 152) and second dielectric fill material layer (274, 374, 174) overlying the second conductive fin portion 86F and contacting a second cylindrical surface segment of the second conductive fin portion 86F.

In one embodiment, the first-tier structure and the second-tier structure overlie a substrate 8; the first first-tier alternating stack (101 or 101') comprises first stepped surfaces such that the first-tier electrically conductive layers (146, 246, or 346) within the first first-tier alternating stack (101 or 101') have first variable lateral extents that decrease with a vertical distance from the substrate 8; the passive alternating stack (203 or 303) comprises second stepped surfaces such that second-tier electrically conductive layers (246, 346, or 146) within the passive alternating stack (203 or 303) have second variable lateral extents that decrease with a vertical distance from the substrate 8; and the layer contact via structure 86 vertically extends through the first stepped surfaces and through the second stepped surfaces.

In one embodiment, the first first-tier alternating stack (101 or 101') and the second first-tier alternating stack (102 or 102') are laterally spaced apart from each other along a first horizontal direction hd1 by a first lateral spacing (LS1 or LS1'); the first second-tier alternating stack (201 or 201') and the second second-tier alternating stack (202 or 202') are laterally spaced apart from each other along the first horizontal direction hd1 by a second lateral spacing (LS2 or LS2') that is greater than the first lateral spacing (LS1 or LS1'); and the passive alternating stack (203 or 303) has a lateral extent along the first horizontal direction hd1 that is less than the second lateral spacing (LS2 or LS2').

In one embodiment, the passive alternating stack (203 or 303) comprises a first set of stepped surfaces and a second set of stepped surfaces that are laterally spaced apart from each other; the first set of stepped surfaces has an areal overlap with the first first-tier alternating stack (101 or 101') in a plan view; and the second set of stepped surfaces has an areal overlap with the second first-tier alternating stack (102 or 102') in the plan view.

In one embodiment, the memory comprises a word line driver circuit (710, 720, or 730) configured to apply a word line bias voltage to the first first-tier electrically conductive layer (146, 246, or 346) within the first first-tier alternating stack (101 or 101') and to the second first-tier electrically conductive layer (146, 246, or 346) within the second first-tier alternating stack (102 or 102') through a combination of the first layer contact via structure 86, the second layer contact via structure 86, and the first second-tier electrically conductive layer (246, 346, or 146) within the passive alternating stack (203 or 303).

In one embodiment, the first layer contact via structure 86 is electrically connected to the word line driver circuit (710, 720, or 730) through a first word line switching transistor (702A or 702B); and the second layer contact via structure 86 is electrically connected to the word line driver circuit (710, 720, or 730) through the first word line switching transistor (702A or 702B), the first second-tier electrically conductive layer within the passive alternating stack and the first first-tier electrically conductive layer.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:
   a first-tier structure comprising a first first-tier alternating stack and a second first-tier alternating stack, wherein each of the first first-tier alternating stack and the second first-tier alternating stack comprises a respective vertically alternating sequence of first-tier insulating layers and first-tier electrically conductive layers;
   a second-tier structure overlying or underlying the first-tier structure and comprising a first second-tier alternating stack and a second second-tier alternating stack that are laterally spaced apart from each other by a jumper alternating stack, wherein each of the first second-tier alternating stack, the second second-tier alternating stack, and the jumper alternating stack comprises a respective vertically alternating sequence of second-tier insulating layers and second-tier electrically conductive layers;
   first memory stack structures vertically extending through the first first-tier alternating stack and the first second-tier alternating stack;
   second memory stack structures vertically extending through the second first-tier alternating stack and the second second-tier alternating stack, wherein each of the first memory stack structures and the second memory stack structures comprises a respective vertical semiconductor channel and a respective set of memory elements located at levels of the first-tier electrically conductive layers and the second-tier electrically conductive layers; and
   an electrically conductive path comprising a first first-tier electrically conductive layer within the first first-tier alternating stack, a first second-tier electrically conductive layer within the jumper alternating stack, a second first-tier electrically conductive layer within the second first-tier alternating stack, a first layer contact via structure contacting the first first-tier electrically conductive layer and a first portion of the first second-tier electrically conductive layer within the jumper alternating stack, and a second layer contact via structure contacting the second first-tier electrically conductive layer and a second portion of the first second-tier electrically conductive layer within the jumper alternating stack.

2. The memory device of claim 1, wherein the jumper alternating stack comprises a passive alternating stack that lacks the memory elements which store data.

3. The memory device of claim 2, wherein:
   the passive alternating stack lacks the memory stack structures; and
   the first first-tier alternating stack, the second first-tier alternating stack, the first second-tier alternating stack and the second second-tier alternating stack comprise active alternating stacks.

4. The memory device of claim 2, wherein the first layer contact via structure vertically extends from a horizontal plane including a bottommost surface of a combination of the first first-tier alternating stack and the first second-tier alternating stack to a horizontal plane including a topmost surface of the combination of the first first-tier alternating stack and the first second-tier alternating stack.

5. The memory device of claim 2, wherein the first layer contact via structure is electrically isolated from each of the first-tier electrically conductive layers within the first first-tier alternating stack other than the first first-tier electrically conductive layer.

6. The memory device of claim 2, wherein the first layer contact via structure is electrically isolated from each of the second-tier electrically conductive layers within the passive alternating stack other than the first second-tier electrically conductive layer within the passive alternating stack.

7. The memory device of claim 2, wherein the first layer contact via structure comprises:
   a conductive pillar portion that vertically extends through a subset of layers within the first first-tier alternating stack and through a subset of layers within the passive alternating stack;

a first conductive fin portion laterally protruding from the conductive pillar portion and contacting an annular top surface segment of the first first-tier electrically conductive layer; and a second conductive fin portion laterally protruding from the conductive pillar portion and contacting an annular top surface segment of the first portion of the first second-tier electrically conductive layer within the passive alternating stack.

8. The memory device of claim 7, further comprising:
first annular insulating plates laterally surrounding the conductive pillar portion and located at levels of, and laterally surrounded by, a subset of the first-tier electrically conductive layers within the first first-tier alternating stack; and
second annular insulating plates laterally surrounding the conductive pillar portion and located at levels of, and laterally surrounded by, a subset of the second-tier electrically conductive layers within the passive alternating stack.

9. The memory device of claim 8, further comprising:
a first layer stack of a first insulating liner and a first dielectric fill material layer overlying the first conductive fin portion and contacting a first cylindrical surface segment of the conductive fin portion; and
a second layer stack of a second insulating liner and second dielectric fill material layer overlying the second conductive fin portion and contacting a second cylindrical surface segment of the conductive fin portion.

10. The memory device of claim 2, wherein:
the first-tier structure and the second-tier structure overlie a substrate; and
the first first-tier alternating stack comprises first stepped surfaces such that the first-tier electrically conductive layers within the first first-tier alternating stack have first variable lateral extents that decrease with a vertical distance from the substrate.

11. The memory device of claim 10, wherein:
the passive alternating stack comprises second stepped surfaces such that second-tier electrically conductive layers within the passive alternating stack have second variable lateral extents that decrease with a vertical distance from the substrate; and
the layer contact via structure vertically extends through the first stepped surfaces and through the second stepped surfaces.

12. The memory device of claim 2, wherein:
the first first-tier alternating stack and the second first-tier alternating stack are laterally spaced apart from each other along a first horizontal direction by a first lateral spacing;
the first second-tier alternating stack and the second second-tier alternating stack are laterally spaced apart from each other along the first horizontal direction by a second lateral spacing that is greater than the first lateral spacing;
the passive alternating stack has a lateral extent along the first horizontal direction that is less than the second lateral spacing;
the passive alternating stack comprises a first set of stepped surfaces and a second set of stepped surfaces that are laterally spaced apart from each other;
the first set of stepped surfaces has an areal overlap with the first first-tier alternating stack in a plan view; and the second set of stepped surfaces has an areal overlap with the second first-tier alternating stack in the plan view.

13. The memory device of claim 2, further comprising a word line driver circuit configured to apply a word line bias voltage to the first first-tier electrically conductive layer within the first first-tier alternating stack and to the second first-tier electrically conductive layer within the second first-tier alternating stack through a combination of the first layer contact via structure, the second layer contact via structure, and the first second-tier electrically conductive layer within the passive alternating stack.

14. The memory device of claim 13, wherein:
the first layer contact via structure is electrically connected to the word line driver circuit through a first word line switching transistor; and
the second layer contact via structure is electrically connected to the word line driver circuit through the first word line switching transistor, the first second-tier electrically conductive layer within the passive alternating stack and the first first-tier electrically conductive layer.

15. A method of forming a memory device, comprising:
forming a first-tier structure comprising a first first-tier alternating stack and a second first-tier alternating stack over a substrate, wherein each of the first first-tier alternating stack and the second first-tier alternating stack comprises a respective vertically alternating sequence of first-tier insulating layers and first-tier electrically conductive layers;
forming a second-tier structure comprising a first second-tier alternating stack and a second second-tier alternating stack that are laterally spaced apart from each other by a jumper alternating stack over the substrate, wherein each of the first second-tier alternating stack, the second second-tier alternating stack, and the jumper alternating stack comprises a respective vertically alternating sequence of second-tier insulating layers and second-tier electrically conductive layers, wherein the second-tier structure is formed above, or below, the first-tier structure;
forming first memory stack structures vertically extending through the first first-tier alternating stack and the first second-tier alternating stack;
forming second memory stack structures vertically extending through the second first-tier alternating stack and the second second-tier alternating stack, wherein each of the first memory stack structures and the second memory stack structures comprises a respective vertical semiconductor channel and a respective set of memory elements located at levels of the first-tier electrically conductive layers and the second-tier electrically conductive layers;
forming a first layer contact via structure and a second layer contact via structure, whereby an electrically conductive path is provided which comprises a first first-tier electrically conductive layer within the first first-tier alternating stack, a first second-tier electrically conductive layer within the jumper alternating stack, a second first-tier electrically conductive layer within the second first-tier alternating stack, the first layer contact via structure, and the second layer contact via structure, wherein:
the first layer contact via structure contacts the first first-tier electrically conductive layer and a first portion of the first second-tier electrically conductive layer within the jumper alternating stack; and the second layer contact via structure contacts the second first-tier electrically conductive layer and a second portion of the first second-tier electrically conductive layer within the jumper alternating stack.

16. The method of claim 15, wherein
the jumper alternating stack comprises a passive alternating stack that lacks the memory elements which store data; and
the first layer contact via structure is formed on an annular top surface segment of the first first-tier electrically conductive layer and on an annular top surface segment of the first portion of the first second-tier electrically conductive layer within the passive alternating stack.

17. The method of claim 16, wherein:
the first first-tier alternating stack comprises first stepped surfaces such that lateral extents of the first-tier electrically conductive layers in the first first-tier alternating stack decrease with a vertical distance from the substrate;
the passive alternating stack comprises second stepped surfaces such that lateral extents of the second-tier electrically conductive layers in the passive alternating stack decrease with the vertical distance from the substrate; and
the first layer contact via structure is formed directly on a horizontally-extending surface of the first stepped surfaces and directly on a horizontally-extending surface of the second stepped surfaces.

18. The method of claim 16, further comprising:
forming a sacrificial finned cavity fill material structure through the first-tier structure and the second-tier structure, wherein the sacrificial finned cavity fill material structure is laterally surrounded by first annular insulating plates at levels of a subset of the first-tier electrically conductive layers within the first first-tier alternating stack, and is laterally surrounded by second annular insulating plates at levels of a subset of the second-tier electrically conductive layers within the passive alternating stack; and
replacing the sacrificial finned cavity fill material structure with the first layer contact via structure.

19. The method of claim 16, wherein:
the first first-tier alternating stack and the second first-tier alternating stack are laterally spaced apart from each other along a first horizontal direction by a first lateral spacing;
the first second-tier alternating stack and the second second-tier alternating stack are laterally spaced apart from each other along the first horizontal direction by a second lateral spacing that is greater than the first lateral spacing; and
the passive alternating stack has a lateral extent along the first horizontal direction that is less than the second lateral spacing.

20. The method of claim 16, further comprising electrically connecting a word line driver circuit to one of the first layer contact via structure and the second layer contact via structure, wherein the word line driver circuit is configured to apply a word line bias voltage to the first first-tier electrically conductive layer within the first first-tier alternating stack and to the second first-tier electrically conductive layer within the second first-tier alternating stack through a combination of a first word line switching transistor electrically connected to the first layer contact via structure, the second layer contact via structure, and the first second-tier electrically conductive layer within the passive alternating stack.

* * * * *